(12) United States Patent
Byeon et al.

(10) Patent No.: US 12,707,848 B2
(45) Date of Patent: Aug. 11, 2026

(54) DISPLAY APPARATUS HAVINGA STRUCTURE CAPBLE OF IMPROVING LUMINACE

(71) Applicant: LG Display Co., Ltd., Seoul (KR)

(72) Inventors: Heesu Byeon, Paju-si (KR); SeungRyong Joung, Paju-si (KR); Yoondeok Han, Paju-si (KR); Jeongeun Won, Paju-si (KR)

(73) Assignee: LG Display Co., Ltd., Seoul (KR)

( * ) Notice: Subject to any disclaimer, the term of this patent is extended or adjusted under 35 U.S.C. 154(b) by 724 days.

(21) Appl. No.: 17/560,150

(22) Filed: Dec. 22, 2021

(65) Prior Publication Data

US 2022/0208888 A1 Jun. 30, 2022

(30) Foreign Application Priority Data

Dec. 31, 2020 (KR) ........................ 10-2020-0189880

(51) Int. Cl.

*H10K 59/38* (2023.01)
*H10K 59/35* (2023.01)
*H10K 59/80* (2023.01)
*H10K 59/12* (2023.01)
*H10K 101/20* (2023.01)

(52) U.S. Cl.

CPC ........... *H10K 59/38* (2023.02); *H10K 59/353* (2023.02); *H10K 59/80518* (2023.02); *H10K 59/876* (2023.02); *H10K 59/12* (2023.02); *H10K 2101/20* (2023.02)

(58) Field of Classification Search

CPC .... H10K 59/38; H10K 59/353; H10K 59/876; H10K 59/80518

See application file for complete search history.

(56) References Cited

U.S. PATENT DOCUMENTS

2012/0248971 A1 10/2012 Okuyama
2012/0256208 A1 10/2012 Hatano
(Continued)

FOREIGN PATENT DOCUMENTS

CN 106654031 A 5/2017
CN 108511484 A 9/2018
(Continued)

OTHER PUBLICATIONS

Machine Translation of KR20140086124A (2014).*
(Continued)

*Primary Examiner* — Suberr L Chi
(74) *Attorney, Agent, or Firm* — Seed Intellectual Property Law Group LLP

(57) ABSTRACT

A display apparatus includes: a substrate having a first subpixel, a second subpixel and a third subpixel; a first electrode at each of the first, second and third subpixels; a first emission portion including a first light emitting layer on the first electrode; a second emission portion including a second light emitting layer on the first electrode; a third emission portion including a third light emitting layer on the first electrode; and a second electrode on the third emission portion. The first, second and third light emitting layers emit different color light from each other. A distance between the first electrode and the second electrode is in range from 310 nm to 450 nm.

23 Claims, 17 Drawing Sheets

(56) References Cited

U.S. PATENT DOCUMENTS

| | | | | |
|---|---|---|---|---|
| 2015/0001506 | A1 | 1/2015 | Kim et al. | |
| 2017/0062751 | A1* | 3/2017 | Park | H10K 50/13 |
| 2017/0084855 | A1 | 3/2017 | Kam et al. | |
| 2018/0062116 | A1 | 3/2018 | Park et al. | |
| 2019/0189701 | A1 | 6/2019 | Bang et al. | |
| 2019/0372057 | A1* | 12/2019 | Park | H10K 59/121 |
| 2020/0027932 | A1 | 1/2020 | Choi et al. | |
| 2020/0203649 | A1 | 6/2020 | Kwon et al. | |
| 2021/0066403 | A1* | 3/2021 | Wang | H10K 50/852 |

FOREIGN PATENT DOCUMENTS

| | | | | | |
|---|---|---|---|---|---|
| CN | 110021637 | A | | 7/2019 | |
| JP | 2012227118 | A | | 11/2012 | |
| JP | 2012227133 | A | | 11/2012 | |
| JP | 2016170935 | A | | 9/2016 | |
| JP | 2018125168 | A | | 8/2018 | |
| KR | 10-2014-0082551 | | * | 7/2014 | H01L 51/50 |
| KR | 20140086124 | A | * | 7/2014 | |
| KR | 10-2015-0002249 | A | | 1/2015 | |
| KR | 10-2017-0034067 | A | | 3/2017 | |
| KR | 10-2020-0076969 | A | | 6/2020 | |

OTHER PUBLICATIONS

Improved machine translation (AI-assisted) of Young et al. (KR 10-2014-0086124).*

Improved machine translation (AI-assisted) of Park et al. (KR 10-2014-0082551).*

* cited by examiner

DISPLAY APPARATUS HAVINGA STRUCTURE CAPBLE OF IMPROVING LUMINACE

CROSS-REFERENCE TO RELATED APPLICATIONS

This application claims the benefit of the Korean Patent Application No. 10-2020-0189880 filed on Dec. 31, 2020, which is hereby incorporated by reference as if fully set forth herein.

BACKGROUND

Technical Field

The present disclosure relates to a display apparatus.

Description of the Related Art

A display apparatus is applied to a wide variety of application products such as a television set, a monitor, a smart phone, a tablet PC (Personal Computer), a notebook computer and a wearable apparatus. Furthermore, a display apparatus is mainly accommodated in an instrument mounted on the head of the viewer, and is configured to be held tightly to the viewer. Therefore, the area where the display apparatus is disposed is limited to a predetermined physical space. For this reason, both integration and high luminance are required to realize a clearer display apparatus with higher resolution.

BRIEF SUMMARY

Accordingly, the inventors of the present disclosure recognized the above-mentioned problems and conducted various experiments to implement a display apparatus capable of improving luminance. Through various experiments, a display apparatus having a new structure capable of realizing high luminance can be provided.

An aspect of the present disclosure according to an embodiment of the present disclosure is to provide a display apparatus having high luminance.

Additional features and aspects will be set forth in part in the description that follows, and in part will become apparent from the description, or may be learned by practice of the embodiments provided herein. Other features and aspects of the embodiments may be realized and attained by the structure particularly pointed out in the written description, or derivable therefrom, and the claims hereof as well as the appended drawings.

A display apparatus according to an embodiment of the present disclosure comprises a substrate including a first subpixel, a second subpixel and a third subpixel; a first electrode at each of the first, second and third subpixels; a first emission portion including a first light emitting layer on the first electrode; a second emission portion including a second light emitting layer on the first electrode; a third emission portion including a third light emitting layer on the first electrode; and a second electrode on the third emission portion. The first, second and third light emitting layers emit different color light from each other. A distance between the first electrode and the second electrode is in range from 310 nm to 450 nm.

A display apparatus according to an embodiment of the present disclosure comprises: a substrate including a first subpixel, a second subpixel and a third subpixel; a reflective electrode disposed at each of the first, second and third subpixel; a first electrode on the reflective electrode; a first emission portion on the first electrode and including any one of a red light emitting layer, a green light emitting layer and a blue light emitting layer; a second emission portion on the first emission portion and including different light emitting layer from the first emission portion; a third emission portion on the second emission portion and including different light emitting layer from the first and second emission portions; and a second electrode on the third emission portion. The blue light emitting layer in any one of the first, second and third emission portions is closer to the first electrode than the red light emitting layer in any one of the first, second and third emission portions. The distance between the first electrode and the second electrode is in range from 310 nm to 450 nm.

A display apparatus according to an embodiment of the present disclosure comprises: a substrate including a first subpixel, a second subpixel and a third subpixel; a reflective electrode disposed at each of the first, second and third subpixels; a first electrode on the reflective electrode; a first emission portion on the first electrode and including any one of a red light emitting layer, a green light emitting layer and a blue light emitting layer; a second emission portion on the first emission portion and including different light emitting layer from the first emission portion; a third emission portion on the second emission portion and including different light emitting layer from the first and second emission portions; and a second electrode on the third emission portion. The red light emitting layer in any one of the first, second and third emission portions is closer to the first electrode than the blue light emitting layer in any one of the first, second and third emission portions. A distance between the first electrode and the second electrode is in range from 310 nm to 450 nm.

A display apparatus according to an embodiment of the present disclosure comprises: a substrate including a first subpixel, a second subpixel and a third subpixel; a first electrode disposed at each of the first, second and third subpixels; a first emission portion, a second emission portion and a third emission portion stacked on the first electrode in sequence; and a second electrode on the third emission portions. Each of the first, second and third emission portions includes any one of a red light emitting layer, a green light emitting layer and a blue light emitting layer. The blue light emitting layer is disposed between the red light emitting layer and the green light emitting layer. A distance between the first electrode and the second electrode is in range from 310 nm to 385 nm.

A display apparatus according to an embodiment of the present disclosure comprises: a substrate including a first subpixel, a second subpixel and a third subpixel; a reflective electrode disposed at each of the first, second and third subpixel; a first electrode on the reflective electrode; a first emission portion on the first electrode and including any one of a red light emitting layer, a green light emitting layer and a blue light emitting layer; a second emission portion on the first emission portion and including different light emitting layer from the first emission portion; a third emission portion on the second emission portion and including different light emitting layer from the first and second emission portions; and a second electrode on the third emission portion. The blue light emitting layer in any one of the first, second and third emission portions is closer to the first electrode than the red light emitting layer in any one of the first, second and third emission portions. The distance between the first electrode and the second electrode is adjusted in range based on a light emission portion from the second electrode.

A display apparatus according to an embodiment of the present disclosure comprises: a substrate including a first subpixel, a second subpixel and a third subpixel; a reflective electrode disposed at each of the first, second and third subpixels; a first electrode on the reflective electrode; a first emission portion on the first electrode and including any one of a red light emitting layer, a green light emitting layer and a blue light emitting layer; a second emission portion on the first emission portion and including different light emitting layer from the first emission portion; a third emission portion on the second emission portion and including different light emitting layer from the first and second emission portions; and a second electrode on the third emission portion. The red light emitting layer in any one of the first, second, and third emission portions is closer to the first electrode than the blue light emitting layer in any one of the first, second and third emission portions. A distance between the first electrode and the second electrode is adjusted in range covering four or fewer blue light emission portions of the blue light emitting layer.

A display apparatus according to an embodiment of the present disclosure comprises: a substrate including a first subpixel, a second subpixel, and a third subpixel; a first electrode disposed at each of the first, second, and third subpixels; a first emission portion, a second emission portion, and a third emission portion stacked on the first electrode in sequence; and a second electrode on the third emission portions. Each of the first, second and third emission portions includes any one of a red light emitting layer, a green light emitting layer, and a blue light emitting layer. The blue light emitting layer is disposed between the red light emitting layer and the green light emitting layer. A distance between the first electrode and the second electrode is adjusted in range covering three or fewer blue light emitting nodes of the blue light emitting layer.

A display apparatus according to an embodiment of the present disclosure comprises: a substrate including a subpixel; a reflective electrode disposed over the subpixel; a first electrode on the reflective electrode; a second electrode separated vertically from the first electrode by a first distance, and separated vertically from the reflective electrode by a second distance greater than the first distance; a first emission portion on the first electrode; a second emission portion between the first emission portion and the second electrode; and a third emission portion between the second emission portion and the second electrode. Each of the first, second, and third emission portions is configured to emit light of different color from others of the first, second, and third emission portions. The reflective electrode and the second electrode implement a microcavity.

Since the display apparatus according to embodiments of the present disclosure may include three light emission portions, embodiments of the present disclosure may provide a display apparatus including a display panel or a light emitting device having improved luminance and efficiency.

According to an embodiment of the present disclosure, the positions of the light emitting layers may be configured according to the distance between the first electrode and the second electrode or the thickness of the layers between the first electrode and the second electrode. Therefore, it is possible to provide a display apparatus including a display panel or a light emitting device having improved luminance and efficiency.

Other systems, methods, features and advantages will be, or will become, apparent to one with skill in the art upon examination of the following figures and detailed description. It is intended that all such additional systems, methods, features and advantages be included within this description, be within the scope of the present disclosure, and be protected by the following claims. Nothing in this section should be taken as a limitation on those claims. Further aspects and advantages are discussed below in conjunction with embodiments of the disclosure.

It is to be understood that both the foregoing general description and the following detailed description of the present disclosure are examples and explanatory and are intended to provide further explanation of the embodiments as claimed.

BRIEF DESCRIPTION OF THE SEVERAL VIEWS OF THE DRAWINGS

The accompanying drawings, which are included to provide a further understanding of the disclosure and are incorporated in and constitute a part of this application, illustrate embodiments of the disclosure and together with the description serve to explain the principle of the disclosure.

FIG. 5 illustrates a display panel according to an embodiment of the present disclosure.

FIG. 6 illustrates a display panel according to another embodiment of the present disclosure.

FIG. 7 illustrates a display panel according to another embodiment of the present disclosure.

FIG. 8 illustrates a display panel according to another embodiment of the present disclosure.

FIG. 9 illustrates a display panel according to another embodiment of the present disclosure.

FIG. 10 illustrates a display panel according to another embodiment of the present disclosure.

FIG. 11 illustrates a display panel according to another embodiment of the present disclosure.

Figure 1:
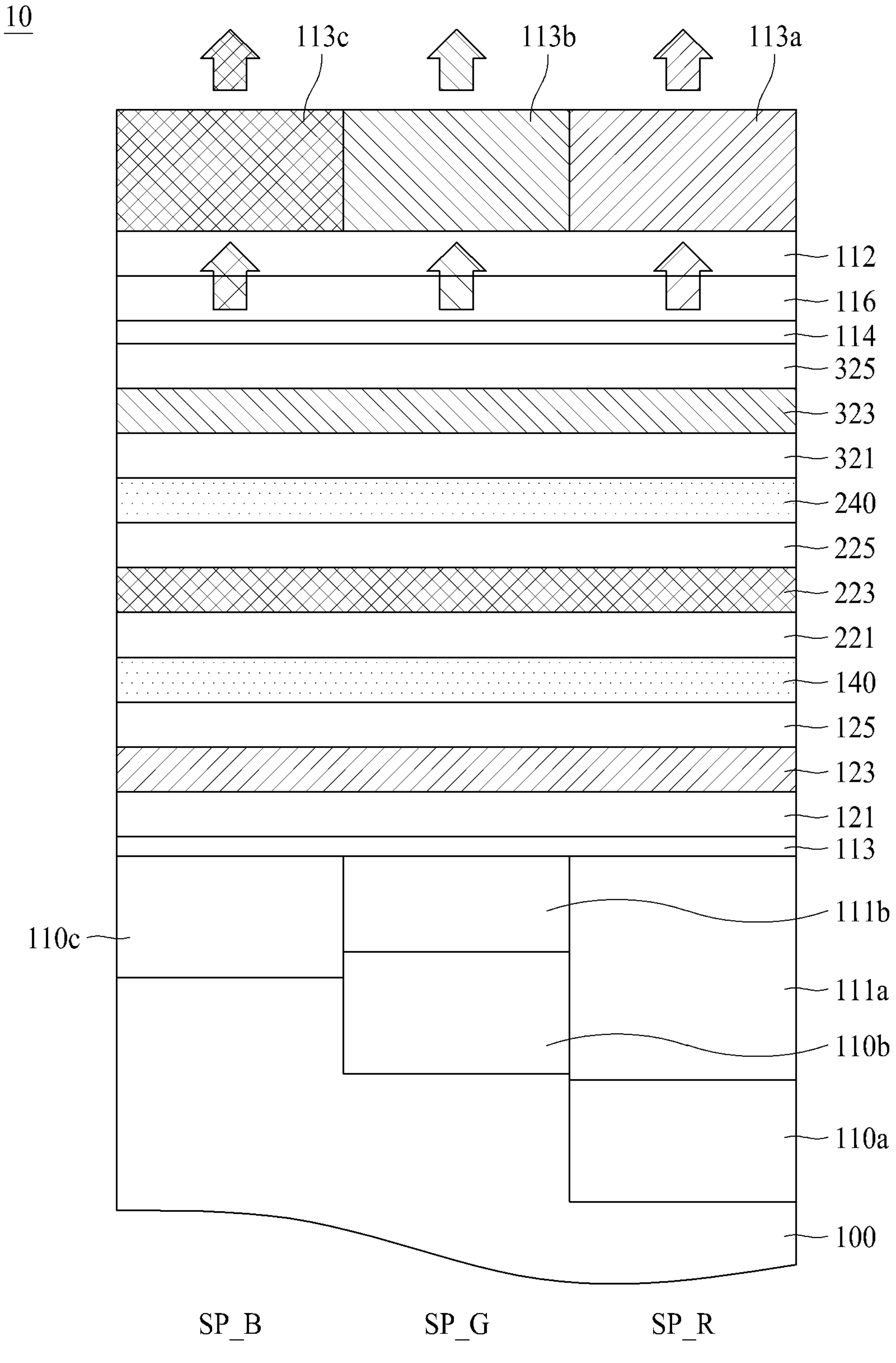
FIG. 1 illustrates a display apparatus according to an embodiment of the present disclosure.

Throughout the drawings and the detailed description, unless otherwise described, the same drawing reference numerals should be understood to refer to the same elements, features, and structures. The relative size and depiction of these elements may be exaggerated for clarity, illustration, and convenience.

DETAILED DESCRIPTION

Advantages and features of the present disclosure, and implementation methods thereof will be clarified through the following embodiments described with reference to the accompanying drawings. The present disclosure may, however, be embodied in different forms and should not be construed as limited to the embodiments set forth herein. Rather, these embodiments are provided so that this disclosure will be thorough and complete, and will fully convey the scope of the present disclosure to those skilled in the art.

A shape, a size, a ratio, an angle, and a number disclosed in the drawings for describing embodiments of the present disclosure are merely an example, and thus, the present disclosure is not limited to the illustrated details. Like reference numerals refer to like elements throughout the present disclosure. In the following description, when the detailed description of the relevant known function or configuration is determined to unnecessarily obscure the technical features of the present disclosure, the detailed description will be omitted.

In the case that "comprise," "have," and "include" described in the present specification are used, another part may also be present unless "only" is used. The terms in a singular form may include plural forms unless noted to the contrary.

In construing an element, the element is construed as including an error range although there is no explicit description.

In describing a positional relationship, for example, when the positional order is described as "on," "above," "below," and "next," the case of no contact there-between may be included, unless "just" or "direct(ly)" is used. If it is mentioned that a first element is positioned "on" a second element, it does not mean that the first element is essentially positioned above the second element in the figure. The upper part and the lower part of an object concerned may be changed depending on the orientation of the object. Consequently, the case in which a first element is positioned "on" a second element includes the case in which the first element is positioned "below" the second element as well as the case in which the first element is positioned "above" the second element in the figure or in an actual configuration.

In describing a temporal relationship, for example, when the temporal order is described as "after," "subsequent," "next," and "before," a case which is not continuous may be included, unless "just" or "direct(ly)" is used.

It will be understood that, although the terms "first," "second," etc., may be used herein to describe various elements, these elements should not be limited by these terms. These terms are only used to distinguish one element from another. For example, a first element could be termed a second element, and, similarly, a second element could be termed a first element, without departing from the scope of the present disclosure.

In describing the elements of the present disclosure, terms such as the first, the second, A, B, (a) and (b) may be used. These terms are only to distinguish the elements from other elements, and the terms are not limited in nature, order, sequence or number of the elements. When an element is described as being "adhered," "coupled" or "connected" to another element that element may be directly connected to or connected to that other element, but indirectly unless otherwise specified. It is to be understood that other elements may be "interposed" between each element that may be connected to or coupled to.

It should be understood that the term "at least one" includes all combinations related with any one item. For example, "at least one among a first element, a second element and a third element" may include all combinations of two or more elements among the first, second and third elements as well as each element of the first, second and third elements.

Features of various embodiments of the present disclosure may be partially or overall coupled to or combined with each other, and may be variously inter-operated with each other and driven technically as those skilled in the art can sufficiently understand. The embodiments of the present disclosure may be carried out independently from each other, or may be carried out together in a co-dependent relationship.

Hereinafter, an example of a display apparatus according to an embodiment of the present disclosure will be described in detail with reference to the accompanying drawings. In designating reference numerals to elements of each drawing, the same components may have the same reference numerals as much as possible even though they are shown in different drawings. Scale of the elements shown in the accompanying drawings have a different scale from the actual for convenience of description, it is not limited to the scale shown in the drawings.

FIG. 1 illustrates a display apparatus according an embodiment of the present disclosure.

According to an embodiment of present disclosure, a display apparatus may comprise a first emission portion, a second emission portion, and a third emission portion. An experiment example display apparatus according to an embodiment of the present disclosure may comprise a first emission portion and a second emission portion. According to an experiment example, a display apparatus may include one light emitting layer in the first emission portion, and two light emitting layers in the second emission portion to implement white color light. When two light emitting layers are configured in the second emission portion, excitons are shared by adjacent two light emitting layers, so that the efficiency of the light emitting layers is different from each other. Further, it is difficult to increase the luminance due to the trade-off relationship between the efficiencies of the two light emitting layers. Accordingly, the inventors of the present disclosure conducted various experiments to improve the luminance. From these various experiments, a display apparatus with a new structure, in which two light emitting layers are separated and the luminance may be improved according to emission positions of the light emitting layers, was invented. This will be described below.

With reference to FIG. 1, a display apparatus 10 according to an embodiment of the present disclosure may comprise a substrate 100, a first electrode 113, light emitting layers 123, 223, and 323, and a second electrode 114.

The substrate 100 according to an embodiment of the present disclosure may include a first subpixel SP_R, a second subpixel SP_G, and a third subpixel SP_B. For example, the substrate 100 may include one of glass substrate, a plastic substrate, and a silicon wafer substrate. The substrate 100 according to an embodiment of the present disclosure may be a silicon wafer substrate. For the case of silicon wafer substrate, compared with a glass substrate, a micro-cavity may be implemented by the second electrode including silver-magnesium, and it may have the advantage of realizing an ultra-high resolution. For example, by configuring the silicon wafer substrate and forming a second electrode including silver-magnesium, a strong cavity may be implemented. For example, compared with a display apparatus including three emission portions and using a glass substrate (i.e., a TV display apparatus), the display apparatus according to an embodiment of the present disclosure may realize ultra-high resolution and a strong microcavity.

For example, when the substrate 100 is disposed in a head mounted display apparatus, the substrate 100 may be formed of a flexible material having a bendability according to a curvature of the receiving portion of the head mounted display apparatus. For another embodiment of the present disclosure, when the substrate 100 directly corresponds to both eyes and is applied to a head mounted display apparatus corresponding to a case in which a user views an augmented reality image, the substrate 100 may be transparent. For example, the substrate 100 may be a transparent glass substrate or a transparent plastic substrate, but embodiments of the present disclosure are not limited thereto. For another embodiment of the present disclosure, when the substrate 100 directly corresponds to both eyes and is applied to a head mounted display apparatus in which a user views a virtual reality image, the substrate 100 may not be transparent such as a silicon wafer substrate. In addition, when the substrate 100 does not directly correspond to both eyes and is accommodated in the head mounted display apparatus to correspond to the outside of both eyes, the substrate 100 may not be transparent.

A thin film transistor may be disposed on the substrate 100. The thin film transistor may include a semiconductor layer, a gate electrode partially overlapped with the semiconductor layer with a gate insulating layer interposed therebetween, and a source electrode and a drain electrode connected to both sides of the semiconductor layer. The thin film transistor may have a top gate structure in which the gate electrode is disposed over the semiconductor layer, but embodiments of the present disclosure are not limited thereto. The thin film transistor may have a bottom gate structure in which the gate electrode is disposed under the semiconductor layer.

The semiconductor layer may include one of a polysilicon layer, an amorphous silicon layer, an oxide semiconductor layer, or combinations thereof. For another example, the semiconductor layer may be configured to include crystallines only in a region except for the channel.

A gate electrode may be formed on the gate insulating layer, an intermediate insulating layer may cover the gate electrode on the gate insulating layer, and the source electrode and drain electrode may be disposed on the intermediate insulating layer. On the intermediate insulating layer, an inorganic passivation layer and/or an organic passivation layer may be disposed as covering the source electrode and the drain electrode.

The source electrode and the drain electrode may be contacted to the semiconductor layer via contact holes in the intermediate insulating layer and the gate insulating layer.

On each of the first subpixel SP_R, the second subpixel SP_G, and the third subpixel SP_B, a reflective electrode may be disposed. For example, a 1-1 reflective electrode 110*a* may be disposed on the first subpixel SP_R. A 1-2 reflective electrode 110*b* may be disposed on the second subpixel SP_G. A 1-3 reflective electrode 110*c* may be disposed on the third subpixel SP_B. For example, 1-1 to 1-3 reflective electrodes 110*a*, 110*b* and 110*c* may include at least one or more of aluminum (Al), aluminum alloy, silver (Ag), silver alloy, APC alloy (alloy of silver (Ag), platinum (Pt), and copper (Cu)), and alloy thereof.

A first layer may be further disposed on the first subpixel SP_R and the second subpixel SP_G. For example, the first layer may be configured to be contact with the 1-1 reflective electrode 110*a* and 1-2 reflective electrode 110*b* to adjust the distance between the upper surface of 1-1 reflective electrode 110*a* and the second electrode 114 and the distance between the upper surface of 1-2 reflective layer 110*b* and the second electrode 114. For example, a 1-1 layer 111*a* may be disposed between the first electrode 113 and the 1-1 reflective layer 110*a*. For example, a 1-2 layer 111*b* may be disposed between the first electrode 113 and the 1-2 reflective electrode 110*b*.

The 1-1 layer 111*a* may be disposed on the 1-1 reflective electrode 110*a*. The 1-2 layer 111*b* may be disposed on the 1-2 reflective layer 110*b*. The 1-1 layer 111*a* and the 1-2 layer 111*b* may be formed at the first subpixel SP_R and the second subpixel SP_G by patterning a same material layer with masks having different transparent regions and different semi-transparent regions. For example, the 1-1 layer 111*a* and the 1-2 layer 111*b* includes silicon nitride (SiNx) or silicon oxide (SiOx), and embodiments of the present disclosure are not limited thereto.

The 1-1 layer 111*a* and the 1-2 layer 111*b* may be formed of silicon nitride (SiNx) or silicon oxide (SiOx). For example, the 1-1 layer 111*a* and the 1-2 layer 111*b* may be configured to allow the amount of light emitted from the first electrode 113 to the 1-1 to 1-3 reflective electrodes 110*a*, 110*b* and 110*c* to be used for resonance (or microcavity) without loss. The 1-1 layer 111*a* and the 1-2 layer 111*b* may be a cavity control layer or a microcavity layer, but embodiments of the present disclosure are not limited thereto. For another example, the 1-1 layer 111*a* and the 1-2 layer 111*b* may be formed of a metal having a transparent property. With the stacking structure of the 1-1 to 1-3 reflective layers 110*a*, 110*b*, and 110*c*, and the 1-1 layer 111*a* and the 1-2 layer 111*b*, and with a surface contacting structure of them, the surface resistance of the first electrode 113 may be lowered.

According to an embodiment of the present disclosure, a common layer may be formed as covering all subpixels without distinction between subpixels. According to the emission element array of the present disclosure, the entire substrate 100 may be disposed close to both eyes of the user, and the distance between the substrate 100 and both eyes of the user is fixed or maintained by enclosure storage device in which the display apparatus is mounted. Therefore, considering the movement of the eyes and image sensing in the eyes, the display apparatus may have a small size, e.g., about less than 3 inches. To implement images corresponding to virtual reality and augmented reality in the display apparatus, a high-resolution subpixel arrangement such as 1,000 pixels (including three or more subpixels in one pixel) or more within a miniaturized area or size may be beneficial. In this case, the width of each subpixel may be less than 10 μm, but embodiments of the present disclosure are not limited thereto.

In a display apparatus including a display panel or an emission element of high resolution and high density (or high integration), to implement the common layer or emission layer (or light emitting layer) differently for each subpixel, a different deposition mask may be beneficial for each color of the common layer or the emission layer. For example, the display panel may include a first electrode, a second electrode and layers between first electrode and second electrode, or the display panel may be an emission element, but embodiments of the present disclosure are not limited thereto. In the present disclosure, a display panel and an emission element may be used interchangeably. For example, the display apparatus may include a display panel or the display apparatus may include an emission element. The deposition process of the organic material, which is a common layer, using the deposition mask may be performed by locating the deposition mask in a non-contact manner from the substrate, and then depositing the vaporized organic material. However, it is difficult to implement a deposition mask having the micro-width openings. Even though openings having small width are used, the openings and the deposition area do not completely correspond to each other due to an interferences at an edge or periphery of the opening, and there is a problem in that the deposition area may have larger area than the opening or that the deposition thickness is different at the edge or periphery of the opening. Accordingly, when misalignment occurs between the deposition mask and the substrate, an organic material having a wrong position or a thickness difference within the same light emission portion is deposited, which may cause a degradation of the production yield ratio.

Accordingly, According to an embodiment of the present disclosure, the mountable display apparatus having miniaturization and high density (or high integration) may be configured by stacking a plurality of emission portions each having light emitting layers in the same manner for all subpixels not dividing the light emitting layers for each subpixel SP_R, SP_G, and SP_B. Since the 1-1 layer 111*a* and the 1-2 layer 111*b* are configured for each subpixel SP_R, SP_G, and SP_B, it is possible to implement a microcavity in which the resonance of light may be generated for each corresponding subpixel SP_R, SP_G, and SP_B.

A first electrode 113 may be disposed on each of the first to third subpixels SP_R, SP_G, and SP_B. For example, the first electrode 113 may be disposed on the 1-1 layer 111*a* of the first subpixel SP_R. For example, the first electrode 113 may be disposed on the 1-2 layer 111*b* of the second subpixel SP_G. For example, the first electrode 113 may be disposed on the 1-3 reflective electrode 110*c* of the third subpixel SP_B. For example, the first electrode 113 may be formed of an oxide including at least one or more of indium (In), zinc (Zn), and tin (Sn), or a nitride including at least one or more of titanium (Ti), zinc (Zn), and indium (In). For example, the first electrode 113 may be formed of indium tin oxide (ITO), indium zinc oxide (IZO), indium tin zinc oxide (ITZO), zinc oxide (ZnO), and tin oxide (SnO), but embodiments of the present disclosure are not limited thereto. For example, even though the first electrode 113 is illustrated as being connected to each other in the first to third subpixels SP_R, SP_G, and SP_B, the first electrode 113 may be formed separately for each of the first to third subpixels SP_R, SP_G and SP_B. For example, the first electrode 113 may be an anode electrode, and the term is not limited thereto.

A first common layer 121, a first light emitting layer 123 and a second common layer 125 may be disposed on the first electrode 113. The first common layer 121 may transfer holes to the first light emitting layer 123. For example, the first common layer 121 may be a hole transfer layer. For example, the first common layer 121 may include a hole injection layer, a hole transport layer and an electron blocking layer, but embodiments of the present disclosure are not limited thereto. The second common layer 125 may transfer electrons to the first light emitting layer 123. For example, the second common layer 125 may be an electron transfer layer. For example, the second common layer 125 may include an electron injection layer, an electron transport layer, and a hole blocking layer, but embodiments of the present disclosure are not limited thereto. The first common layer 121, the first light emitting layer 123 and the second common layer 125 may be one emission portion. For example, the first common layer 121, the first light emitting layer 123, and the second common layer 125 may be an example of a first emission portion.

A third common layer 221, a second light emitting layer 223, and a fourth common layer 225 may be disposed on the second common layer 125. For example, a third common layer 221, a second light emitting layer 223, and a fourth common layer 225 may be disposed on the first emission portion. The third common layer 221 may transfer holes to the second light emitting layer 223. For example, the third common layer 221 may include a hole injection layer, a hole transport layer, and an electron blocking layer, but embodiments of the present disclosure are not limited thereto. The fourth common layer 225 may transfer electrons to the second light emitting layer 223. For example, the fourth common layer 225 may include an electron injection layer, an electron transport layer, and a hole blocking layer, but embodiments of the present disclosure are not limited thereto. For example, the third common layer 221, the second light emitting layer 223, and the fourth common layer 225 may be an example of a second emission portion.

The first common layer 121 and the third common layer 221 may be the hole injection layers and/or the hole transport layers, and may transport holes to adjacent first and second light emitting layers 123 and 223. The second common layer 125 and the fourth common layer 225 may be electron transport layers and/or electron injection layers, and my transfer electrons to adjacent first and second light emitting layers 123 and 223.

A first charge generation layer 140 may be disposed between the second common layer 125 and the third common layer 221. For example, the first charge generation layer 140 may be disposed between the first emission portion and the second emission portion. The first charge generation layer 140 may include an n-type charge generation layer and a p-type charge generation layer. For example, the first charge generation layer 140 may include an n-type charge generation layer and a p-type charge generation layer on the n-type charge generation layer. The n-type charge generation layer may be in contact with, or near, the second common layer 125, and the p-type charge generation layer may be between the n-type charge generation layer and the third common layer 221.

For example, the third common layer 221 transfers the holes of the first charge generation layer 140 to the second light emitting layer 223, and the fourth common layer 225 may actively inject electrons from a second charge generation layer 240 for transporting the injected electrons to the second light emitting layer 223.

A fifth common layer 321, a third light emitting layer 323, and a sixth common layer 325 may be disposed on the fourth common layer 225. For example, a fifth common layer 321, a third light emitting layer 323, and a fifth common layer 325 may be disposed on the second emission portion. The fifth common layer 321 may transfer holes to the third light emitting layer 323. For example, the fifth common layer 321 may include a hole injection layer, a hole transport layer, and an electron blocking layer, but embodiments of the present disclosure are not limited thereto. The sixth common layer 325 may transfer electrons to the third light emitting layer 323. For example, the sixth common layer 325 may include an electron injection layer, and electron transport layer, and a hole blocking layer, but embodiments of the present disclosure are not limited thereto. For example, the fifth common layer 321, the third light emitting layer 323, and the sixth common layer 325 may be an example of a third emission portion.

The third common layer 221 and the fifth common layer 321 may be hole injection layers and/or hole transport layers, and may transport holes to adjacent second light emitting layer 223 and the third light emitting layer 323. The fourth common layer 225 and the sixth common layer 325 may be electron transport layers and/or electron injection layers, and may transfer electrons to adjacent second and third light emitting layers 223 and 323.

A second charge generation layer 240 may be disposed between the fourth common layer 225 and the fifth common layer 321. For example, the second charge generation layer 240 may be disposed between the second emission portion and the third emission portion. The second charge generation layer 240 may include an n-type charge generation layer and a p-type charge generation layer. For example, the second charge generation layer 240 may include an n-type charge generation layer and a p-type charge generation layer on the n-type charge generation layer. The n-type charge generation layer may be in contact with, or near, the fourth common layer 225, and the p-type charge generation layer may be between the n-type charge generation layer and the fifth common layer 321.

For example, the fifth common layer 321 may transfer the holes of the second charge generation layer 240 to the third light emitting layer 323, and the sixth common layer 325 may actively inject electrons from the second electrode 114 configured to transport the injected electrons to the third light emitting layer 323.

According to an embodiment of the present disclosure, the first to sixth common layers 121, 125, 221, 225, 321, and 325 may be configured with a plurality of different layers. In the display apparatus 10 according to an embodiment of the present disclosure, the first to sixth common layers 121, 125, 221, 225, 321, and 325 having hole or electron transport function, the first to third light emitting layers 123, 223, and 323, and the charge generation layers 140 and 240 may not be divided across the first to third subpixels SP_R, SP_G, and SP_B. Instead, each of layers in the first to third emission portions may be integrally formed, such that a plurality of layers covers the plurality of subpixels.

According to an embodiment of the present disclosure, the common layers and the light emitting layers may be formed in a common tandem method at the first to third subpixels SP_R, SP_G, and SP_B. Therefore, each of the common layers and the light emitting layers may be formed by using an open mask having the same or similar openings on the substrate without being divided into subpixels and without a fine metal mask (FMM).

A second electrode 114 may be disposed on the sixth common layer 325. As lights emitted from the respective light emitting layers 123, 223, and 323 of each of the subpixels SP_R, SP_G, and SP_B are repeatedly reflected and re-reflected between the 1-1 to 1-3 reflective electrodes 110*a*, 110*b* and 110*c* and the second electrode 114, the resonance may be generated. Thus, microcavity characteristics of the lights emitted to the second electrode 114 may be improved. For example, the second electrode 114 may be a cathode electrode, but the term is not limited thereto. For example, in comparison with the display apparatus including three emission portions and using a glass substrate (e.g., a TV display apparatus), the display apparatus according to an embodiment of the present disclosure may implement a strong micro-cavity due to the resonance between the first reflective electrodes 110*a*, 110*b*, and 110*c* and the second electrode 114, so that it may implement ultra-high resolution. This is because even though the size of subpixel is reduced, the luminous efficiency of the subpixel may not decrease due to the strong micro-cavity.

For example, the second electrode 114 may be formed of a metal having a reflectivity to improve or maximize the resonance effect due to reflection and re-reflection of light. For example, the second electrode 114 may be formed of a metal having reflectivity, so that light emitted from each of the light emitting layers 123, 223, and 323 may be reflected between the 1-1 to 1-3 reflective electrodes 110*a*, 110*b*, and 110*c* and the second electrode 114, and the second electrode 114 may be formed of a metal having transmittance, further so as to emit lights through the second electrode 114. For example, the second electrode 114 may be formed of magnesium (Mg), a magnesium alloy, silver (Ag), a silver alloy or the like, but embodiments of the present disclosure are not limited thereto. The second electrode 114 may be formed of AgMg which is an alloy of silver and magnesium. Any metal or metal compound having similar or the same reflectivity and transmittance characteristics as an alloy of silver (Ag) and magnesium (Mg) may be applied to the second electrode 114.

The 1-1 to 1-3 reflective electrodes 110*a*, 110*b*, and 110*c* may be formed of a metal having a reflective characteristic to be configured as a mirror. The second electrode 114 may be configured as a reflective and transmissive electrode so as to be a half mirror. Only lights of specific or selected wavelength adjusted by the resonance distance from the lower portion of the second electrode 114 are amplified and transmitted. The remaining lights are repeatedly reflected between the second electrode 114 and the 1-1 to 1-3 reflective electrodes 110*a*, 110*b* and 110*c*. For example, when the second electrode 114 is formed of AgMg or an alloy including the same, the second electrode 114 may improve the reflective properties between the 1-1 to 1-3 reflective electrodes 110*a*, 110*b*, and 110*c* and the second electrode 114, and may further enhance the micro-cavity characteristic according to the resonance distance of each of the subpixels SP_R, SP_G, and SP_B. In each of the subpixels SP_R, SP_G, and SP_B, reflection is occurred from the upper surface of the 1-1 to 1-3 reflective electrodes 110*a*, 110*b*, and 110*c*. The subpixels SP_R, SP_G, and SP_B have different resonance distance by the configuration of the 1-1 layer 111*a* and the 1-2 layer 111*b*, when resonance occurs between the 1-1 to 1-3 reflective electrodes 110*a*, 110*b*, and 110*c* and the second electrode 114, and then lights may be emitted through the second electrode 114. For example, the first electrode 113 may have a light transmittance of 80% or more to transmit the lights from the 1-1 to 1-3 reflective electrodes 110*a*, 110*b*, and 110*c* to the second electrode 114 for ensuring the reflection and resonance effect. The first electrode 113 may be subjected to surface treatment or further include an interface stability component for interfacial stability with the 1-1 layer 111*a* and the 1-2 layer 111*b*.

According to an embodiment of the present disclosure, when lights are emitted from the light emitting layers 123, 223, and 323 in the first to third subpixels SP_R, SP_G, and SP_B, respectively, the lights traveling vertically upward and downward from the light emitting layers 123, 223 and 323 are repeatedly reflected between the 1-1 to 1-3 reflective electrodes 110*a*, 110*b*, and 110*c* and the second electrode 114, so that each of lights may have strong microcavity characteristics for each wavelength corresponding to the distance between the second electrode 114 and the upper surfaces of 1-1 to 1-3 reflective electrodes 110*a*, 110*b* and 110*c*, respectively, and light of each specific or selected wavelength may be intensively emitted out of the second electrode 114. In each of the subpixels SP_R, SP_G, and SP_B, reflection is occurred from the upper surfaces of the 1-1 to 1-3 reflective electrodes 110*a*, 110*b*, and 110*c*. According to the configuration of the 1-1 layer 111*a* and 1-2 layer 111*b*, the first subpixel SP_R and the second subpixel SP_G have different resonance distances from each other. Each of the lights resonance between the 1-1 to 1-3 reflective electrodes 110*a*, 110*b*, and 110*c*, respectively, and the second electrode 114 may be emitted.

A capping layer 116 may be disposed on the second electrode 114. The capping layer 116 may protect the second electrode 114 and improve the light efficiency. For example, the capping layer 116 may be formed by stacking an organic layer and an inorganic layer. For example, the capping layer 116 may include at least one or more of inorganic material of silicon oxide ($SiO_2$), silicon nitride ($SiN_x$), zinc oxide ($ZnO_2$), titanium oxide ($TiO_2$), zirconium oxide ($ZrO_2$), indium tin oxide (ITO), indium zinc oxide (IZO), LiF, $Alq_3$, CuPc, CBP, a-NPB, and $ZiO_2$. For another example, the capping layer 116 may include an epoxy-based organic material formed with at least one or more of a bisphenol-type epoxy resin, an epoxidized butadiene resin, a fluorine-type epoxy resin, and a novolac epoxy resin.

An encapsulation layer 112 may be disposed on the capping layer 116. For example, the encapsulation layer 112 may be configured by alternating at least one or more pair of inorganic layer and organic layer. For example, the encapsulation layer 112 may include an alternating structure of an inorganic layer and an organic layer, and may have a structure of a plurality of pairs or N pairs (N is a natural number). An upper layer of the encapsulation layer 112 may be an inorganic layer. For another example, the encapsulation layer 112 may be formed of a single inorganic layer or a single organic layer. For example, the inorganic layer of the encapsulation layer 112 may partially include an oxide layer, a nitride layer, or a metal component such as aluminum (Al). For example, a metal component such as aluminum (Al) may be partially included to maintain transparency. For example, the inorganic layer of the encapsulation layer 112 may be formed to be wider than the organic layer in plain view to prevent moisture permeation from the outside by the inorganic layer.

The inorganic layer and the organic layer in the encapsulation layer 112 may cover and protect the lower layers under the capping layer 112. For example, the encapsulation layer 112 may have a thickness being twice or more as thickness of each layer below the capping layer 116. For example, the organic layer in the encapsulation layer 112 may have thickness of 10 times or more than each layer under the capping layer 116, so that even though foreign particles are occurred during the process, the particles may be covered to prevent the emission portions from the foreign materials stably.

Color filter layers may be disposed on the encapsulation layer 112. The first to third color filters 113*a*, 113*b*, and 113*c* disposed in each of the subpixels SP_R, SP_G, and SP_B, respectively, may receive the white light emitted from each of the light emitting layers 123, 223, and 323 and may transmit only wavelength of color of corresponding subpixel. For example, the first color filter layer 113*a* may correspond to the first subpixel SP_R. For example, the second color filter layer 113*b* may correspond to the second subpixel SP_G. For example, the third color filter layer 113*c* may correspond to the third subpixel SP_B.

For example, the first color filter layer 113*a* may transmit the light having a wavelength of about 600 nm to about 650 nm. The second color filter layer 113*b* may transmit the light having a wavelength of about 500 nm to about 590 nm. The third color filter layer 113*c* may transmit the light having a wavelength of about 420 nm to about 480 nm. The white color light may be implemented as a combination of other color lights than red, green, and blue. For example, the white light may be implemented by combination of three colors of cyan, magenta, and yellow. For another example, a combination of two colors or four or more colors may be possible to implement white color light.

FIG. 1 illustrates a display apparatus in which each of light emitting layers having different colors in each of the three emission portions, respectively, are configured to emit different colors from each other. The inventors of the present disclosure have recognized that the position of the light emitting layer configured in each of the three emission portions may be determined by the efficiency and/or luminance of the light emitting layer that varies depending on the distance (or overall thickness) between the first electrode and the second electrode. The inventors of the present disclosure conducted various experiments on the positions of the light emitting layers in consideration of the efficiency and/or luminance of the light emitting layer in each of the three emission portions. This will be described with reference to FIGS. 2A to 4C.

Figure 2A:
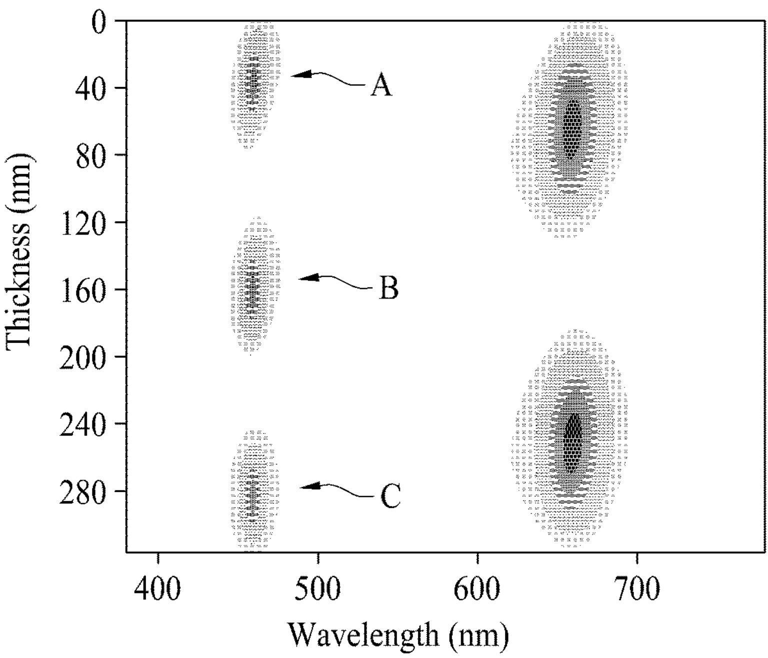
FIGS. 2A to 2C illustrate contour maps according to an embodiment of the present disclosure.
Figure 2B:
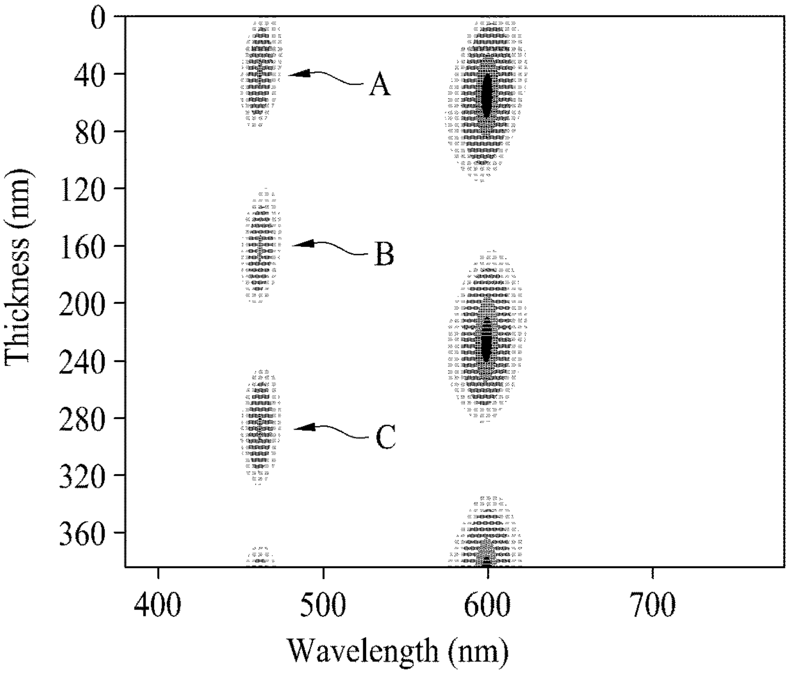
Figure 2C:
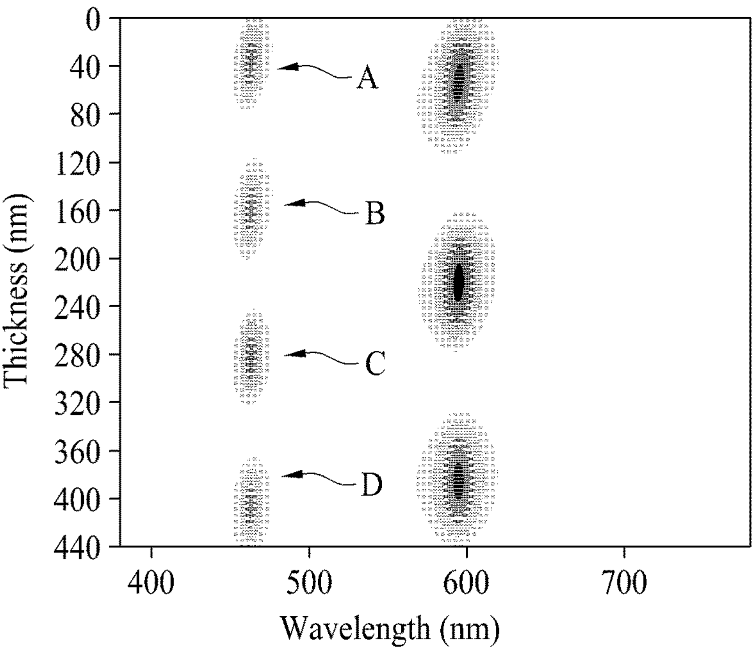

FIGS. 2A to 2C illustrate contour maps for blue light emitting layer according to an embodiment of the present disclosure.

In FIGS. 2A to 2C, a horizontal axis represents the wavelength (nm), and a vertical axis represents the distance between the first electrode and the second electrode or a thickness (nm) of the layers between the first electrode and the second electrode. For example, the distance between the first electrode and the second electrode may be a total thickness of the layers disposed between the first electrode and the second electrode. For example, FIGS. 2A to 2C illustrate positions of the light emitting layers according to the distance between the first electrode and the second electrode or the thickness of the layers between the first electrode and the second electrode. For example, when the distance between the first electrode and the second electrode or the thickness of the layers between the first electrode and the second electrode is 310 nm, 385 nm, and 450 nm, respectively, the positions of the blue light emitting layer are shown according to the distance or thickness of the light emitting layer. For the case of the configuration for the display apparatus with two emission portions, the distance between the first electrode and the second electrode or the thickness of the layers between the first and second electrodes may be 310 nm. Considering 45 nm, which is the distance of the last light emitting node from the second electrode, and considering that the distance from the second electrode to the green light emitting layer is 340 nm when the last light emitting node is at the green light emitting layer in a configuration having three emission portions, the distance between the first electrode and the second electrode or the thickness of the layers between the first electrode and the second electrode may be 385 nm. Considering 45 nm, which is the distance of the last light emitting node from the second electrode, and considering that the distance from the second electrode to the red light emitting layer or the blue light emitting layer is 405 nm when the last light emitting node is at the red light emitting layer or the blue light emitting layer in a configuration having three emission portions, the distance between the first electrode and the second electrode or the thickness of the layers between the first electrode and the second electrode may be 450 nm. Below 310 nm, there may not be sufficient space between the first and second electrodes to include two emission portions and intermediate layers. As will be described in greater detail below, above 450 nm, diminished efficiency at each of the light emitting nodes results in unsatisfactory performance characteristics, such as luminance and DCI coverage. For example, as shown in Table A below, at 405 nm from the second electrode (corresponding to overall distance of 450 nm), the most efficient light emitting node is blue light at 62%. It should be understood that distance between the second electrode and the nearest light emitting layer may be less than 45 nm, in some embodiments, such as 40 nm, 35 nm, or another suitable distance. For example, the distance between the second electrode and the nearest light emitting layer may be selected as thickness of the sixth common layer 325. As such, the lower bound of the range of distance between the first electrode and the second electrode may be slightly less than 310 nm, such as 305 nm, 300 nm, or another suitable distance.

FIGS. 2A to 2C illustrate the contour maps of the blue light emitting layer when the Purcell effect is applied. The contour map shows the emission position of the light emitting layer (or emission efficiency of the light emitting layer) according to the distance between the first electrode and the second electrode or the thickness of the layers between the first electrode and the second electrode. The Purcell effect means that the efficiency of the light emitting layer decreases as the light emitting layer is positioned closer to the electrode. The Purcell factor of the display panel according to an embodiment of the present disclosure may be about 0.7, but embodiments of the present disclosure are not limited thereto.

In FIGS. 2A to 2C, positions of the light emitting nodes may vary depending on the dopant and arrangement of the light emitting layer. A first node A may be closest portion to the second electrode, a second node B and a third node C may be portions far from the second electrode. For example, the node may be a light emitting node, but the term is not limited thereto.

FIG. 2A illustrates the case in which the distance between the first electrode and the second electrode or the thickness of the layers between the first electrode and the second electrode is 310 nm. Referring to FIG. 2A, the first node A of the blue light emitting layer at a wavelength of 460 nm has an efficiency of about 67%. The second node B of the blue light emitting layer at a wavelength of 460 nm has an efficiency of about 100%. The third node C of the blue light emitting layer at a wavelength of 460 nm has an efficiency of about 70%. Accordingly, when the distance between the first electrode and the second electrode or the thickness of the layers between the first electrode and the second electrode is 310 nm, the maximum or increased efficiency may be obtained when the blue light emitting layer is disposed at the second node B from the second electrode. For example, it may be seen that when the distance between the first electrode and the second electrode or the thickness of the layers between the first electrode and the second electrode is 310 nm, the maximum or increased efficiency may be obtained as the blue light emitting layer is disposed at 155 nm from the second electrode.

FIG. 2B illustrates the case in which the distance between the first electrode and the second electrode or the thickness of the layers between the first electrode and the second electrode is 385 nm. Referring to FIG. 2B, the first node A of the blue light emitting layer at a wavelength of 460 nm has an efficiency of about 50%. The second node B of the blue light emitting layer at a wavelength of 460 nm has an efficiency of about 90%. The third node C of the blue light emitting layer at a wavelength of 460 nm has an efficiency of about 66%. Accordingly, when the distance between the first electrode and the second electrode or the thickness of the layers between the first electrode and the second electrode is 385 nm, the maximum or increased efficiency is obtained when the blue light emitting layer is disposed at the second node B from the second electrode. For example, it may be seen that when the distance between the first electrode and the second electrode or the thickness of the layers between the first electrode and the second electrode is 385 nm, the maximum or increased efficiency may be obtained as the blue light emitting layer is disposed at 155 nm from the second electrode.

FIG. 2C illustrates the case in which the distance between the first electrode and the second electrode or the thickness of the layers between the first electrode and the second electrode is adjusted to 450 nm. Referring to FIG. 2C, the first node A of the blue light emitting layer at a wavelength of 460 nm has an efficiency of about 45%. The second node B of the blue light emitting layer at a wavelength of 460 nm has an efficiency of about 83%. The third node C of the blue light emitting layer at a wavelength of 460 nm has an efficiency of about 85%. The fourth node D of the blue light emitting layer at a wavelength of 460 nm has an efficiency of about 62%. Accordingly, when the distance between the first electrode and the second electrode or the thickness of the layers between the first electrode and the second electrode is 450 nm, the maximum or increased efficiency is obtained when the blue light emitting layer is disposed at the second node B or at the third node C from the second electrode. For example, it may be seen that when the distance between the first electrode and the second electrode or the thickness of the layers between the first electrode and the second electrode is 450 nm, the maximum or increased efficiency may be obtained as the blue light emitting layer is disposed at 155 nm or 275 nm from the second electrode.

As a comparison for wavelengths and distances to colors of light, the following ranges are often used: red light is about 620 nm, with an upper bound of about 650 nm and lower bound of about 600 nm; green light is about 500 to 590 nm with an upper bound of 590 nm and a lower bound of about 500 nm; blue light is about 420-480 nm with an upper bound of 480 nm and a lower bound of 420 nm. The exact wavelength of light that is emitted from a pixel or sub-pixel, after passing through any color filters that are present might vary somewhat from pixel to pixel and from one device to another, depending on a number of factors.

The efficiency of the light emitting layer may decrease because the overlapping area with the PL (Photoluminescence) peak decreases as the node inclines when the node moves away from the second electrode. For example, as the distance between the first electrode and the second electrode increases, the node becomes narrower and the overlapping area with the PL peak decreases, so that the efficiency of the light emitting layer may be decreased. For example, it may be seen that the efficiency of the blue light emitting layer decreases as the distance between the first electrode and the second electrode or the thickness of the layers between the first electrode and the second electrode increases.

Referring to FIGS. 2A to 2C, when the distance between the first electrode and the second electrode or the thickness of the layers between the first electrode and the second electrode is 310 nm, the blue light emitting layer has the first node A at 35 nm away from the second electrode, and other light emitting nodes may be formed at regular intervals of 120 nm or about 120 nm. For example, the light emitting nodes may be formed at positions such as 35 nm, 155 nm, and 275 nm. Furthermore, the fourth node D may be formed at 405 nm. For example, when the distance between the first electrode and the second electrode or the thickness of the layers between the first electrode and the second electrode is at least 405 nm or more, the fourth node D may be additionally formed at a position of 405 nm. In some embodiments, the fourth node D is additionally formed at a position of 395 nm, which is 120 nm greater than the third node C at 275 nm.

According to an embodiment of the present disclosure, when the distance between the first electrode and the second electrode or the thickness of the layers between the first electrode and the second electrode is 310 nm, the blue light emitting layer may be disposed at 155 nm from the second electrode, and the blue light emitting layer may be disposed at this position, and thus, the luminous efficiency of the light emitting layer may be enhanced or increased. Therefore, as the blue light emitting layer may be disposed at this position, the luminous efficiency of the light emitting layer may be enhanced or increased. According to another embodiment of the present disclosure, when the distance between the first electrode and the second electrode or the thickness of the layers between the first electrode and the second electrode is 385 nm, the blue light emitting layer may be disposed at 155 nm from the second electrode, and the blue light emitting layer may be disposed at this position, and thus, the luminous efficiency of the light emitting layer may be enhanced or increased. Therefore, as the blue light emitting layer may be disposed at this position, the luminous efficiency of the light emitting layer may be enhanced or increased. According to another embodiment of the present disclosure, when the distance between the first electrode and the second electrode or the thickness of the layers between the first electrode and the second electrode is adjusted to 450 nm, the blue light emitting layer may be disposed at 155 nm or 275 nm from the second electrode, and the blue light emitting layer may be disposed at this position, and thus, the luminous efficiency of the light emitting layer may be enhanced or increased. Therefore, as the blue light emitting layer may be disposed at this position, the luminous efficiency of the light emitting layer may be enhanced or increased.

Figure 3A:
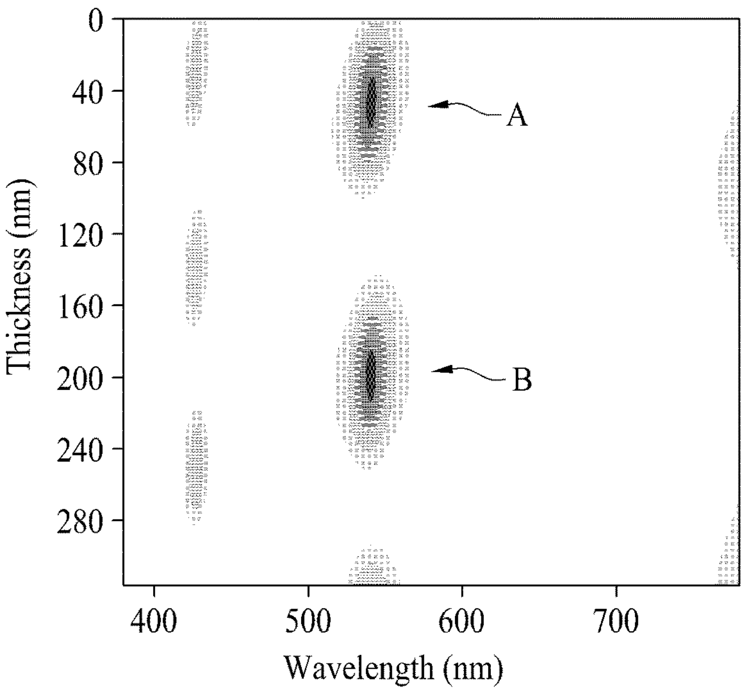
FIGS. 3A to 3C illustrate contour maps according to an embodiment of the present disclosure.
Figure 3B:
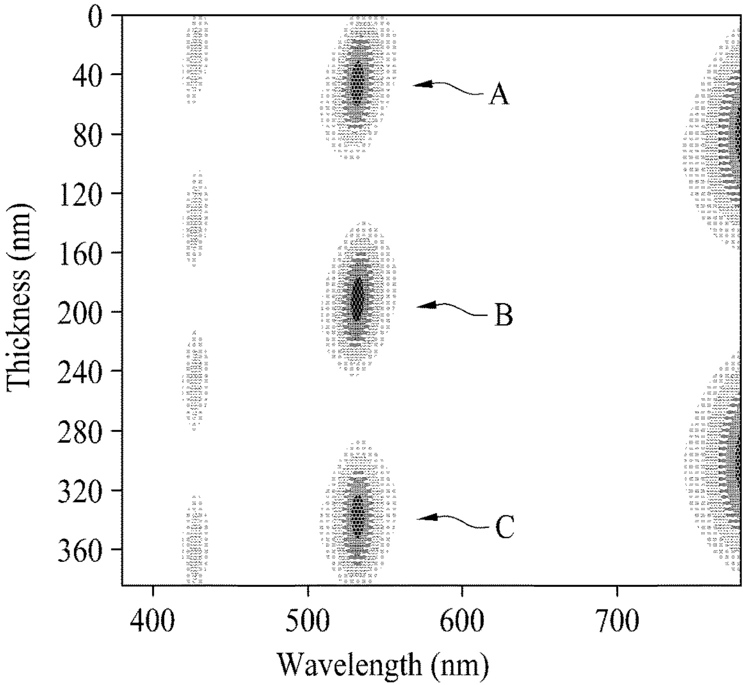
Figure 3C:
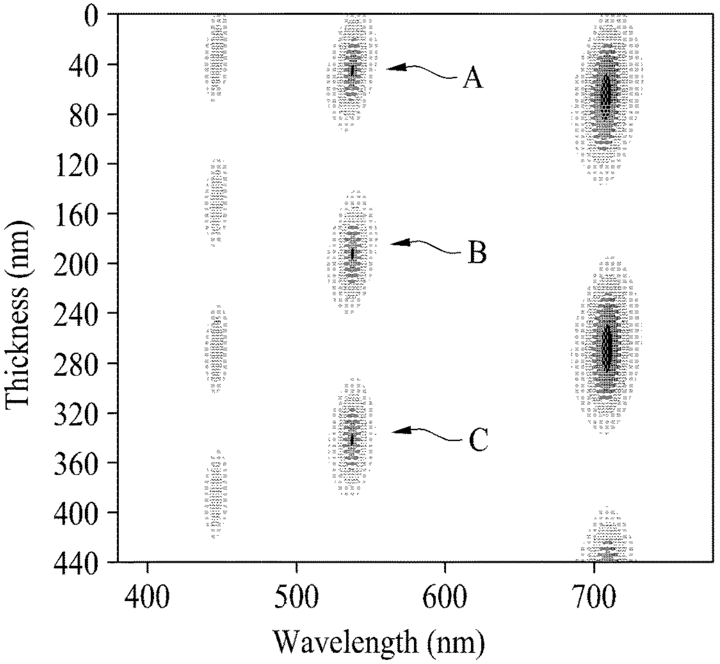

FIGS. 3A to 3C illustrate contour maps for green light emitting layer according to an embodiment of the present disclosure.

In FIGS. 3A to 3C, a horizontal axis represents the wavelength (nm), and a vertical axis represents the distance between the first electrode and the second electrode or a thickness (nm) of the layers between the first electrode and the second electrode. For example, the distance between the first electrode and the second electrode may be the total thickness of the layers disposed between the first electrode and the second electrode. For example, FIGS. 3A to 3C illustrate the positions of the light emitting layers according to the distance between the first electrode and the second electrode or the thickness of the layers between the first electrode and the second electrode. For example, when the distances between the first electrode and the second electrode or the thicknesses of the layers between the first electrode and the second electrode is 310 nm, 385 nm, and 450 nm, respectively, positions of the green light emitting layer are shown according to the distance or thickness of the light emitting layer. FIGS. 3A to 3C show the contour map of the green light emitting layer when the Purcell effect is applied.

FIG. 3A illustrates the case in which the distance between the first electrode and the second electrode or the thickness of the layers between the first electrode and the second electrode is 310 nm. Referring to FIG. 3A, the first node A of the green light emitting layer at a wavelength of 540 nm has an efficiency of about 68%. The second node B of the green light emitting layer at a wavelength of 540 nm has an efficiency of about 100%. Accordingly, when the distance between the first electrode and the second electrode or the thickness of the layers between the first electrode and the second electrode is 310 nm, the maximum or increased efficiency may be obtained when the green light emitting layer is disposed at the second node B from the second electrode. For example, when the distance between the first electrode and the second electrode or the thickness of the layers between the first electrode and the second electrode is 310 nm, the maximum or increased efficiency may be obtained when the green light emitting layer is disposed at 195 nm from the second electrode.

FIG. 3B illustrates the case in which the distance between the first electrode and the second electrode or the thickness of the layers between the first electrode and the second electrode is 385 nm. Referring to FIG. 3B, the first node A of the green light emitting layer at a wavelength of 540 nm has an efficiency of about 62%. The second node B of the green light emitting layer at a wavelength of 540 nm has an efficiency of about 91%. The third node C of the green light emitting layer at a wavelength of 540 nm has an efficiency of about 64%. Accordingly, when the distance between the first electrode and the second electrode or the thickness of the layers between the first electrode and the second electrode is 385 nm, the maximum or increased efficiency may be obtained when the green light emitting layer is disposed at the second node B from the second electrode. For example, it may be seen that when the distance between the first electrode and the second electrode or the thickness of the layers between the first electrode and the second electrode is 385 nm, the maximum or increased efficiency may be obtained as the green light emitting layer is disposed at 195 nm from the second electrode.

FIG. 3C illustrates the case in which the distance between the first electrode and the second electrode or the thickness of the layers between the first electrode and the second electrode is 450 nm. Referring to FIG. 3C, the first node A of the green light emitting layer at a wavelength of 540 nm has an efficiency of about 51%. The second node B of the green light emitting layer at a wavelength of 540 nm has an efficiency of about 77%. The third node C of the green light emitting layer at a wavelength of 540 nm has an efficiency of about 54%. Accordingly, when the distance between the first electrode and the second electrode or the thickness of the layers between the first electrode and the second electrode is 450 nm, the maximum or increased efficiency may be obtained when the green light emitting layer is disposed at the second node B from the second electrode. For example, when the distance between the first electrode and the second electrode or the thickness of the layers between the first electrode and the second electrode is 450 nm, the maximum or increased efficiency may be obtained as the green light emitting layer is disposed at 195 nm from the second electrode.

Referring to FIGS. 3A to 3C, the efficiency of the light emitting layer decreases because the overlapping area with the PL (Photoluminescence) peak decreases as the node inclines as the node moves away from the second electrode. For example, as the distance between the first electrode and the second electrode increases, the node becomes narrower and the overlapping area with the PL peak decreases, so that the efficiency of the light emitting layer may be decreased. For example, it may be seen that the efficiency of the green light emitting layer decreases as the distance between the first electrode and the second electrode or the thickness of the layers between the first electrode and the second electrode increases.

Referring to FIGS. 3A to 3C, when the distance between the first electrode and the second electrode or the thickness of the layers between the first electrode and the second electrode is 310 nm, the green light emitting layer has the first node A at 50 nm away from the second electrode, and other light emitting nodes may be formed at regular intervals of 145 nm. For example, the light emitting nodes may be formed at positions such as 50 nm, 195 nm, and 340 nm.

According to an embodiment of the present disclosure, when the distance between the first electrode and the second electrode or the thickness of the layers between the first electrode and the second electrode is 310 nm, the green light emitting layer may be disposed at 195 nm from the second electrode, and the green light emitting layer may be disposed at this position, and thus, the luminous efficiency of the light emitting layer may be enhanced or increased. Therefore, as the green light emitting layer may be disposed at this position, the luminous efficiency of the light emitting layer may be enhanced or increased. According to another embodiment of the present disclosure, when the distance between the first electrode and the second electrode or the thickness of the layers between the first electrode and the second electrode is 385 nm, the green light emitting layer may be disposed at 195 nm from the second electrode, and the green light emitting layer may be disposed at this position, and thus, the luminous efficiency of the light emitting layer may be enhanced or increased. Therefore, as the green light emitting layer may be disposed at this position, the luminous efficiency of the light emitting layer may be enhanced or increased. According to another embodiment of the present disclosure, when the distance between the first electrode and the second electrode or the thickness of the layers between the first electrode and the second electrode is 450 nm, the emitting node having maximum or increased efficiency for the green light emitting layer may be disposed at 195 nm from the second electrode, and the green light emitting layer may be disposed at this position, and thus, the luminous efficiency of the light emitting layer may be enhanced or increased. Therefore, as the green light emitting layer may be disposed at this position, the luminous efficiency of the light emitting layer may be enhanced or increased.

Figure 4A:
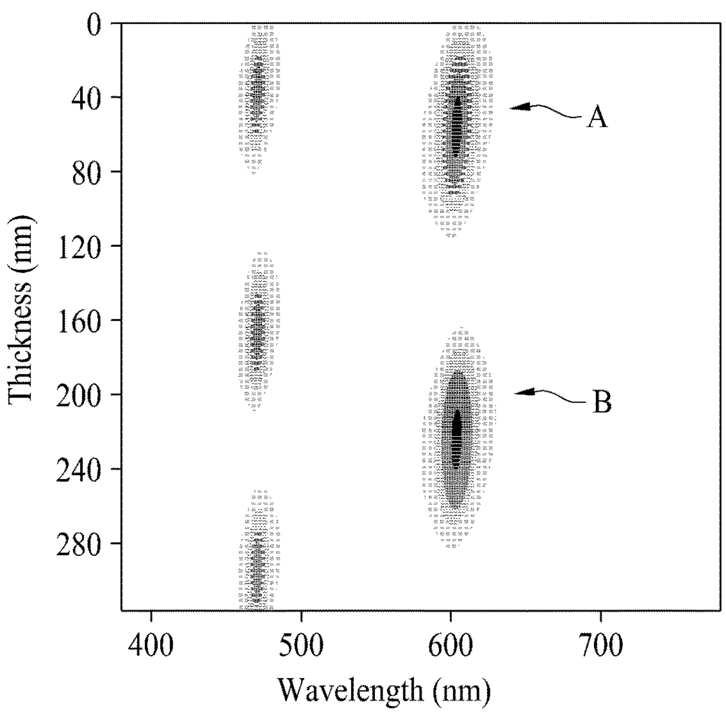
FIGS. 4A to 4C illustrate contour maps according to an embodiment of the present disclosure.
Figure 4B:
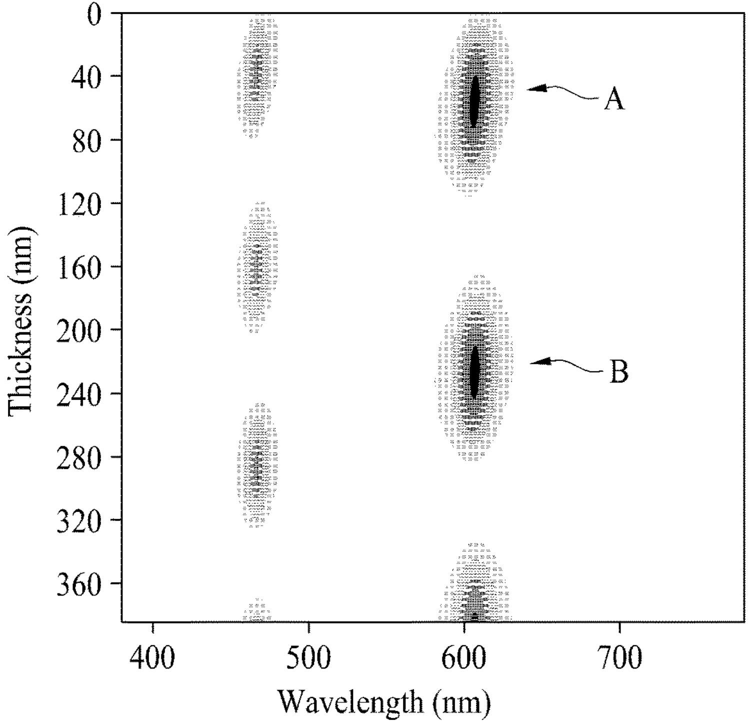
Figure 4C:
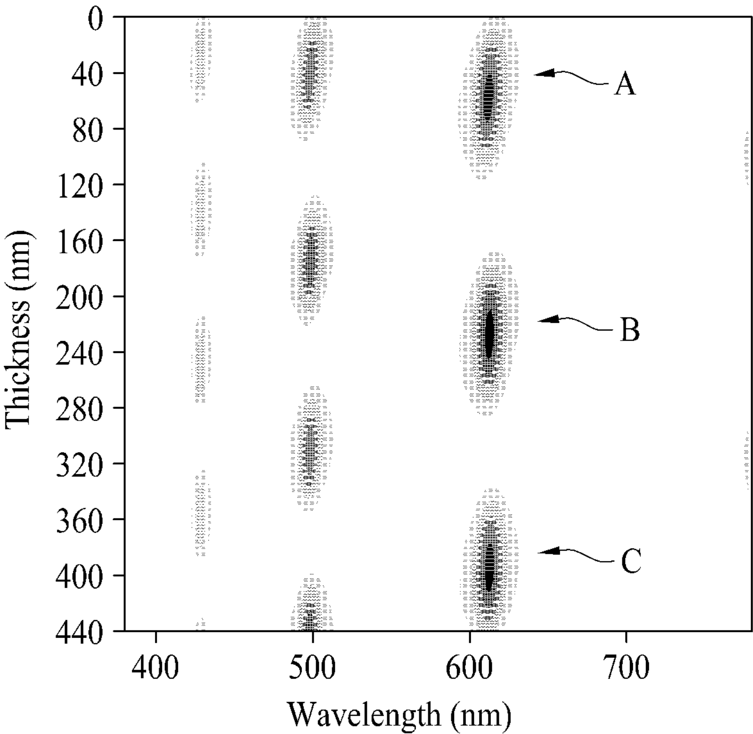

FIGS. 4A to 4C illustrate contour maps for red light emitting layer according to an embodiment of the present disclosure.

In FIGS. 4A to 4C, a horizontal axis represents the wavelength (nm), and a vertical axis represents the distance between the first electrode and the second electrode or a thickness (nm) of the layers between the first electrode and the second electrode. For example, the distance between the first electrode and the second electrode may be the total thickness of the layers disposed between the first electrode and the second electrode. For example, FIGS. 4A to 4C illustrate the emitting node positions of the light emitting layers according to the distance between the first electrode and the second electrode or the thickness of the layers between the first electrode and the second electrode. For example, when the distances between the first electrode and the second electrode or the thicknesses of the layers between the first electrode and the second electrode is 310 nm, 385 nm, and 450 nm, respectively, the emitting node positions of the red light emitting layer are shown according to the distance or thickness of the light emitting layer. FIGS. 4A to 4C illustrate the contour map of the red light emitting layer when the Purcell effect is applied.

FIG. 4A illustrates the case in which the distance between the first electrode and the second electrode or the thickness of the layers between the first electrode and the second electrode is 310 nm. Referring to FIG. 4A, the first node A of the red light emitting layer at a wavelength of 620 nm has an efficiency of about 65%. The second node B of the red light emitting layer at a wavelength of 620 nm has an efficiency of about 92%. Accordingly, when the distance between the first electrode and the second electrode or the thickness of the layers between the first electrode and the second electrode is 310 nm, the maximum or increased efficiency may be obtained when the red light emitting layer is disposed at the second node B from the second electrode. For example, when the distance between the first electrode and the second electrode or the thickness of the layers between the first electrode and the second electrode is 310 nm, the maximum or increased efficiency may be obtained when the red light emitting layer is disposed at 230 nm from the second electrode.

FIG. 4B illustrates the case in which the distance between the first electrode and the second electrode or the thickness of the layers between the first electrode and the second electrode is 385 nm. Referring to FIG. 4B, the first node A of the red light emitting layer at a wavelength of 620 nm has an efficiency of about 72%. The second node B of the red light emitting layer at a wavelength of 620 nm has an efficiency of about 100%. Accordingly, when the distance between the first electrode and the second electrode or the thickness of the layers between the first electrode and the second electrode is 385 nm, the maximum or increased efficiency may be obtained when the red light emitting layer is disposed at the second node B from the second electrode. For example, it may be seen that when the distance between the first electrode and the second electrode or the thickness of the layers between the first electrode and the second electrode is 385 nm, the maximum or increased efficiency may be obtained as the red light emitting layer is disposed at 230 nm from the second electrode.

FIG. 4C illustrates the case in which the distance between the first electrode and the second electrode or the thickness of the layers between the first electrode and the second electrode is 450 nm. Referring to FIG. 4C, the first node A of the red light emitting layer at a wavelength of 620 nm has an efficiency of about 57%. The second node B of the red light emitting layer at a wavelength of 620 nm has an efficiency of about 80%. The third node C of the red light emitting layer at a wavelength of 620 nm has an efficiency of about 58%. Accordingly, when the distance between the first electrode and the second electrode or the thickness of the layers between the first electrode and the second electrode is 450 nm, the maximum or increased efficiency is obtained when the red light emitting layer is disposed at the second node B from the second electrode. For example, it may be seen that when the distance between the first electrode and the second electrode or the thickness of the layers between the first electrode and the second electrode is 450 nm, the maximum or increased efficiency may be obtained as the red light emitting layer is disposed at 230 nm from the second electrode. In the above, the wavelength of about 620 nm is used as a measure of red light.

Referring to FIGS. 4A to 4C, the efficiency of the light emitting layer decreases because the overlapping area with the PL (Photoluminescence) peak decreases as the node inclines as the node moves away from the second electrode. For example, as the distance between the first electrode and the second electrode increases, the node becomes narrower and the overlapping area with the PL peak decreases, so that the efficiency of the light emitting layer may be decreased.

Efficiency for each light emitting node as described above with reference to FIGS. 2A to 4C is presented in table form in Table A below.

TABLE A

| Color | Node | Efficiency @ 310 nm | Efficiency @ 385 nm | Efficiency @ 450 nm |
|---|---|---|---|---|
| Blue | 35 nm | 67% | 50% | 45% |
| | 155 nm | 100% | 90% | 83% |
| | 275 nm | 70% | 66% | 85% |
| | 405 nm | — | — | 62% |
| Green | 50 nm | 68% | 62% | 51% |
| | 195 nm | 100% | 91% | 77% |
| | 340 nm | — | 64% | 54% |
| Red | 55 nm | 65% | 72% | 57% |
| | 230 nm | 92% | 100% | 80% |
| | 405 nm | — | — | 58% |

Referring to FIGS. 4A to 4C and Table A, when the distance between the first electrode and the second electrode or the thickness of the layers between the first electrode and the second electrode is 310 nm, the red light emitting layer has the first node A at 55 nm away from the second electrode, and other light emitting nodes may be formed at regular intervals of 175 nm. For example, the light emitting nodes may be formed at positions such as 55 nm, 230 nm, and 405 nm.

According to an embodiment of the present disclosure, when the distance between the first electrode and the second electrode or the thickness of the layers between the first electrode and the second electrode is 310 nm, the red light emitting layer may be disposed at 230 nm from the second electrode, and the red light emitting layer may be disposed at this position, and thus, the luminous efficiency of the light emitting layer may be enhanced or increased. Therefore, as the red light emitting layer may be disposed at this position, the luminous efficiency of the light emitting layer may be enhanced or increased. According to another embodiment of the present disclosure, when the distance between the first electrode and the second electrode or the thickness of the layers between the first electrode and the second electrode is 385 nm, the red light emitting layer may be disposed at 230 nm from the second electrode, and the red light emitting layer may be disposed at this position, and thus, the luminous efficiency of the light emitting layer may be enhanced or increased. Therefore, as the red light emitting layer may be disposed at this position, the luminous efficiency of the light emitting layer may be enhanced or increased. According to another embodiment of the present disclosure, when the distance between the first electrode and the second electrode or the thickness of the layers between the first electrode and the second electrode is 450 nm, the red light emitting layer may be disposed at 230 nm from the second electrode, and the red light emitting layer may be disposed at this position, and thus, the luminous efficiency of the light emitting layer may be enhanced or increased. Therefore, as the red light emitting layer may be disposed at this position, the luminous efficiency of the light emitting layer may be enhanced or increased.

Referring to FIGS. 2A to 4C, when the distance between the first electrode and the second electrode or the thickness of the layers between the first electrode and the second electrode is 310 nm, the blue light emitting layer has high efficiency in the order of 155 nm (e.g., about 100% efficiency) and 275 nm (e.g., about 70% efficiency) from the second electrode, the green light emitting layer has high efficiency in the order of 195 nm (e.g., about 100% efficiency) and 50 nm (e.g., about 68% efficiency) from the second electrode, and the red light emitting layer has high efficiency in the order of 230 nm (e.g., about 92% efficiency) and 55 nm (e.g., about 65% efficiency) from the second electrode. When the light emitting layers are arranged in order having greatest efficiency, a blue light emitting layer, a green light emitting layer and a red light emitting layer may be configured in the order (e.g., order of increasing distance) from the second electrode. However, since the blue light emitting layer and the green light emitting layer are disposed close together (e.g., respectively offset from the second electrode at 155 nm and 195 nm), any other layers may not be disposed between the green light emitting layer and the blue light emitting layer. Accordingly there is a problem in which it is difficult to configure the display panel. In addition, since the green light emitting layer and the red light emitting layer are disposed close to each other (e.g., respectively offset from the second electrode at 195 nm and 230 nm), any other layers may not be disposed between the green light emitting layer and the red light emitting layer, so that it is difficult to configure the display panel. The green light emitting layer may be disposed at 195 nm for the second electrode to improve the efficiency of the green light emitting layer. Further, each of the red light emitting layer and the blue light emitting layer may be disposed at the second-most efficient position, respectively. For an example, from the second electrode, a red light emitting layer, a green light emitting layer and a blue light emitting layer may be configured in order. For example, the red light emitting layer may be disposed at 55 nm from the second electrode, the green light emitting layer may be disposed 195 nm from the second electrode, and the blue light emitting layer may be disposed at 275 nm from the second electrode. As such, separation between respective pairs of the red, green, and blue light emitting layers may be about 90 nm and about 130 nm, which allows for other layers to be disposed therebetween.

For another example, since the efficiency of the blue light emitting layer is insufficient compared to the efficiency of the red light emitting layer and the efficiency of the green light emitting layer, the blue light emitting layer may be configured to be positioned at 155 nm (e.g., having about 100% efficiency) from the second electrode in consideration of the efficiency of the blue light emitting layer. And then, the red light emitting layer may be disposed at 230 nm (e.g., having about 92% efficiency) from the second electrode to improve the efficiency of the red light emitting layer. Therefore, the efficiency of the blue light emitting layer and the red light emitting layer may be improved at the same time. For example, it may be configured in order of a green light emitting layer, a blue light emitting layer and a red light emitting layer from the second electrode. For example, the green light emitting layer may be disposed at 50 nm (e.g., having about 68% efficiency) from the second electrode, the blue light emitting layer may be disposed at 155 nm from the second electrode, and the red light emitting layer may be disposed at 230 nm from the second electrode.

Referring to FIGS. 2A to 4C, when the distance between the first electrode and the second electrode or the thickness of the layers between the first electrode and the second electrode is 385 nm, the blue light emitting layer has high efficiency in the order of 155 nm, 275 nm and 35 nm from the second electrode, the green light emitting layer has high efficiency in the order of 195 nm and 340 nm from the second electrode, and the red light emitting layer has high efficiency in the order of 230 nm and 55 nm from the second electrode. When the light emitting layers are arranged in the most efficient order, a blue light emitting layer, a green light emitting layer and a red light emitting layer may be configured in the order from the second electrode. However, since the blue light emitting layer and the green light emitting layer are disposed close together or the green light emitting layer and the red light emitting layer are disposed close together, there is a problem in which it is difficult to configure the display panel. Since the efficiency of the blue light emitting layer is insufficient compared to the efficiency of the red light emitting layer and the efficiency of the green light emitting layer, the blue light emitting layer may be configured to be positioned at 155 nm from the second electrode in consideration of the efficiency of the blue light emitting layer. The green light emitting layer may be disposed at 340 nm from the second electrode which is the second most efficiency position in the green light emitting layer. Further, the red light emitting layer may be disposed at 55 nm, which is the second most efficient position in the red light emitting layer. Accordingly, the efficiency of the blue light emitting layer may be improved. For example, from the second electrode, the red light emitting layer, a blue light emitting layer and a green light emitting layer may be configured in order. For example, the red light emitting layer may be disposed at 55 nm from the second electrode, the blue light emitting layer may be disposed at 155 nm from the second electrode, and the green light emitting layer may be disposed at 340 nm from the second electrode.

For another example, from the above explanation, when the red-light emitting layer may be positioned at 230 nm from the second electrode, the efficiency of the red-light emitting layer may be improved. The green light emitting layer may be disposed at 340 nm from the second electrode which is the second most efficient position in the green light emitting layer. Further, the blue light emitting layer may be disposed at 35 nm from the second electrode, which is the third most efficient in the blue light emitting layer. Accordingly, the efficiency of the red light emitting layer may be improved. For example, a blue light emitting layer, a red light emitting layer and a green light emitting layer may be configured in order from the second electrode. Accordingly, the blue light emitting layer may be disposed at 35 nm from the second electrode, the red light emitting layer may be disposed at 230 nm from the second electrode, and the green light emitting layer may be disposed at 340 nm from the second electrode.

Referring to FIGS. 2A to 4C, when the distance between the first electrode and the second electrode or the thickness of the layers between the first electrode and the second electrode is 450 nm, the blue light emitting layer has high efficiency in the order of 230 nm, 155 nm, 275 nm, 405 nm, and 35 nm from the second electrode, the green light emitting layer has high efficiency in the order of 195 nm, 340 nm, and 50 nm from the second electrode, and the red light emitting layer has high efficiency in the order of 230 nm, 405 nm, and 55 nm from the second electrode. When the light emitting layers are arranged in the order having greatest efficiency, a blue light emitting layer, a green light emitting layer and a red light emitting layer may be configured in the order from the second electrode. However, since the blue light emitting layer and the green light emitting layer are disposed close together or the green light emitting layer and the red light emitting layer are disposed close together, there is a problem in which it is difficult to configure the display panel. When the green light emitting layer may be positioned at 195 nm from the second electrode, the efficiency of the green light emitting layer may be improved, but the efficiency of the blue light emitting layer and the efficiency of the red light emitting layer may be lowered. Accordingly, the red light emitting layer may be disposed at 230 nm from the second electrode in consideration of the efficiency of the red light emitting layer. Further, the green light emitting layer and the blue light emitting layer may be disposed in consideration of the other layers between the light emitting layers. For example, a green light emitting layer, a red light emitting layer and a blue light emitting layer may be configured in order from the second electrode. Therefore, the green light emitting layer may be disposed at 50 nm from the second electrode, the red light emitting layer may be disposed at 230 nm from the second electrode, and the blue light emitting layer may be disposed at 405 nm from the second electrode.

For another example, as considering the efficiency of the green light emitting layer, when the green light emitting layer is disposed at 195 nm from the second electrode, the efficiency of the green light emitting layer may be improved. The red light emitting layer may be disposed at 405 nm which is the second most efficient. Accordingly, the efficiency of the green light emitting layer may be improved. For example, a blue light emitting layer, a green light emitting layer and a red light emitting layer may be configured in order from the second electrode. Accordingly, the blue light emitting layer may be disposed at 35 nm from the second electrode, the green light emitting layer may be disposed at 195 nm from the second electrode, and the red light emitting layer may be disposed at 405 nm from the second electrode.

A display panel including emission portions may be configured in consideration of the efficiency of the light emitting layers according to the distance between the first electrode and the second electrode or the thickness of the layers between the first electrode and the second electrode as shown in FIGS. 2A to 4C. The detailed configurations will be explained with reference to FIGS. 5 to 11.

Figure 5:
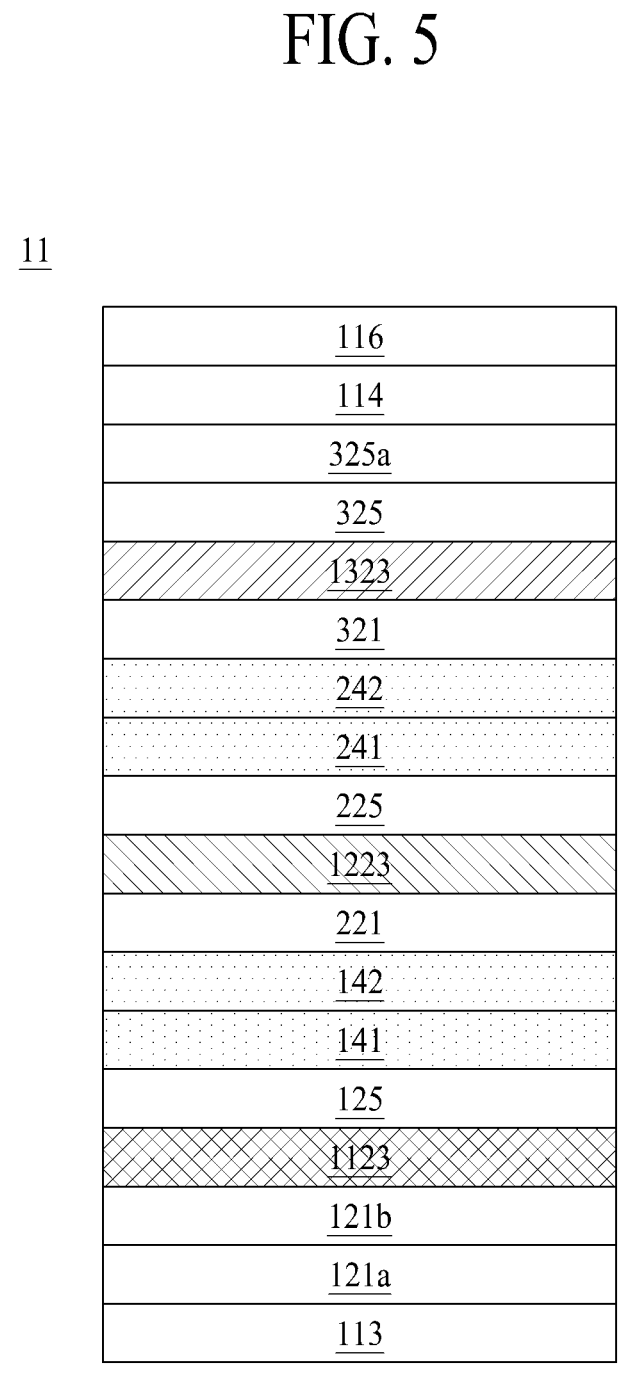

FIG. 5 illustrates a display panel according to an embodiment of the present disclosure.

Referring to FIG. 5, a display panel 11 according to an embodiment of the present disclosure may comprise a first electrode 113, light emitting layers 1123, 1223, and 1323, and a second electrode 114. In the description of each layer in the display panel, the same explanation as described in FIG. 1 may be omitted or simplified.

A first emission portion, a second emission portion and a third emission portion may be disposed between the first electrode 113 and the second electrode 114. Each of the light emitting layers 1123, 1223, and 1323 in each of the first emission portion, the second emission portion and the third emission portion, respectively may emit different color light from each other. A capping layer 116 may be further disposed on the second electrode 114.

As described in FIGS. 2A to 4C, in FIG. 5, the distance between the first electrode and the second electrode or the thickness of the layers between the first electrode and the second electrode may be 310 nm, and a red light emitting layer, a green emitting layer, and a blue light emitting layer are configured in order (in sequence) from the second electrode.

The first emission portion may include a first common layer 121, a first light emitting layer 1123, and a second common layer 125. The first common layer may be a hole transfer layer. For example, the first common layer 121 may be configured with two layers including a hole injection layer 121*a* and a hole transport layer 121*b*. The first light emitting layer 1123 may be a blue light emitting layer. The second common layer 125 may be an electron transfer layer. For example, the second common layer 125 may be an electron transport layer. For another example, each of the first common layer 121 and the second common layer 125 may be configured with two or more hole transport layers and two or more electron transport layers, respectively.

For example, the first light emitting layer 1123 may include at least one or more host and at least one or more dopant. For example, the dopant of the first light emitting layer 1123 may include a blue fluorescent dopant. The peak wavelength of the blue fluorescent dopant may be in a range of 420 nm to 480 nm. Accordingly, the blue light emitting layer may emit the blue light close to deep blue color. The blue dopant may have a full width at half maximum (FWHM) of 20 nm to 35 nm in which it has an intensity of 50% or more compared to the intensity of the peak wavelength within the width 20 nm to 35 nm. Lights emitted from the first light emitting layer 1123 in a narrow wavelength range of deep blue color may be finely resonated and may be amplified, and then emitted to the second electrode 114 within a distance between the reflective electrode 110*c* and the second electrode 114 at the third subpixel SP_B. For example, since a blue dopant having a narrow FWHM is used, there is an advantage in which the amount of light lost, when the third color filter layer 113*c* is transmitted, may be reduced. For another example, the first light emitting layer 1123 may be formed of a blue phosphorescent dopant. The peak wavelength of the blue phosphorescent dopant may be in the range of 420 nm to 480 nm. When the blue phosphorescent dopant is used, the efficiency and luminance of the first light emitting layer 1123 may be further improved. For another example, the first light emitting layer 1123 may be formed of a thermally activated delayed fluorescence (TADF) dopant. The peak wavelength of the thermally activated delayed fluorescent dopant may be in a range from 420 nm to 480 nm. TADF is capable of inverse intersystem transition from a triplet excited state to a singlet excited state, and excitons in the triplet state are used for light emission, so that the luminous efficiency of the first light emitting layer 1123 may be improved. For example, the first light emitting layer 1123 may be disposed at 275 nm from the second electrode 114. For example, the first light emitting layer 1123 may be disposed at a distance of 275 nm from a lower surface of the second electrode 114. It should be appreciated that different dopants used in the blue light emitting layer may result in different blue light emitting nodes than those described with reference to FIGS. 2A-2C and Table A. For example, the blue light emitting nodes may be shifted in the positive or negative direction by a few to tens of nanometers depending on which dopant is used in the blue light emitting layer.

The second emission portions may include a third common layer 221, a second light emitting layer 1223, and a fourth common layer 225. The third common layer 221 may be a hole transfer layer. For example, the third common layer 221 may include two hole transport layers. The second light emitting layer 1223 may be a green light emitting layer. The fourth common layer 225 may be an electron transfer layer. For example, the fourth common layer 225 may be an electron transport layer. For another example, each of the third common layer 221 and the fourth common layer 225 may include two or more hole transport layers and two or more electro transport layers, respectively. For example, the third common layer 221 may be formed of the same material as the first common layer 121. For example, the fourth common layer 225 may be formed of the same material as the second common layer 125.

For example, the second light emitting layer 1223 may include at least one or more host and at least one or more dopant. For example, the dopant of the second light emitting layer 1223 may be formed of a phosphorescent dopant. For example, the dopant of the second light emitting layer 1223 may have a peak wavelength in the range of 500 nm to 590 nm, and may include at least one or more dopant among green, yellow-green, and yellow dopants. For example, the second light emitting layer 1223 may be disposed at a distance of 195 nm from the second electrode 114. For example, the second light emitting layer 1223 may be disposed at a distance of 195 nm from a lower surface of the second electrode 114. It should be appreciated that different dopants used in the green light emitting layer may result in different green light emitting nodes than those described with reference to FIGS. 3A-3C and Table A. For example, the green light emitting nodes may be shifted in the positive or negative direction by a few to tens of nanometers depending on which dopant is used in the green light emitting layer.

A first charge generation layer may be disposed between the first light emitting layer and the second light emitting layer. The first charge generation layer may include a first n-type charge generation layer 141 and a first p-type charge generation layer 142.

The third emission portion may include a fifth common layer 321, a third light emitting layer 1323, and a sixth common layer 325. The fifth common layer 321 may be a hole transfer layer. For example, the fifth common layer 321 may be configured as a hole transport layer. The third light emitting layer 1323 may be a red light emitting layer. The sixth common layer 325 may be an electron transfer layer. For example, an electron injection layer 325*a* may be further included on the sixth common layer 325. For another example, the electron injection layer 325*a* may be omitted. As another example, each of the fifth common layer 321 and the sixth common layer 325 may include two or more hole transport layers and two or more electron transport layers, respectively. For example, the fifth common layer 321 may be formed of the same material as at least one of the first common layer 121 and the third common layer 221. For example, the sixth common layer 325 may be formed of the same material as at least one of the second common layer 125 and the fourth common layer 225.

For example, the third light emitting layer 1323 may include at least one or more host and at least one or more dopant. For example, the dopant of the third light emitting layer 1323 may be formed of a red phosphorescent dopant. For example, the dopant of the third light emitting layer 1323 may have a peak wavelength in a range of 600 nm to 650 nm, and may include a red dopant. For example, the third light emitting layer 1323 may be disposed at 55 nm from the second electrode 114. For example, the third light emitting layer 1323 may be disposed at 55 nm from a lower surface of the second electrode 114. It should be appreciated that different dopants used in the red light emitting layer may result in different red light emitting nodes than those described with reference to FIGS. 4A-4C and Table A. For example, the red light emitting nodes may be shifted in the positive or negative direction by a few to tens of nanometers depending on which dopant is used in the red light emitting layer.

A second charge generation layer may be disposed between the second emission portion and the third emission portion. For example, the second charge generation layer may include a second n-type charge generation layer 241 and a second p-type charge generation layer 242.

According to an embodiment of the present disclosure, the first light emitting layer 1123 may be a blue light emitting layer, the second light emitting layer 1223 may be a green light emitting layer, and the third light emitting layer 1323 may be a red light emitting layer. Since each of the first to third emission portions is configured to have light emitting layers having a different color light, it may be overcome the problem in which the efficiency of the light emitting layer is lowered or the luminance is lowered due to the sharing of excitons between the two light emitting layers, which occurs when only two emission portions are included into the display panel. For example, in the case that the display panel is configured with only two emission portions, the second emission portion may be configured to be a junction of a red light emitting layer and a green light emitting layer, so that the red light emitting layer and the green light emitting layer may share excitons. As the result, there may be problems in which the efficiency of the red light emitting layer and the green light emitting layer is lowered and the luminance of the display device is lower. However, according to embodiments of the present disclosure can overcome this problem because the display panel is configured with three emission portions in which each of them provide different color light from each other.

Figure 6:
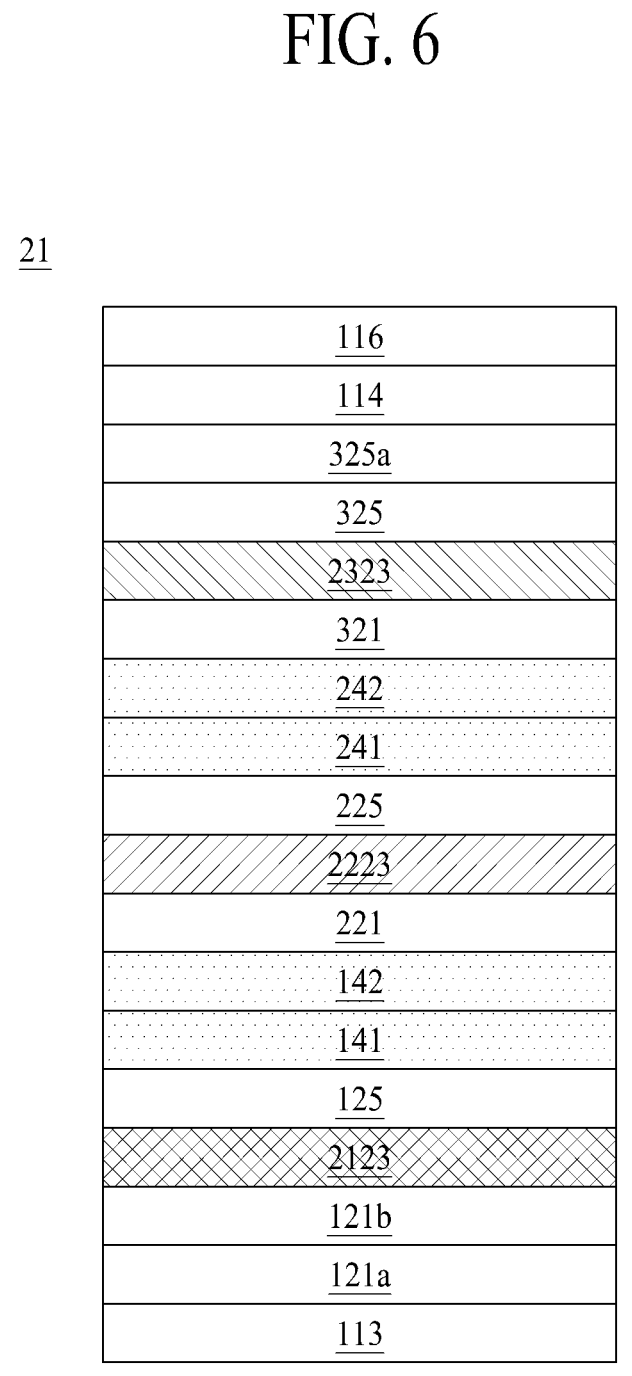

FIG. 6 illustrates a display panel according to an embodiment of the present disclosure.

Referring to FIG. 6, a display panel 21 according to an embodiment of the present disclosure may comprise a first electrode 113, light emitting layers 2123, 2223, and 2323, and a second electrode 114. In the description of each layer in the display panel, the same explanation as described in FIG. 1 may be omitted or simplified.

A first emission portion, a second emission portion and a third emission portion may be disposed between the first electrode 113 and the second electrode 114. Each of the light emitting layers 2123, 2223, and 2323 in each of the first emission portion, the second emission portion and the third emission portion, respectively may emit different color light from each other. A capping layer 116 may be further disposed on the second electrode 114.

As described in FIGS. 2A to 4C, in FIG. 5, the distance between the first electrode and the second electrode or the thickness of the layers between the first electrode and the second electrode may be 310 nm, and a green light emitting layer, a blue emitting layer and a red light emitting layer are configured in order from the second electrode.

The first emission portion may include a first common layer 121, a first light emitting layer 2123 and a second common layer 125. Since the first common layer 121 and the second common layer 125 are the same as those described with reference to FIGS. 1 and 5, descriptions thereof may be omitted. The first light emitting layer 2123 may be a red light emitting layer. For example, the first light emitting layer 2123 may include at least one or more host and at least one or more dopant. For example, the dopant of the first light emitting layer 2123 may include a red phosphorescent dopant. For example, the peak wavelength of the red dopant may be in a range from 600 nm to 650 nm. For example, the first light emitting layer 2123 may be disposed at 230 nm from the second electrode 114. For example, the first light emitting layer 2123 may be disposed at a distance of 230 nm from a lower surface of the second electrode 114.

The second emission portions may include a third common layer 221, a second light emitting layer 2223, and a fourth common layer 225. Since the third common layer 221 and the fourth common layer 225 are the same as those described with reference to FIGS. 1 and 5, descriptions thereof may be omitted. The second light emitting layer 2223 may be a blue light emitting layer. For example, the second light emitting layer 2223 may include at least one or more host and at least one or more dopant. For example, the dopant of the second light emitting layer 2223 may include one or more of a blue fluorescent dopant, a blue phosphorescent dopant and a delayed fluorescent dopant. The peak wavelength of the blue dopant may be in a range of 420 nm to 480 nm. For example, the second light emitting layer 2223 may be disposed at a distance of 155 nm from the second electrode 114. For example, the second light emitting layer 2223 may be disposed at a distance of 155 nm from a lower surface of the second electrode 114.

A first charge generation layer may be disposed between the first light emitting layer and the second light emitting layer. The first charge generation layer may include a first n-type charge generation layer 141 and a first p-type charge generation layer 142.

The third emission portion may include a fifth common layer 321, a third light emitting layer 2323, and a sixth common layer 325. Since the fifth common layer 321 and the sixth common layer 325 are the same as those described with reference to FIGS. 1 and 5, descriptions thereof may be omitted. The third light emitting layer 2323 may be a green light emitting layer. For example, the third light emitting layer 2323 may include at least one or more host and at least one or more dopant. For example, the dopant of the third light emitting layer 2323 may be formed of a green phosphorescent dopant. For example, the dopant of the third light emitting layer 2323 may have a peak wavelength in a range of 500 nm to 590 nm, and may include at least one or more dopant among green, yellow-green and yellow. For example, the third light emitting layer 2323 may be disposed at 50 nm from the second electrode 114. For example, the third light emitting layer 2323 may be disposed at 50 nm from a lower surface of the second electrode 114.

A second charge generation layer may be disposed between the second emission portion and the third emission portion. For example, the second charge generation layer may include a second n-type charge generation layer 241 and a second p-type charge generation layer 242.

According to an embodiment of the present disclosure, the first light emitting layer 2123 may be a red light emitting layer, the second light emitting layer 2223 may be a blue light emitting layer, and the third light emitting layer 2323 may be a green light emitting layer. Since each of the first, second, and third emission portions is configured to have light emitting layers having a different color light, it may be overcome the problem in which the efficiency of the light emitting layer is lowered or the luminance is lowered due to the sharing of excitons between the two light emitting layers, which occurs when only two emission portions are included into the display panel. For example, in the case that the display panel is configured with only two emission portions, the second emission portion may be configured to be a junction of a red light emitting layer and a green light emitting layer, so that the red light emitting layer and the green light emitting layer may share excitons. As the result, there may be problems in which the efficiency of the red light emitting layer and the green light emitting layer is lowered and the luminance of the display device is lower. However, the present disclosure can overcome this problem because the display panel is configured with three emission portions in which each of them provide different color light from each other.

Figure 7:
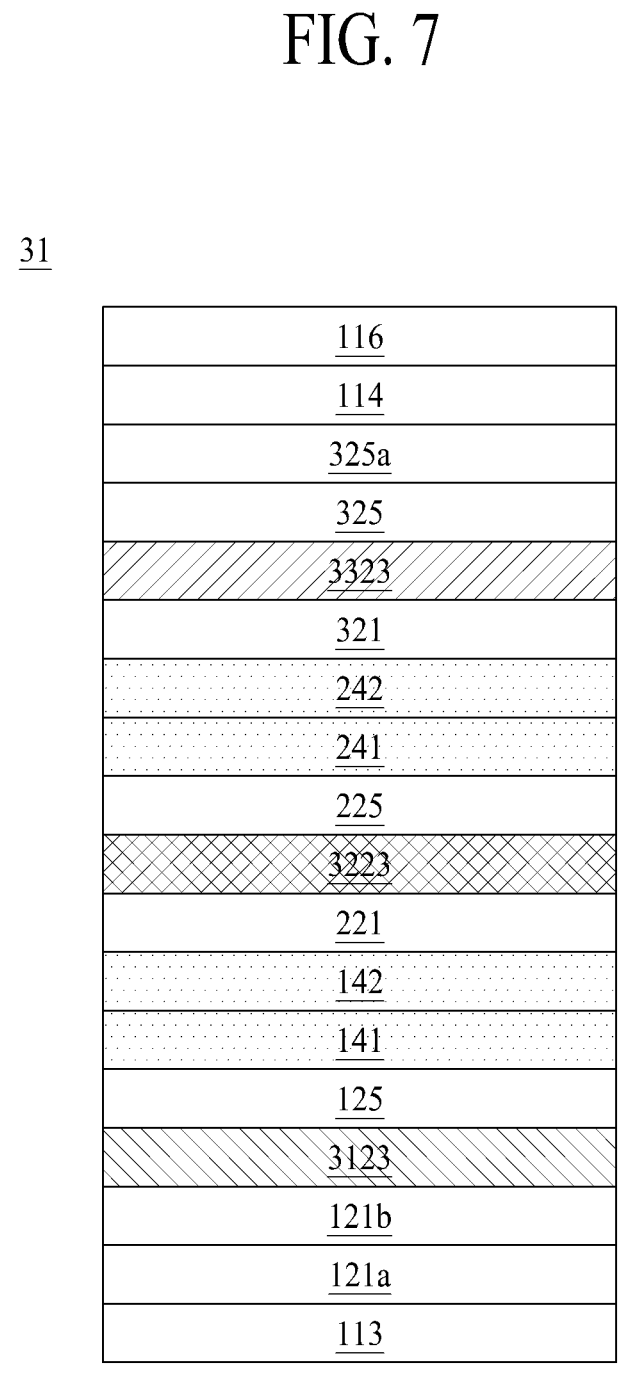

FIG. 7 illustrates a display panel according to an embodiment of the present disclosure.

Referring to FIG. 7, a display panel 31 according to an embodiment of the present disclosure may comprise a first electrode 113, light emitting layers 3123, 3223, and 3323, and a second electrode 114. In the description of each layer in the display panel, the same explanation as described in FIG. 1 may be omitted or simplified.

A first emission portion, a second emission portion and a third emission portion may be disposed between the first electrode 113 and the second electrode 114. Each of the light emitting layers 3123, 3223, and 3323 in each of the first emission portion, the second emission portion and the third emission portion, respectively may emit different color light from each other. A capping layer 116 may be further disposed on the second electrode 114.

As described in FIGS. 2A to 4C, in FIG. 7, the distance between the first electrode and the second electrode or the thickness of the layers between the first electrode and the second electrode may be 385 nm, and a red light emitting layer, a blue emitting layer and a green light emitting layer are configured in order from the second electrode.

The first emission portion may include a first common layer 121, a first light emitting layer 3123 and a second common layer 125. Since the first common layer 121 and the second common layer 125 are the same as those described with reference to FIGS. 1 and 5, descriptions thereof may be omitted. The first light emitting layer 3123 may be a green light emitting layer. For example, the first light emitting layer 3123 may include at least one or more host and at least one or more dopant. For example, the dopant of the first light emitting layer 3123 may include a green phosphorescent dopant. For example, the dopant of the first light emitting layer 3123 may have a peak wavelength in a range of 500 nm to 590 nm, and may include at least one or more dopant among green, yellow-green, and yellow. For example, the first light emitting layer 3123 may be disposed at 340 nm from the second electrode 114. For example, the first light emitting layer 3123 may be disposed at a distance of 340 nm from a lower surface of the second electrode 114.

The second emission portions may include a third common layer 221, a second light emitting layer 3223 and a fourth common layer 225. Since the third common layer 221 and the fourth common layer 225 are the same as those described with reference to FIGS. 1 and 5, descriptions thereof may be omitted. The second light emitting layer 3223 may be a blue light emitting layer. For example, the second light emitting layer 3223 may include at least one or more host and at least one or more dopant. For example, the dopant of the second light emitting layer 3223 may include one or more of a blue fluorescent dopant, a blue phosphorescent dopant and a delayed fluorescent dopant. The peak wavelength of the blue dopant may be in a range of 420 nm to 480 nm. For example, the second light emitting layer 3223 may be disposed at a distance of 155 nm from the second electrode 114. For example, the second light emitting layer 3223 may be disposed at a distance of 155 nm from a lower surface of the second electrode 114.

A first charge generation layer may be disposed between the first light emitting layer and the second light emitting layer. The first charge generation layer may include a first n-type charge generation layer 141 and a first p-type charge generation layer 142.

The third emission portion may include a fifth common layer 321, a third light emitting layer 3323, and a sixth common layer 325. Since the fifth common layer 321 and the sixth common layer 325 are the same as those described with reference to FIGS. 1 and 5, descriptions thereof may be omitted. The third light emitting layer 3323 may be a red light emitting layer. For example, the third light emitting layer 3323 may include at least one or more host and at least one or more dopant. For example, the dopant of the third light emitting layer 3323 may be formed of a red phosphorescent dopant. For example, the peak wavelength of the red phosphorescent dopant may be in a range of 600 nm to 650 nm. For example, the third light emitting layer 3323 may be disposed at 55 nm from the second electrode 114. For example, the third light emitting layer 3323 may be disposed at 55 nm from a lower surface of the second electrode 114.

A second charge generation layer may be disposed between the second emission portion and the third emission portion. For example, the second charge generation layer may include a second n-type charge generation layer 241 and a second p-type charge generation layer 242.

According to an embodiment of the present disclosure, the first light emitting layer 3123 may be a green light emitting layer, the second light emitting layer 3223 may be a blue light emitting layer, and the third light emitting layer 3323 may be a red light emitting layer. Since each of the first, second and third emission portions is configured to have light emitting layers having a different color light, it may be overcome the problem in which the efficiency of the light emitting layer is lowered or the luminance is lowered due to the sharing of excitons between the two light emitting layers, which occurs when only two emission portions are included into the display panel. For example, in the case that the display panel is configured with only two emission portions, the second emission portion may be configured to be a junction of a red light emitting layer and a green light emitting layer, so that the red light emitting layer and the green light emitting layer may share excitons. As the result, there may be problems in which the efficiency of the red light emitting layer and the green light emitting layer is lowered and the luminance of the display device is lower. However, the present disclosure can overcome this problem because the display panel is configured with three emission portions in which each of them provide different color light from each other.

Figure 8:
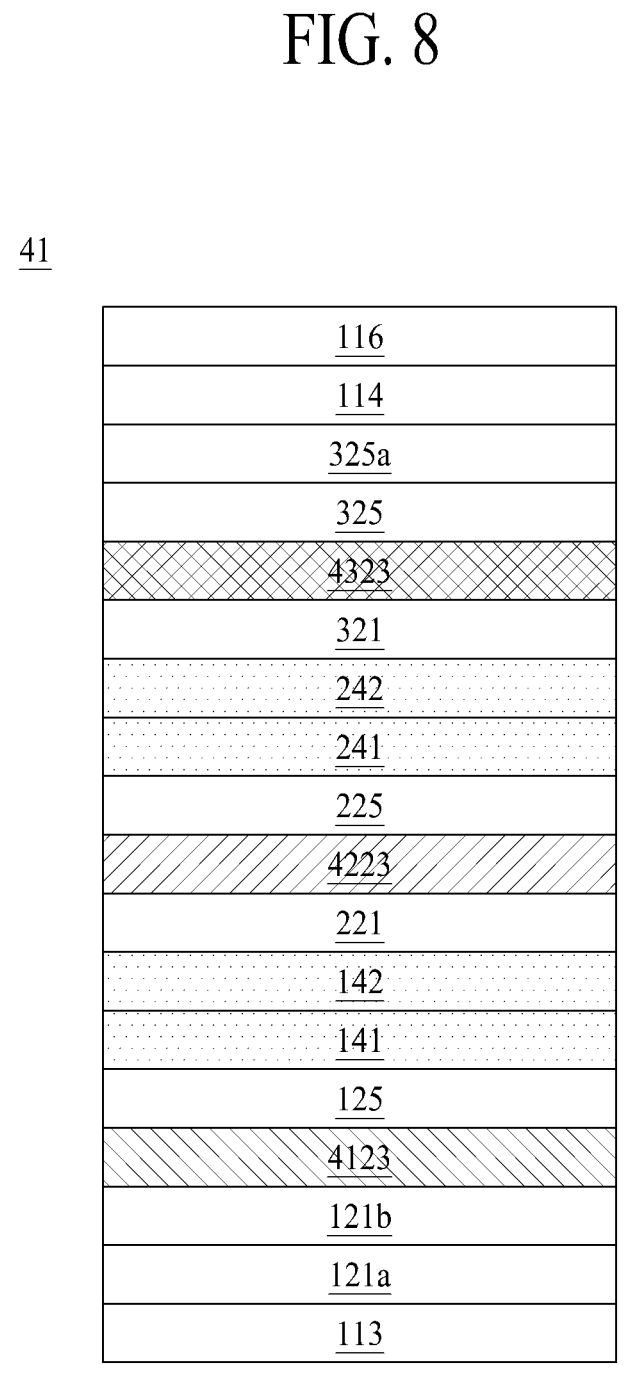

FIG. 8 illustrates a display panel according to an embodiment of the present disclosure.

Referring to FIG. 8, a display panel 41 according to an embodiment of the present disclosure may comprise a first electrode 113, light emitting layers 4123, 4223, and 4323, and a second electrode 114. In the description of each layer in the display panel, the same explanation as described in FIG. 1 may be omitted or simplified.

A first emission portion, a second emission portion and a third emission portion may be disposed between the first electrode 113 and the second electrode 114. Each of the light emitting layers 4123, 4223, and 4323 in each of the first emission portion, the second emission portion and the third emission portion, respectively may emit different color light from each other. A capping layer 116 may be further disposed on the second electrode 114.

As described in FIGS. 2A to 4C, in FIG. 8, the distance between the first electrode and the second electrode or the thickness of the layers between the first electrode and the second electrode may be 385 nm, and a blue light emitting layer, a red emitting layer, and a green light emitting layer are configured in order from the second electrode.

The first emission portion may include a first common layer 121, a first light emitting layer 4123 and a second common layer 125. Since the first common layer 121 and the second common layer 125 are the same as those described with reference to FIGS. 1 and 5, descriptions thereof may be omitted. The first light emitting layer 4123 may be a green light emitting layer. For example, the first light emitting layer 4123 may include at least one or more host and at least one or more dopant. For example, the dopant of the first light emitting layer 4123 may include a green phosphorescent dopant. For example, the dopant of the first light emitting layer 4123 may have a peak wavelength in a range of 500 nm to 590 nm, and may include at least one or more dopant among green, yellow-green, and yellow. For example, the first light emitting layer 4123 may be disposed at 340 nm from the second electrode 114. For example, the first light emitting layer 3123 may be disposed at a distance of 340 nm from a lower surface of the second electrode 114.

The second emission portions may include a third common layer 221, a second light emitting layer 4223 and a fourth common layer 225. Since the third common layer 221 and the fourth common layer 225 are the same as those described with reference to FIGS. 1 and 5, descriptions thereof may be omitted. The second light emitting layer 4223 may be a red light emitting layer. For example, the second light emitting layer 4223 may include at least one or more host and at least one or more dopant. For example, the dopant of the second light emitting layer 4223 may include a red phosphorescent dopant. For example, the peak wavelength of the red dopant may be in a range of 600 nm to 650 nm. For example, the second light emitting layer 4223 may be disposed at a distance of 230 nm from the second electrode 114. For example, the second light emitting layer 4223 may be disposed at a distance of 230 nm from a lower surface of the second electrode 114.

A first charge generation layer may be disposed between the first light emitting layer and the second light emitting layer. The first charge generation layer may include a first n-type charge generation layer 141 and a first p-type charge generation layer 142.

The third emission portion may include a fifth common layer 321, a third light emitting layer 4323, and a sixth common layer 325. Since the fifth common layer 321 and the sixth common layer 325 are the same as those described with reference to FIGS. 1 and 5, descriptions thereof may be omitted. The third light emitting layer 4323 may be a blue light emitting layer. For example, the third light emitting layer 4323 may include at least one or more host and at least one or more dopant. For example, the dopant of the third light emitting layer 4323 may include one or more of a blue fluorescent dopant, a blue phosphorescent dopant and a delayed fluorescent dopant. For example, the peak wavelength of the blue phosphorescent dopant may be in a range of 420 nm to 480 nm. For example, the third light emitting layer 4323 may be disposed at 35 nm from the second electrode 114. For example, the third light emitting layer 4323 may be disposed at 35 nm from a lower surface of the second electrode 114.

A second charge generation layer may be disposed between the second emission portion and the third emission portion. For example, the second charge generation layer may include a second n-type charge generation layer 241 and a second p-type charge generation layer 242.

According to an embodiment of the present disclosure, the first light emitting layer 4123 may be a green light emitting layer, the second light emitting layer 4223 may be a red light emitting layer, and the third light emitting layer 4323 may be a blue light emitting layer. Since each of the first, second and third emission portions is configured to have light emitting layers having a different color light, it may be overcome the problem in which the efficiency of the light emitting layer is lowered or the luminance is lowered due to the sharing of excitons between the two light emitting layers, which occurs when only two emission portions are included into the display panel. For example, in the case that the display panel is configured with only two emission portions, the second emission portion may be configured to be a junction of a red light emitting layer and a green light emitting layer, so that the red light emitting layer and the green light emitting layer may share excitons. As the result, there may be problems in which the efficiency of the red light emitting layer and the green light emitting layer is lowered and the luminance of the display device is lower. However, the present disclosure can overcome this problem because the display panel is configured with three emission portions in which each of them provide different color light from each other.

Figure 9:
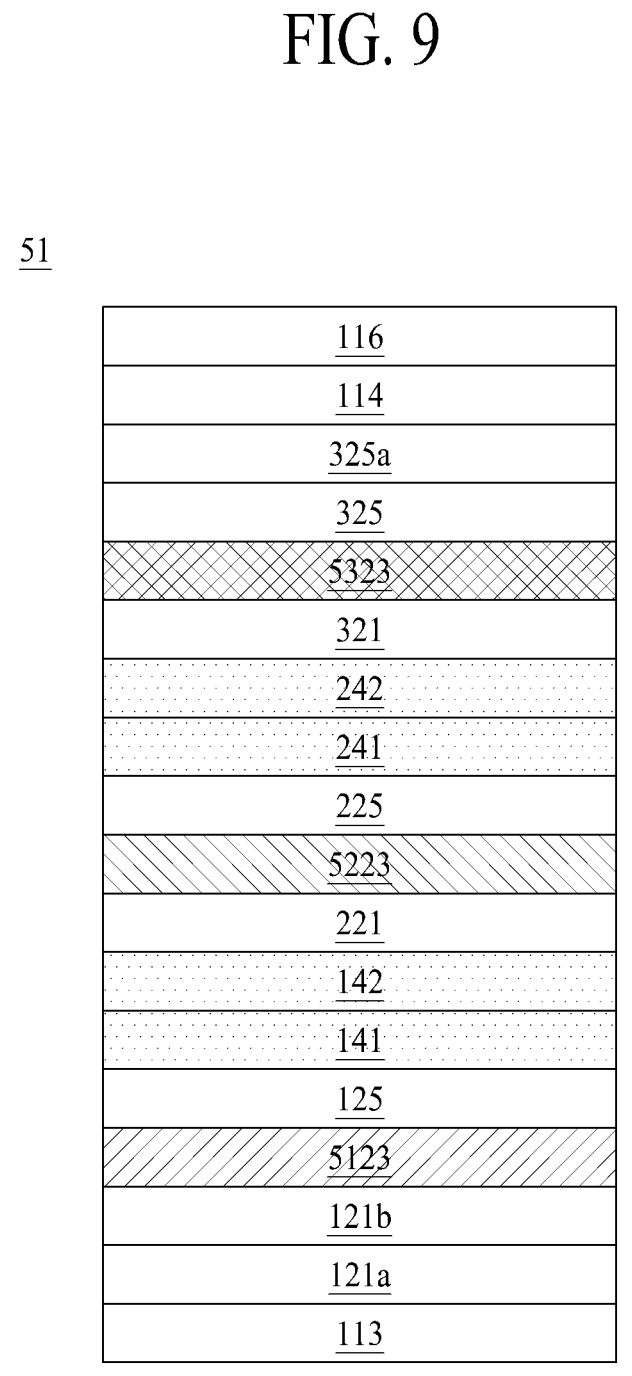

FIG. 9 illustrates a display panel according to an embodiment of the present disclosure.

Referring to FIG. 9, a display panel 51 according to an embodiment of the present disclosure may comprise a first electrode 113, light emitting layers 5123, 5223, and 5323, and a second electrode 114. In the description of each layer in the display panel, the same explanation as described in FIG. 1 may be omitted or simplified.

A first emission portion, a second emission portion and a third emission portion may be disposed between the first electrode 113 and the second electrode 114. Each of the light emitting layers 5123, 5223, and 5323 in each of the first emission portion, the second emission portion and the third emission portion, respectively may emit different color light from each other. A capping layer 116 may be further disposed on the second electrode 114.

As described in FIGS. 2A to 4C, in FIG. 9, the distance between the first electrode and the second electrode or the thickness of the layers between the first electrode and the second electrode may be 450 nm, and a green light emitting layer, a red emitting layer and a blue light emitting layer are configured in order from the second electrode.

The first emission portion may include a first common layer 121, a first light emitting layer 5123 and a second common layer 125. Since the first common layer 121 and the second common layer 125 are the same as those described with reference to FIGS. 1 and 5, descriptions thereof may be omitted. The first light emitting layer 5123 may be a blue light emitting layer. For example, the first light emitting layer 5123 may include at least one or more host and at least one or more dopant. For example, the dopant of the first light emitting layer 5123 may include one or more of a blue fluorescent dopant, a blue phosphorescent dopant and a delayed fluorescent dopant. For example, the peak wavelength of the blue phosphorescent dopant may be in a range of 420 nm to 480 nm. For example, the first light emitting layer 5123 may be disposed at 405 nm from the second electrode 114. For example, the first light emitting layer 5123 may be disposed at 405 nm from a lower surface of the second electrode 114.

The second emission portions may include a third common layer 221, a second light emitting layer 5223, and a fourth common layer 225. Since the third common layer 221 and the fourth common layer 225 are the same as those described with reference to FIGS. 1 and 5, descriptions thereof may be omitted. The second light emitting layer 5223 may be a red light emitting layer. For example, the second light emitting layer 5223 may include at least one or more host and at least one or more dopant. For example, the dopant of the second light emitting layer 5223 may include a red phosphorescent dopant. For example, the peak wavelength of the red dopant may be in a range of 600 nm to 650 nm. For example, the second light emitting layer 5223 may be disposed at a distance of 230 nm from the second electrode 114. For example, the second light emitting layer 5223 may be disposed at a distance of 230 nm from a lower surface of the second electrode 114.

A first charge generation layer may be disposed between the first light emitting layer and the second light emitting layer. The first charge generation layer may include a first n-type charge generation layer 141 and a first p-type charge generation layer 142.

The third emission portion may include a fifth common layer 321, a third light emitting layer 5323, and a sixth common layer 325. Since the fifth common layer 321 and the sixth common layer 325 are the same as those described with reference to FIGS. 1 and 5, descriptions thereof may be omitted. The third light emitting layer 5323 may be a green light emitting layer. For example, the third light emitting layer 5323 may include at least one or more host and at least one or more dopant. For example, the dopant of the third light emitting layer 5323 may include a green phosphorescent dopant. For example, the dopant of the third light emitting layer 5323 may have a peak wavelength in a range of 500 nm to 590 nm, and may include at least one or more dopant among green, yellow-green, and yellow. For example, the third light emitting layer 5323 may be disposed at 50 nm from the second electrode 114. For example, the third light emitting layer 5323 may be disposed at 50 nm from a lower surface of the second electrode 114.

A second charge generation layer may be disposed between the second emission portion and the third emission portion. For example, the second charge generation layer may include a second n-type charge generation layer 241 and a second p-type charge generation layer 242.

According to an embodiment of the present disclosure, the first light emitting layer 5123 may be a blue light emitting layer, the second light emitting layer 5223 may be a red light emitting layer, and the third light emitting layer 5323 may be a green light emitting layer. Since each of the first, second and third emission portions is configured to have light emitting layers having a different color light, it may be overcome the problem in which the efficiency of the light emitting layer is lowered or the luminance is lowered due to the sharing of excitons between the two light emitting layers, which occurs when only two emission portions are included into the display panel. For example, in the case that the display panel is configured with only two emission portions, the second emission portion may be configured to be a junction of a red light emitting layer and a green light emitting layer, so that the red light emitting layer and the green light emitting layer may share excitons. As the result, there may be problems in which the efficiency of the red light emitting layer and the green light emitting layer is lowered and the luminance of the display device is lower. However, according to an embodiment of the present disclosure can overcome this problem because the display panel is configured with three emission portions in which each of them provide different color light from each other.

Figure 10:
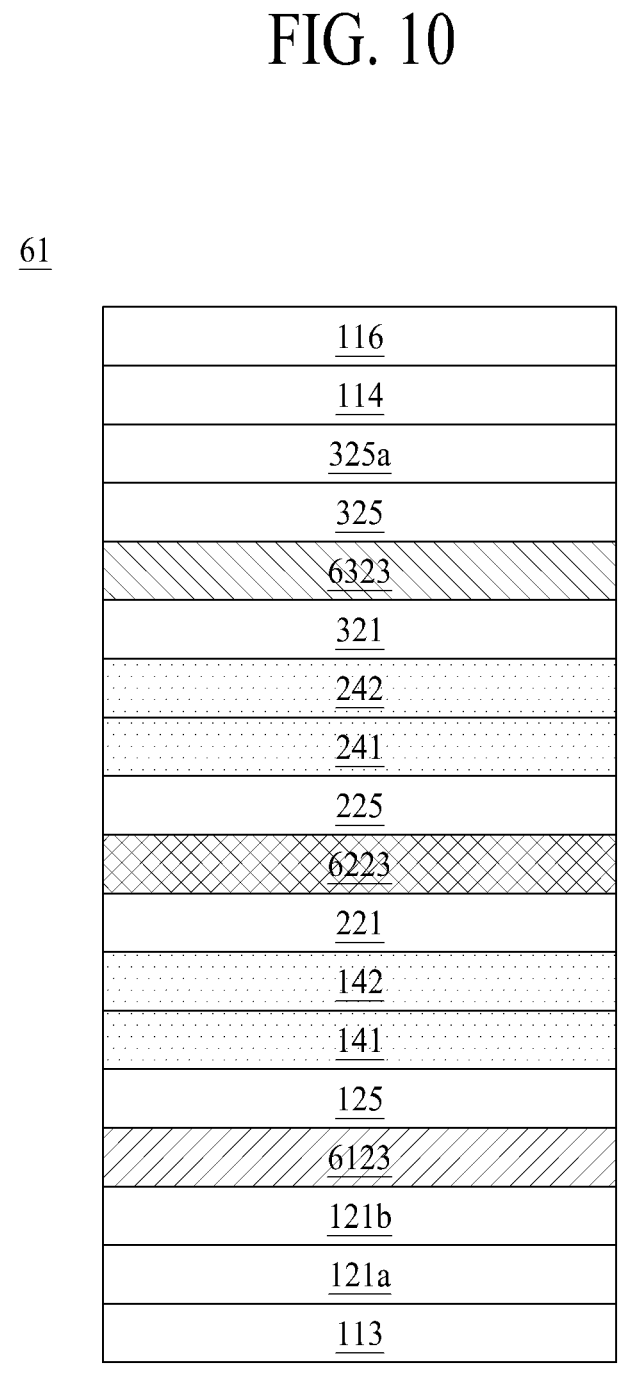

FIG. 10 illustrates a display panel according to an embodiment of the present disclosure.

Referring to FIG. 10, a display panel 61 according to an embodiment of the present disclosure may comprise a first electrode 113, light emitting layers 6123, 6223, and 6323, and a second electrode 114. In the description of each layer in the display panel, the same explanation as described in FIG. 1 may be omitted or simplified.

A first emission portion, a second emission portion and a third emission portion may be disposed between the first electrode 113 and the second electrode 114. Each of the light emitting layers 6123, 6223, and 6323 in each of the first emission portion, the second emission portion and the third emission portion, respectively may emit different color light from each other. A capping layer 116 may be further disposed on the second electrode 114.

As described in FIGS. 2A to 4C, in FIG. 10, the distance between the first electrode and the second electrode or the thickness of the layers between the first electrode and the second electrode may be 450 nm, and a blue light emitting layer, a green emitting layer and a red light emitting layer are configured in order from the second electrode.

The first emission portion may include a first common layer 121, a first light emitting layer 6123 and a second common layer 125. Since the first common layer 121 and the second common layer 125 are the same as those described with reference to FIGS. 1 and 5, descriptions thereof may be omitted. The first light emitting layer 6123 may be a red light emitting layer. For example, the first light emitting layer 6123 may include at least one or more host and at least one or more dopant. For example, the dopant of the first light emitting layer 6123 may include a red phosphorescent dopant. For example, the peak wavelength of the red dopant may be in a range of 600 nm to 650 nm. For example, the first light emitting layer 6123 may be disposed at a distance of 405 nm from the second electrode 114. For example, the first light emitting layer 6123 may be disposed at a distance of 405 nm from a lower surface of the second electrode 114.

The second emission portions may include a third common layer 221, a second light emitting layer 6223 and a fourth common layer 225. Since the third common layer 221 and the fourth common layer 225 are the same as those described with reference to FIGS. 1 and 5, descriptions thereof may be omitted. The second light emitting layer 6223 may be a green light emitting layer. For example, the second light emitting layer 6223 may include at least one or more host and at least one or more dopant. For example, the dopant of the second light emitting layer 6223 may include a green phosphorescent dopant. For example, the dopant of the second light emitting layer 6223 may have a peak wavelength in a range of 500 nm to 590 nm, and may include at least one or more dopant among green, yellow-green, and yellow. For example, the second light emitting layer 6223 may be disposed at 195 nm from the second electrode 114. For example, the second light emitting layer 6223 may be disposed at 195 nm from a lower surface of the second electrode 114.

A first charge generation layer may be disposed between the first light emitting layer and the second light emitting layer. The first charge generation layer may include a first n-type charge generation layer 141 and a first p-type charge generation layer 142.

The third emission portion may include a fifth common layer 321, a third light emitting layer 6323, and a sixth common layer 325. Since the fifth common layer 321 and the sixth common layer 325 are the same as those described with reference to FIGS. 1 and 5, descriptions thereof may be omitted. The third light emitting layer 6323 may be a blue light emitting layer. For example, the third light emitting layer 6323 may include at least one or more host and at least one or more dopant. For example, the dopant of the third light emitting layer 6323 may include one or more of a blue fluorescent dopant, a blue phosphorescent dopant and a delayed fluorescent dopant. For example, the peak wavelength of the blue phosphorescent dopant may be in a range of 420 nm to 480 nm. For example, the third light emitting layer 6323 may be disposed at 35 nm from the second electrode 114. For example, the third light emitting layer 6323 may be disposed at 35 nm from a lower surface of the second electrode 114.

A second charge generation layer may be disposed between the second emission portion and the third emission portion. For example, the second charge generation layer may include a second n-type charge generation layer 241 and a second p-type charge generation layer 242.

According to an embodiment of the present disclosure, the first light emitting layer 6123 may be a red light emitting layer, the second light emitting layer 6223 may be a green light emitting layer, and the third light emitting layer 6323 may be a blue light emitting layer. Since each of the first, second and third emission portions is configured to have light emitting layers having a different color light, it may be overcome the problem in which the efficiency of the light emitting layer is lowered or the luminance is lowered due to the sharing of excitons between the two light emitting layers, which occurs when only two emission portions are included into the display panel. For example, in the case that the display panel is configured with only two emission portions, the second emission portion may be configured to be a junction of a red light emitting layer and a green light emitting layer, so that the red light emitting layer and the green light emitting layer may share excitons. As the result, there may be problems in which the efficiency of the red light emitting layer and the green light emitting layer is lowered and the luminance of the display device is lower. However, the present disclosure can overcome this problem because the display panel is configured with three emission portions in which each of them provide different color light from each other.

Figure 11:
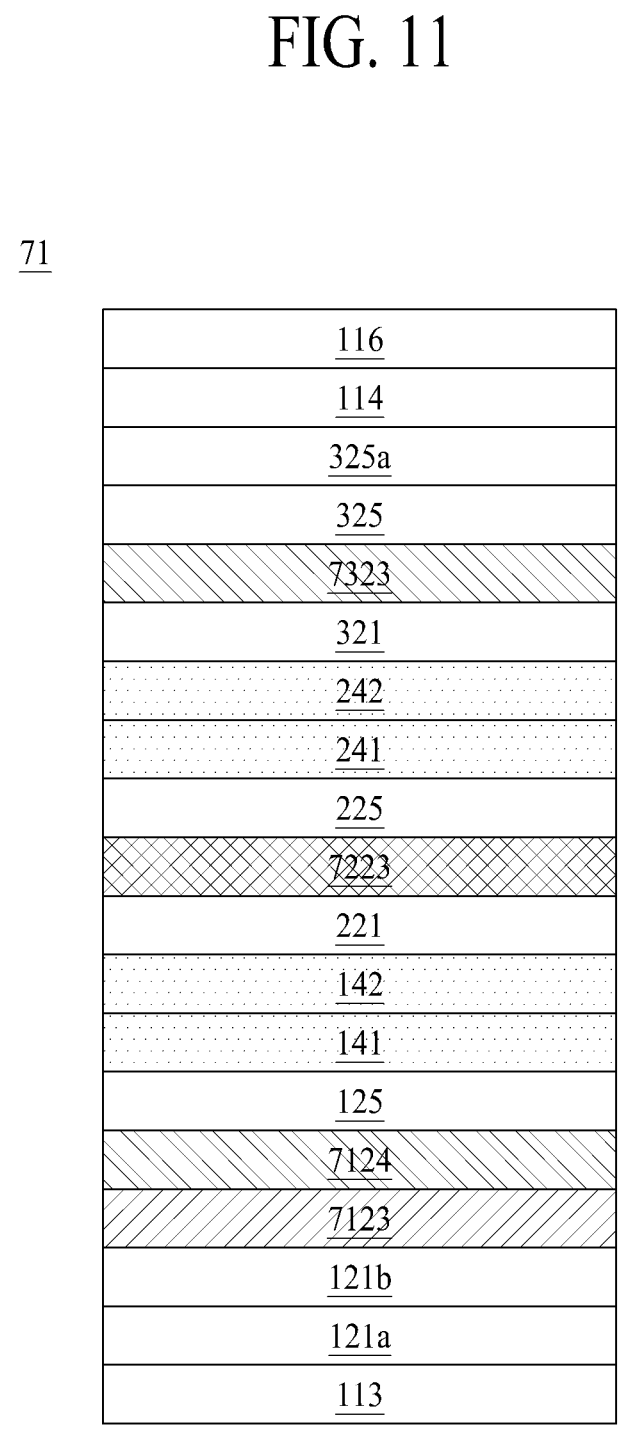

FIG. 11 illustrates a display panel according to an embodiment of the present disclosure.

Referring to FIG. 11, a display panel 71 according to an embodiment of the present disclosure may comprise a first electrode 113, light emitting layers 7123, 7223, and 7323, and a second electrode 114. In the description of each layer in the display panel, the same explanation as described in FIG. 1 may be omitted or simplified.

A first emission portion, a second emission portion and a third emission portion may be disposed between the first electrode 113 and the second electrode 114. Each of the light emitting layers 7123, 7223, and 7323 in each of the first emission portion, the second emission portion and the third emission portion, respectively may emit different color light from each other. A capping layer 116 may be further disposed on the second electrode 114. For example, the distance between the first electrode and the second electrode or the thickness of the layers between the first electrode and the second electrode may be 310 nm.

The first emission portion may include a first common layer 121, a first light emitting layer 7123, and a second common layer 125. Since the first common layer 121 and the second common layer 125 are the same as those described with reference to FIGS. 1 and 5, descriptions thereof may be omitted. The first light emitting layer 7123 may be a red light emitting layer. For example, the first light emitting layer 7123 may include at least one or more host and at least one or more dopant. For example, the dopant of the first light emitting layer 7123 may include a red phosphorescent dopant. For example, the peak wavelength of the red dopant may be in a range of 600 nm to 650 nm. For example, the first light emitting layer 7123 may be disposed at a distance of 230 nm from the second electrode 114. For example, the first light emitting layer 7123 may be disposed at a distance of 230 nm from a lower surface of the second electrode 114.

A fourth light emitting layer 7124 may be further disposed on the first light emitting layer 7123. The fourth light emitting layer 7124 may be a green light emitting layer. For example, the fourth light emitting layer 7124 may include at least one or more host and at least one or more dopant. For example, the dopant of the fourth light emitting layer 7124 may include a green phosphorescent dopant. For example, the dopant of the fourth light emitting layer 7124 may have a peak wavelength in a range of 500 nm to 590 nm, and may include at least one or more dopant among green, yellow-green, and yellow. Since the fourth light emitting layer 7124 is further included, the lifespan of the green light emitting layer may be further improved. In addition, since the fourth light emitting layer 7124 is further included, the efficiency of the green light emitting layer may be further improved together with the green light emitting layer of the third light emitting layer 7323.

The second emission portions may include a third common layer 221, a second light emitting layer 7223, and a fourth common layer 225. Since the third common layer 221 and the fourth common layer 225 are the same as those described with reference to FIGS. 1 and 5, descriptions thereof may be omitted. The second light emitting layer 7223 may be a blue light emitting layer. For example, the second light emitting layer 7223 may include at least one or more host and at least one or more dopant. For example, the dopant of the second light emitting layer 7223 may include one or more of a blue fluorescent dopant, a blue phosphorescent dopant and a delayed fluorescent dopant. For example, the peak wavelength of the blue phosphorescent dopant may be in a range of 420 nm to 480 nm. For example, the second light emitting layer 7223 may be disposed at 155 nm from the second electrode 114. For example, the second light emitting layer 7223 may be disposed at 155 nm from a lower surface of the second electrode 114.

A first charge generation layer may be disposed between the first light emitting layer and the second light emitting layer. The first charge generation layer may include a first n-type charge generation layer 141 and a first p-type charge generation layer 142.

The third emission portion may include a fifth common layer 321, a third light emitting layer 7323, and a sixth common layer 325. Since the fifth common layer 321 and the sixth common layer 325 are the same as those described with reference to FIGS. 1 and 5, descriptions thereof may be omitted. The third light emitting layer 7323 may be a green light emitting layer. For example, the third light emitting layer 7323 may include at least one or more host and at least one or more dopant. For example, the dopant of the third light emitting layer 7323 may include a green phosphorescent dopant. For example, the dopant of the third light emitting layer 7323 may have a peak wavelength in a range of 500 nm to 590 nm, and may include at least one or more dopant among green, yellow-green, and yellow. For example, the third light emitting layer 7323 may be disposed at 50 nm from the second electrode 114. For example, the third light emitting layer 7323 may be disposed at 50 nm from a lower surface of the second electrode 114.

A second charge generation layer may be disposed between the second emission portion and the third emission portion. For example, the second charge generation layer may include a second n-type charge generation layer 241 and a second p-type charge generation layer 242.

According to an embodiment of the present disclosure, the first light emitting layer 7123 may be a red light emitting layer, the second light emitting layer 7223 may be a blue light emitting layer, and the third light emitting layer 7323 may be a green light emitting layer. Since each of the first, second and third emission portions is configured to have light emitting layers having a different color light, it may be overcome the problem in which the efficiency of the light emitting layer is lowered or the luminance is lowered due to the sharing of excitons between the two light emitting layers, which occurs when only two emission portions are included into the display panel. For example, in the case that the display panel is configured with only two emission portions, the second emission portion may be configured to be a junction of a red light emitting layer and a green light emitting layer, so that the red light emitting layer and the green light emitting layer may share excitons. As the result, there may be problems in which the efficiency of the red light emitting layer and the green light emitting layer is lowered and the luminance of the display device is lower. However, the present disclosure can overcome this problem because the display panel is configured with three emission portions in which each of them provide different color light from each other. In addition, a green light emitting layer, the fourth light emitting layer 7124, is further disposed in the first emission portion, so that the lifespan of the green light emitting layer can be further improved. Since the fourth light emitting layer 7124 is configured together with the green light emitting layer of the third light emitting layer 7323, the efficiency of the green light emitting layer may be further improved.

Efficiency, luminance, and DCI coverage for the display apparatus including the display panel shown in FIGS. 5 to 11 will be described with reference to Tables 1, 2, 3 and 4.

In Table 1, as described with reference to FIGS. 2A to 4C, the harmonics indicates the sequence number of the light emitting nodes in the order closest to the second electrode. For example, in the embodiment 1, the blue light emitting layer may be the third light emitting node from the second electrode, the green light emitting layer may be the second light emitting node from the second electrode, and the red light emitting layer may be the first light emitting node from the second electrode.

In embodiments 1 and 2, the distance between the first electrode and the second electrode or the thickness of the layers between the first electrode and the second electrode was configured to be 310 nm. In embodiment 2, the blue light emitting layer may be a second light emitting node from the second electrode, the green light emitting layer may be a first light emitting node from the second electrode, and the red light emitting layer may be a second light emitting node from the second electrode. For example, in embodiment 1, a red light emitting layer, a green light emitting layer, and a blue light emitting layer may be disposed in order from the second electrode. For example, in embodiment 2, a green light emitting layer, a blue light emitting layer, and a red light emitting layer may be disposed in order from the second electrode.

Referring to the efficiency, as for embodiment 1, the green light emitting layer is disposed at the node with the highest efficiency, the red light emitting layer and the blue emitting layer are disposed at the node with the secondly high efficiency, so that the efficiency may be improved compared to that of embodiment 2. As for embodiment 2, the blue light emitting layer and the red light emitting layer are disposed at the node with the highest efficiency, and the green light emitting layer are disposed at the node with the secondly high efficiency, so that the efficiency of the green light emitting layer may be lowered and then the efficiency is lowered, as comparing to that of embodiment 1. For example, it is found that the efficiency of embodiment 1 is 44.2 cd/A and that of embodiment 2 is 35.6 cd/A.

TABLE 1

| | Item | | | | | | | | |
|---|---|---|---|---|---|---|---|---|---|
| | Embodiment 1 | | | Embodiment 2 | | | Embodiment 3 | | |
| Harmonics | B (3rd node) | G (2nd node) | R (1st node) | B (2nd node) | G (1st node) | R (2nd node) | B (2nd node) | G (3rd node) | R (1st node) |
| Efficiency (cd/A) | 44.2 | | | 35.6 | | | 34.7 | | |
| Luminance (nit) | 7210 | | | 7930 | | | 6440 | | |
| DCI coverage (%) | 99.7 | | | 99.7 | | | 99.0 | | |

| | Item | | | | | | | | |
|---|---|---|---|---|---|---|---|---|---|
| | Embodiment 4 | | | Embodiment 5 | | | Embodiment 6 | | |
| Harmonics | B (1st node) | G (3rd node) | R (2nd node) | B (4th node) | G (1st node) | R (2nd node) | B (1st node) | G (2nd node) | R (3rd node) |
| Efficiency (cd/A) | 37.7 | | | 32.5 | | | 35.4 | | |
| Luminance (nit) | 5590 | | | 5940 | | | 5580 | | |
| DCI coverage (%) | 99.1 | | | 97.3 | | | 97.0 | | |

In Table 1, embodiments 1 to 6 are for the display apparatuses including display panels of FIGS. 5 to 10, and the Purcell effect is applied, respectively.

Referring to the luminance, it is found that embodiment 2 is improved over embodiment 1. This may be caused when implementing white light having high efficiency, a difference in luminance may occur due to a difference in blue efficiency. For example, it is found that the luminance of embodiment 1 is 7210 nit, and the luminance of embodiment 2 is 7930 nit.

In embodiments 3 and 4, the distance between the first electrode and the second electrode or the thickness of the layers between the first electrode and the second electrode was configured to be 385 nm. In embodiment 3, the blue light emitting layer may be a second light emitting node from the second electrode, the green light emitting layer may be a third light emitting node from the second electrode, and the red light emitting layer may be a first light emitting node from the second electrode. In embodiment 4, the blue light emitting layer may be a first light emitting node from the second electrode, the green light emitting layer may be a third light emitting node from the second electrode, and the red light emitting layer may be a second light emitting node from the second electrode. For example, in embodiment 3, a red light emitting layer, a blue light emitting layer, and a green light emitting layer may be disposed in order from the second electrode. For example, in embodiment 4, a blue light emitting layer, a red light emitting layer, and a green light emitting layer may be disposed in order from the second electrode.

Referring to the efficiency, as for embodiment 3, the blue light emitting layer is disposed at the node with the highest efficiency, and the red emitting layer and the green emitting layer are disposed at the node with the secondly high efficiency. As for embodiment 4, the red light emitting layer is disposed at the node with the highest efficiency, the green light emitting layer is disposed at the node with the secondly high efficiency, and the blue light emitting layer is disposed at the node with the thirdly high efficiency. It is found that the efficiency may be different depending on the positions of the blue light emitting layer and the red light emitting layer disposed at the node with higher efficiency. It is estimated that as the light emitting layer is closed to the second electrode, the efficiency of the light emitting layer may be lowered by the Purcell effect. For example, embodiment 3 may have a structure in which the blue efficiency is further improved since the red light emitting layer is closer to the second electrode than the blue light emitting layer. Accordingly, in embodiment 3, the efficiency of the blue emitting layer which is further from (or middle position between the first electrode and the second electrode) the second electrode may be further improved rather than the efficiency of the red emitting layer which is closer to the second electrode. Embodiment 4 may have a structure in which the blue light emitting layer is closer to the second electrode than the red light emitting layer, so the efficiency of the blue light emitting layer may be lowered. In the embodiment 4, the efficiency of the red light emitting layer which is further from (or middle position between the first electrode and the second electrode) the second electrode may be further improved rather than the efficiency of the blue light emitting layer which is closer to the second electrode. Comparing embodiments 3 and 4, when the red light emitting layer is disposed at the higher efficiency (i.e., more far from the second electrode) than the blue light emitting layer, the total efficiency of the light emitting layer may be enhanced. For example, it is found that the efficiency of embodiment 3 is 34.7 cd/A and that of embodiment 4 is 37.7 cd/A.

Referring to luminance, it is found that embodiment 3 is improved over embodiment 4. For example, it is found that the luminance of embodiment 3 is further improved as compared to embodiment 4. This may be caused when implementing white light having high efficiency, a difference in luminance may occur due to a difference in blue efficiency. For example, it is found that the luminance of embodiment 3 is 6440 nit, and the luminance of embodiment 4 is 5590 nit.

In embodiments 5 and 6, the distance between the first electrode and the second electrode or the thickness of the layers between the first electrode and the second electrode was configured to be 450 nm. In embodiment 5, the blue light emitting layer may be a fourth light emitting node from the second electrode, the green light emitting layer may be a first light emitting node from the second electrode, and the red light emitting layer may be a second light emitting node from the second electrode. In embodiment 6, the blue light emitting layer may be a first light emitting node from the second electrode, the green light emitting layer may be a second light emitting node from the second electrode, and the red light emitting layer may be a third light emitting node from the second electrode. For example, in embodiment 5, a green light emitting layer, a red light emitting layer, and a blue light emitting layer may be disposed in order from the second electrode. For example, in embodiment 6, a blue light emitting layer, a green light emitting layer, and a red light emitting layer may be disposed in order from the second electrode.

Referring to the efficiency, as for embodiment 5, the red light emitting layer is disposed at the node with the highest efficiency, the green emitting layer and the blue light emitting layer are disposed at the node with the thirdly high efficiency. As for embodiment 6, the green light emitting layer is disposed at the node with the highest efficiency, the red light emitting layer is disposed at the node with the secondly high efficiency, and the blue light emitting layer is disposed at the node with the fourthly high efficiency. It is found that the efficiency may be different depending on the positions of the green light emitting layer and the red light emitting layer disposed at the node with higher efficiency. For example, embodiments 5 and 6 may have a structure in which the red efficiency is further improved than the green light emitting layer because green light emitting layer is more closed to the second electrode than the red light emitting layer. In the embodiment 5 compared to embodiment 6, the green light emitting layer and the red light emitting layer are closed to the second electrode than the blue light emitting layer, so the efficiency of the green light emitting layer may be further enhanced. In the embodiment 6 compared to embodiment 5, as the blue light emitting layer is closed to the second electrode than the green light emitting layer and the red light emitting layer, so the efficiency of the red light emitting layer may be further enhanced than the embodiment 5. Comparing embodiments 5 and 6, when the red light emitting layer is disposed at the higher efficiency location (e.g., further from the second electrode), the total efficiency of the light emitting layer may be enhanced. For example, it is found that the efficiency of embodiment 5 is 32.5 cd/A and that of embodiment 6 is 35.4 cd/A.

Referring to the efficiency, as the distance between the first electrode and the second electrode or the thickness of the layers between the first electrode and the second electrode increases, the efficiency may decrease for blue and green, and the efficiency for red may increase and then decrease. For example, in embodiment 1 and embodiment 5 having the blue limiting layer in the first emission portion, the efficiency of the embodiment 1 may be further enhanced than that of the embodiment 5.

Referring to luminance, it is found that embodiment 5 is improved over embodiment 6. This may be caused when implementing white light having high efficiency, a difference in luminance may occur due to a difference in blue efficiency. For example, it is found that the luminance of embodiment 5 is 5940 nit, and the luminance of embodiment 6 is 5580 nit.

The display apparatus is beneficial to satisfy the DCI color gamut, which is widened to about 130% compared to the conventional sRGB, to ensure a clearer and more realistic expression of video images. DCI may be an RGB color space, and may be a color gamut representing a wider color space than sRGB. sRGB may be a standard color space created by HP (Hewlett Packard) and Microsoft in 1996 as a lower standard among color spaces presented as the standard RGB. Color gamut may be referred to as color space, color region, color gamut space, or color gamut range. In addition, the coverage may be referred to as a range in which the DCI and the color space of the display apparatus overlap. The DCI coverage may be DCI color space satisfaction.

Referring to the DCI coverage, it is found that embodiments 1 and 2 have the same level. The DCI coverage may decrease as the distance between the first electrode and the second electrode or the thickness of the layers between the first electrode and the second electrode increases. For example, it is found that the DCI coverages of embodiments 1 and 2 are 99.7%. It is found that the DCI coverages of embodiments 3 and 4 are almost same. For example, the DCI coverage of embodiment 3 is 99.0%, and the DCI coverage of embodiment 4 is 99.1%. It is found that the DCI coverages of embodiments 5 and 6 are almost same. For example, it is found that the DCI coverage of embodiment 5 is 97.3%, and the DCI coverage of embodiment 6 is 97.0%.

According to embodiments of the present disclosure, the efficiency may vary depending on the distance between the first electrode and the second electrode or the thickness of the layers between the first electrode and the second electrode, and the position of the light emitting layer. However, efficiency may be improved, as the distance between the first electrode and the second electrode or the thickness of the layers between the first electrode and the second electrode decreases. For example, it is found that embodiment 1 has improved efficiency compared to embodiments 2 to 6. In the case of the display panel including only two emission portions, the efficiency is 22 cd/A. Compared with that, it is found that the efficiency the display apparatus according to embodiments of the present disclosure may be more improved.

According to embodiments of the present disclosure, it is found that the luminance is improved in embodiment 2 compared to other embodiments. In the case of the display panel including only two emission portions, the luminance is 5000 nit. Compared with that, it is found that the luminance of the display apparatus according to embodiments of the present disclosure may have more improved. For example, it is found that, in the case of three emission portions, even though the distance between the first electrode and the second electrode or the thickness of the layers between the first and second electrodes increases, the luminance is improved more than the case in which the display apparatus includes only two emission portions. For example, it is found that, in the case of three emission portions, even though the distance between the first electrode and the second electrode or the thickness of the layers between the first and second electrodes is any one in range from 310 nm to 450 nm, the luminance is improved more than the case in which the display apparatus includes only two emission portions.

According to embodiments of the present disclosure, when the efficiency of the blue light emitting layer is further improved, luminance may be further improved. For example, when the blue light emitting layer is formed of a phosphorescent dopant or a delayed fluorescent dopant, a display apparatus may have a luminance in range between 9,000 nit to 10,000 nit.

According to embodiments of the present disclosure, it is found that the luminance and DCI coverage are improved as the distance between the first electrode and the second electrode or the thickness of the layers between the first electrode and the second electrode decreases. For example, it is found that, in the case of three emission portions, even though the distance between the first electrode and the second electrode or the thickness of the layers between the first and second electrodes increases, the DCI coverage is improved more than the case in which the display apparatus includes only two emission portions. For example, the DCI coverage of a display panel including only two emission portions is 99.0%. It is found that, in embodiments 1 to 4, the DCI coverages are further improved than the case of having two emission portions only.

Table 2 shows the TiN factor, efficiency, and CIE color coordinate.

TABLE 2

| | | Item | | | | | | | | |
|---|---|---|---|---|---|---|---|---|---|---|
| | | Embodiment 1 | | | Embodiment 2 | | | Embodiment 3 | | |
| Harmonics | | B ($3^{rd}$ node) | G ($2^{nd}$ node) | R ($1^{st}$ node) | B ($2^{nd}$ node) | G ($1^{st}$ node) | R ($2^{nd}$ node) | B ($2^{nd}$ node) | G ($3^{rd}$ node) | R ($1^{st}$ node) |
| TiN factor | | 0.88 | 0.76 | 1 | 0.88 | 0.76 | 1 | 0.74 | 0.99 | 0.60 |
| Efficiency (cd/A) | | 2.96 | 126 | 33.8 | 4.33 | 86.7 | 37.2 | 3.92 | 82.1 | 32.8 |
| CIE | x | 0.149 | 0.242 | 0.680 | 0.149 | 0.241 | 0.681 | 0.150 | 0.231 | 0.678 |
| | y | 0.038 | 0.713 | 0.317 | 0.038 | 0.714 | 0.316 | 0.037 | 0.715 | 0.315 |

TABLE 2-continued

| Harmonics | Item | | | | | | | | |
|---|---|---|---|---|---|---|---|---|---|
| | Embodiment 4 | | | Embodiment 5 | | | Embodiment 6 | | |
| | B (1st node) | G (3rd node) | R (2nd node) | B (4th node) | G (1st node) | R (2nd node) | B (1st node) | G (2nd node) | R (3rd node) |
| TiN factor | 0.74 | 0.99 | 0.60 | 0.88 | 0.76 | 1 | 0.88 | 0.76 | 1 |
| Efficiency (cd/A) | 2.91 | 83.3 | 46.9 | 3.07 | 65.0 | 45.4 | 2.78 | 97.6 | 29.4 |
| CIE x | 0.147 | 0.230 | 0.677 | 0.150 | 0.172 | 0.681 | 0.147 | 0.170 | 0.681 |
| y | 0.043 | 0.714 | 0.316 | 0.046 | 0.704 | 0.318 | 0.050 | 0.701 | 0.318 |

In Table 2, embodiments 1 to 6 are configured with a display apparatus including the display panel of FIGS. 5 to 10, and configured with the color filter layers, and then Purcell effect is applied. Further, TiN is applied as the first electrode. For the case that TiN is applied as the first electrode, luminance may be further improved as compared with the case in which a transparent electrode is applied to the first electrode. For example, since TiN may absorb the visible light range compared to ITO, the luminance may vary according to distance between TiN, which is the first electrode, and the first layer. For example, the first layer may further absorb the visible light range as the thickness of the first layer thickens.

For example, in Table 2, TiN factor may be calculated by equation of (Panel Efficiency when TiN is applied)/(Panel Efficiency when ITO is applied). The TiN factor may be a value calculated by simulation. For example, as the TiN factor is closer to 1, the light absorption may be smaller, so that the efficiency and luminance may increase. For example, in embodiments 1 and 2, it is found that the TiN factor of the blue light emitting layer is 0.88, the TiN factor of the green light emitting layer is 0.76, and the TiN factor of the red light emitting layer is 1. For example, in embodiments 1 and 2, efficiencies of the blue and the green may be improved.

Efficiency in Table 2 may be the panel efficiency. For example, the panel efficiency may be calculated by applying the TiN factor to the RGB efficiency when the ITO electrode is applied for the first electrode.

Referring to efficiency, it is found that the efficiency of the blue of embodiment 1 is 2.96 cd/A, the efficiency of the green is 126 cd/A, and the efficiency of the red is 33.8 cd/A. It is found that the efficiency of the blue of embodiment 2 is 4.33 cd/A, the efficiency of the green is 86.7 cd/A, and the efficiency of the red is 37.2 cd/A. It is found that the efficiency of the blue of embodiment 2 is greater than the efficiency of the blue of embodiment 1. It is found that the efficiency of the green of embodiment 1 is greater than the efficiency of the green of embodiment 2. Further, it is found that the efficiency of the red of embodiment 2 is greater than the efficiency of the red of embodiment 1. For example, it is found that embodiment 2 has more improved efficiencies of the blue and the green compared to embodiment 1.

Referring to CIE color coordinate (hereinafter, referring to CIE), it is found that, in embodiment 1, the CIE(x,y) of the blue is (0.149, 0.038), the CIE(x,y) of the green is (0.242, 0.713), and the CIE(x,y) of the red is (0.680, 0.317). It is found that, in embodiment 2, the CIE(x,y) of the blue is (0.149, 0.038), the CIE(x,y) of the green is (0.241, 0.714), and the CIE(x,y) of the red is (0.681, 0.316). For example, it is found that the CIEs of the blue, the green, and the red in embodiments 1 and 2 are similar.

Referring to TiN factor, in embodiments 3 and 4, it is found that the TiN factor of the blue light emitting layer is 0.74, the TiN factor of the green light emitting layer is 0.99, and the TiN factor of the red light emitting layer is 0.60. For example, in embodiments 3 and 4, the efficiency of the green may be improved.

Referring to efficiency, it is found that the efficiency of the blue of embodiment 3 is 3.92 cd/A, the efficiency of the green is 82.1 cd/A, and the efficiency of the red is 32.8 cd/A. It is found that the efficiency of the blue of embodiment 4 is 2.91 cd/A, the efficiency of the green is 83.3 cd/A, and the efficiency of the red is 46.9 cd/A. It is found that the efficiency of the blue of embodiment 3 is greater than that of embodiment 4. It is found that the efficiency of the green of embodiment 4 is greater than the efficiency of the green of embodiment 3. It is found that the efficiency of the red of embodiment 4 is greater than the efficiency of the red of embodiment 3. For example, it is found that embodiment 4 has more improved the efficiencies of the green and the red compared to embodiment 3.

Referring to CIE, it is found that, in embodiment 3, the CIE(x,y) of the blue is (0.150, 0.037), the CIE(x,y) of the green is (0.231, 0.715), and the CIE(x,y) of the red is (0.678, 0.315). It is found that, in embodiment 4, the CIE(x,y) of the blue is (0.147, 0.043), the CIE(x,y) of the green is (0.230, 0.714), and the CIE(x,y) of the red is (0.677, 0.316). For example, it is found that the CIEs of the green and the red in embodiments 3 and 4 are similar, and that the CIE of the blue of embodiment 3 is wider than the CIE of the blue of embodiment 4.

Referring to TiN factor, in embodiments 5 and 6, it is found that the TiN factor of the blue light emitting layer is 0.88, the TiN factor of the green light emitting layer is 0.76, and the TiN factor of the red light emitting layer is 1. For example, in embodiments 5 and 6, the efficiencies of the red may be improved.

Referring to efficiency, it is found that the efficiency of the blue of embodiment 5 is 3.07 cd/A, the efficiency of the green is 65.0 cd/A, and the red efficiency is 45.4 cd/A. It is found that the efficiency of the blue of embodiment 6 is 2.78 cd/A, the efficiency of the green is 97.6 cd/A, and the efficiency of the red is 29.4 cd/A. It is found that the efficiency of the blue of embodiment 5 is greater than the efficiency of the blue of embodiment 6. It is found that the efficiency of the green of embodiment 6 is greater than the efficiency of the green of embodiment 5. It is found that the efficiency of the red of embodiment 5 is greater than the efficiency of the red of embodiment 6. For example, it is found that embodiment 6 has more improved the efficiency of the green compared to embodiment 5. For example, it is found that embodiment 5 has more improved the efficiencies of the blue and the red compared to embodiment 6.

Referring to CIE, it is found that, in embodiment 5, the CIE(x,y) of the blue is (0.150, 0.046), the CIE(x,y) of the green is (0.172, 0.704), and the CIE(x,y) of the red is (0.681, 0.318). It is found that, in embodiment 6, the CIE(x,y) of the blue is (0.147, 0.050), the CIE(x,y) of the green is (0.170, 0.701), and the CIE(x,y) of the red is (0.681, 0.318). For example, it is found that the CIEs of the green and the red in embodiments 5 and 6 are similar, and that the CIE of the blue embodiment 5 is wider than the CIE of the blue of embodiment 6.

According to embodiments of the present disclosure, when TiN is applied as the first electrode, the efficiency may be further improved, so that a display apparatus having improved efficiency and luminance may be provided.

Table 3 shows the measured value of the efficiency when the distance between the first electrode and the second electrode or the thickness of the layers between the first electrode and the second electrode in embodiments 1 to 6 is configured to be same as 310 nm. Efficiency in Table 3 may be the panel efficiency. For example, the panel efficiency may be calculated by applying the TiN factor to the RGB efficiency for the case in which the ITO electrode is applied to the first electrode.

Table 3 shows the measured values of efficiencies in embodiments 1 to 6 when the distance between the first electrode and the second electrode or the thickness of the layers between the first electrode and the second electrode is thin.

red light emitting layer is 1, the TiN factor of the blue light emitting layer is 0.88, and the TiN factor of the green light emitting layer is 0.76.

Since the description for the harmonics is the same as that described in Tables 1 and 2, the description will be omitted or briefly described herein.

The embodiment 1 may include a red light emitting layer, a green light emitting layer, and a blue light emitting layer from the second electrode as the same as the explanation for Table 1. For example, embodiment 1 may be configured with a red light emitting layer, a green light emitting layer, and a blue light emitting layer stacked from the second electrode. For example, the red light emitting layer may be disposed at 55 nm, the green light emitting layer may be disposed at 195 nm, and the blue light emitting layer may be disposed at 275 nm from the second electrode. In embodiment 2, since the distance between the first electrode and the second electrode or the thickness of the layers between the first electrode and the second electrode is 310 nm, the green light emitting layer, the blue light emitting layer, and the red light emitting layer may be formed from the second electrode. For example, in embodiment 2, the green light emitting layer may be disposed at 50 nm, the blue light emitting layer may be disposed at 155 nm, and the red light emitting layer may be disposed at 230 nm from the second electrode.

Referring to the efficiency, it is found that, in the embodiment 1, the efficiency of the blue is 4.20 cd/A, the efficiency of the green is 89.0 cd/A, and the efficiency of the red is 33.8 cd/A. It is found that, in the embodiment 2, the efficiency of the blue is 4.33 cd/A, the efficiency of the green is 86.7 cd/A, and the efficiency of the red is 37.2 cd/A. It is found that the efficiency of the blue of embodiment 2 is greater than the efficiency of the blue of embodiment 1. It is found that the efficiency of the green of embodiment 1 is greater than the efficiency of the green of embodiment 2. It is found that the efficiency of the red of embodiment 2 is greater than the efficiency of the red of embodiment 1. For example, it is found that embodiment 1 has more improved the efficiency of the green compared to embodiment 2. For example, in embodiment 2, it is found that efficiencies of the blue and the red are further improved as compared to embodiment 1.

TABLE 3

| | | Item | | | | | | | | |
|---|---|---|---|---|---|---|---|---|---|---|
| | | Embodiment 1 | | | Embodiment 2 | | | Embodiment 8 | | |
| Harmonics | | B (3rd node) | G (2nd node) | R (1st node) | B (2nd node) | G (1st node) | R (2nd node) | B (2nd node) | G (2nd node) | R (1st node) |
| TiN factor | | 0.88 | 0.76 | 1 | 0.88 | 0.76 | 1 | 0.88 | 0.76 | 1 |
| Efficiency (cd/A) | | 4.20 | 89.0 | 33.8 | 4.33 | 86.7 | 37.2 | 4.30 | 89.8 | 33.9 |
| CIE | x | 0.149 | 0.242 | 0.680 | 0.149 | 0.241 | 0.681 | 0.148 | 0.244 | 0.681 |
| | y | 0.038 | 0.713 | 0.317 | 0.038 | 0.714 | 0.316 | 0.038 | 0.712 | 0.315 |

| | | Item | | | | | | | | |
|---|---|---|---|---|---|---|---|---|---|---|
| | | Embodiment 9 | | | Embodiment 10 | | | Embodiment 11 | | |
| Harmonics | | B (1st node) | G (2nd node) | R (1st node) | B (3rd node) | G (1st node) | R (2nd node) | B (1st node) | G (2nd node) | R (2nd node) |
| TiN factor | | 0.88 | 0.76 | 1 | 0.88 | 0.76 | 1 | 0.88 | 0.76 | 1 |
| Efficiency (cd/A) | | 4.13 | 91.1 | 33.9 | 4.27 | 86.0 | 37.2 | 4.10 | 91.0 | 34.1 |
| CIE | x | 0.149 | 0.241 | 0.680 | 0.149 | 0.240 | 0.681 | 0.149 | 0.240 | 0.681 |
| | y | 0.037 | 0.713 | 0.316 | 0.039 | 0.713 | 0.316 | 0.037 | 0.714 | 0.315 |

In Table 3, embodiments 1, 2, and 8 to 11, are configured with a display apparatus including display panel such as FIGS. 5 to 11 and color filter layers, and then no Purcell effect is applied. For example, since it is difficult to manufacture a light emitting element or display panel, the measurement was performed without applying the Purcell effect. Further, TiN is applied as the first electrode.

For example, in Table 3, TiN factor may be calculated by equation of (Panel Efficiency when TiN is applied)/(Panel Efficiency when ITO is applied). For example, in embodiments 1, 2, and 8 to 11, it is found that the TiN factor of the Referring to CIE, it is found that, in embodiment 1, the CIE(x,y) of the blue is (0.149, 0.038), the CIE(x,y) of green light is (0.242, 0.713), and the CIE(x,y) of the red is (0.680, 0.317). It is found that, in embodiment 2, the CIE(x,y) of the blue is (0.149, 0.038), the CIE(x,y) of the green is (0.241, 0.714), and the CIE(x,y) of the red is (0.681, 0.316). For example, it is found that the CIEs of the blue, the green, and the red in embodiments 1 and 2 are similar.

In embodiment 8, the blue light emitting layer may be at the second light emitting node from the second electrode, the green light emitting layer may be at the second light emitting node from the second electrode, and the red light emitting layer may be at the first light emitting node from the second electrode. For example, in embodiment 8, a red light emitting layer, a blue light emitting layer, and a green light emitting layer may be configured from the second electrode. For example, in embodiment 8, the red light emitting layer may be disposed at 55 nm, the blue light emitting layer may be disposed at 155 nm, and the green light emitting layer may be disposed at 195 nm from the second electrode. In embodiment 9, the blue light emitting layer may be at the first light emitting node from the second electrode, the green light emitting layer may be at the second light emitting node from the second electrode, and the red light emitting layer may be at the first light emitting node from the second electrode. For example, in embodiment 9, a blue light emitting layer, a red light emitting layer, and a green light emitting layer may be configured from the second electrode. For example, the blue light emitting layer may be disposed at 35 nm, the red light emitting layer may be disposed at 55 nm, and the green light emitting layer may be disposed at 195 nm from the second electrode.

Referring to the efficiency, it is found that, in the embodiment 8, the efficiency of the blue is 4.30 cd/A, the efficiency of the green is 89.8 cd/A, and the efficiency of the red is 33.9 cd/A. It is found that, in the embodiment 9, the efficiency of the blue is 4.13 cd/A, the efficiency of the green is 91.1 cd/A, and the efficiency of the red is 33.9 cd/A. It is found that the efficiency of the blue of embodiment 8 is greater than the efficiency of the blue of embodiment 9. It is found that the efficiency of the green of embodiment 9 is greater than the efficiency of the green of embodiment 8. It is found that the efficiency of the red of embodiment 8 is the same as the efficiency of the red of embodiment 9. For example, it is found that embodiment 9 has more improved the efficiency of the green compared to embodiment 8. For example, it is found that the efficiency of the blue of embodiment 8 is further improved as compared to embodiment 9.

Referring to CIE, it is found that, in embodiment 8, the CIE(x,y) of the blue is (0.148, 0.038), the CIE(x,y) of the green is (0.244, 0.712), and the CIE(x,y) of the red is (0.681, 0.315). It is found that, in embodiment 9, the CIE(x,y) of the blue is (0.149, 0.037), the CIE(x,y) of the green is (0.241, 0.713), and the CIE(x,y) of the red is (0.680, 0.316). For example, it is found that the CIEs of the blue, the green, and the red in embodiments 8 and 9 are similar.

In embodiment 10, the blue light emitting layer may be at the third light emitting node from the second electrode, the green light emitting layer may be at the first light emitting node from the second electrode, and the red light emitting layer may be at the second light emitting node from the second electrode. For example, in embodiment 10, a green light emitting layer, a red light emitting layer, and a blue light emitting layer may be disposed from the second electrode. For example, the green light emitting layer may be disposed at 50 nm, the red light emitting layer may be disposed at 230 nm, and the blue light emitting layer may be disposed at 275 nm from the second electrode. In embodiment 11, the blue light emitting layer may be at the first light emitting node from the second electrode, the green light emitting layer may be at a second light emitting node from the second electrode, and the red light emitting layer may be at a second light emitting node from the second electrode. For example, in embodiment 11, a blue light emitting layer, a green light emitting layer, and a red light emitting layer may be configured from the second electrode. For example, the blue light emitting layer may be disposed at 35 nm, the green light emitting layer may be disposed at 195 nm, and the red light emitting layer may be disposed at 230 nm from the second electrode.

Referring to the efficiency, it is found that, in the embodiment 10, the efficiency of the blue is 4.27 cd/A, the efficiency of the green is 86.0 cd/A, and the efficiency of the red is 37.2 cd/A. It is found that, in the embodiment 11, the efficiency of the blue is 4.10 cd/A, the efficiency of the green is 91.0 cd/A, and the efficiency of the red is 34.1 cd/A. It is found that the efficiency of the blue of embodiment 10 is greater than the efficiency of the blue of embodiment 11. It is found that the efficiency of the green of embodiment 11 is greater than the efficiency of the green of embodiment 10. It is found that the efficiency of the red of embodiment 10 is greater than the efficiency of the red of embodiment 11. For example, it is found that embodiment 10 has more improved efficiencies of the blue and the red compared to embodiment 11. For example, it is found that the efficiency of the green of embodiment 11 is further improved as compared to embodiment 10.

Referring to CIE, it is found that, in embodiment 10, the CIE(x,y) of the blue is (0.149, 0.039), the CIE(x,y) of the green is (0.240, 0.713), and the CIE(x,y) of the red is (0.681, 0.316). It is found that, in embodiment 11, the CIE(x,y) of the blue is (0.149, 0.037), the CIE(x,y) of the green is (0.240, 0.714), and the CIE(x,y) of the red is (0.681, 0.315). For example, it is found that the CIEs of the blue, the green, and the red in embodiments 10 and 11 are similar.

Referring to Table 3, embodiment 1 and/or embodiment 2 and embodiments 8 to 11 are compared, as follows. For example, it is found that embodiment 1 has improved the efficiency of the green compared to embodiment 2. For example, it is found that embodiment 2 has further improved efficiencies of the blue and the red compared to embodiment 1.

It is found that embodiment 8 has further improved efficiencies of the blue and the green compared to embodiment 1. For example, it is found that embodiment 8 has further improved the efficiency of the green compared to embodiment 2.

The blue light emitting layer of embodiment 8 may be disposed at 155 nm from the second electrode, and the green light emitting layer of embodiment 8 may be disposed at 195 nm from the second electrode. Accordingly, in embodiment 8, since the blue light emitting layer and the green light emitting layer are disposed close to each other, it may be difficult to manufacture a display panel or a light emitting element. Therefore, it is found that, in embodiment 8, when the distance between the first electrode and the second electrode or the thickness of the layers between the first electrode and the second electrode is 385 nm, it is possible to easily manufacture the display panel or the light emitting element.

It is found that embodiment 9 has more improved the efficiency of the green compared to embodiment 1. For example, it is found that embodiment 9 has more improved the efficiency of the green compared to embodiment 2. The blue light emitting layer of embodiment 9 may be disposed at 35 nm from the second electrode, and the red light emitting layer of embodiment 9 may be disposed at 55 nm from the second electrode. Accordingly, in embodiment 9, since the blue light emitting layer and the red light emitting layer are disposed close to each other, it may be difficult to manufacture a display panel or a light emitting element. Therefore, it is found that, in embodiment 9, when the distance between the first electrode and the second electrode or the thickness of the layers between the first electrode and the second electrode is 385 nm, it is possible to easily manufacture the display panel or the light emitting element.

It is found that embodiment 10 has more improved the efficiency of the blue compared to embodiment 1. It is found that embodiment 11 has more improved the efficiency of the green compared to embodiment 1. For example, it is found that embodiment 11 has more improved the efficiency of the green compared to embodiment 2. The red light emitting layer of embodiment 10 may be disposed at 230 nm from the second electrode, and the blue light emitting layer of embodiment 10 may be disposed at 275 nm from the second electrode. Accordingly, in embodiment 10, since the red light emitting layer and the blue light emitting layer are disposed close to each other, it may be difficult to manufacture a display panel or a light emitting element. Therefore, it is found that, in embodiment 10, when the distance between the first electrode and the second electrode or the thickness of the layers between the first electrode and the second electrode is 450 nm, it is possible to easily manufacture the display panel or the light emitting element. The green light emitting layer of embodiment 11 may be disposed at 195 nm from the second electrode, and the red light emitting layer of embodiment 11 may be disposed at 230 nm from the second electrode. Accordingly, in embodiment 11, since the green light emitting layer and the red light emitting layer are disposed close to each other, it may be difficult to manufacture a display panel or a light emitting element. Therefore, it is found that, in embodiment 11, when the distance between the first electrode and the second electrode or the thickness of the layers between the first electrode and the second electrode is 450 nm, it is possible to easily manufacture the display panel or the light emitting element.

Table 4 shows measured value for the efficiencies of comparative experiment, embodiment 1 and embodiment 7.

TABLE 4

| Item | Experiment | Embodiment 1 | Embodiment 7 |
|---|---|---|---|
| R Efficiency (cd/A) | 100% | 200% | 180% |
| G Efficiency (cd/A) | 100% | 160% | 180% |
| B Efficiency (cd/A) | 100% | 100% | 100% |
| W Efficiency (cd/A) | 100% | 133% | 133% |

In Table 4, the experiment is configured to include only two emission portions, in which the first emission portion is configured to have a blue light emitting layer, and the second emission portion is configured to have a red light emitting layer and a green light emitting layer on the red light emitting layer. Embodiment 1 is configured with the display panel of FIG. 5, and embodiment 7 is configured with the display panel of FIG. 11. The first electrode is applied with ITO.

Referring to efficiency, it is found that the efficiencies of embodiments 1 and 7 are further improved compared to the experiment. For example, it is found that the efficiency of the red of experiment is 100%, the efficiency of the red of embodiment 1 is 200%, and the efficiency of the red of embodiment 7 is 180%. For example, it is found that the efficiency of the green of experiment is 100%, the efficiency of the green of embodiment 1 is 160%, and the efficiency of the green of embodiment 7 is 180%. Accordingly, it is found that since the green light emitting layer is further included in the first emission portion, the efficiency of the red is further improved. For example, it is found that the efficiency of the blue of experiment is 100%, the efficiency of the blue of embodiment 1 is 100%, and the efficiency of the blue of embodiment 7 is 100%. For example, it is found that the efficiency of the white of experiment is 100%, the efficiency of the white of embodiment 1 is 133%, and the efficiency of the white of embodiment 7 is 133%. Accordingly, it is found that the case in which the display panel include three emission portions has more improved the efficiency of the white as compared with the experiment in which the display panel include only two emission portions.

Figure 12:
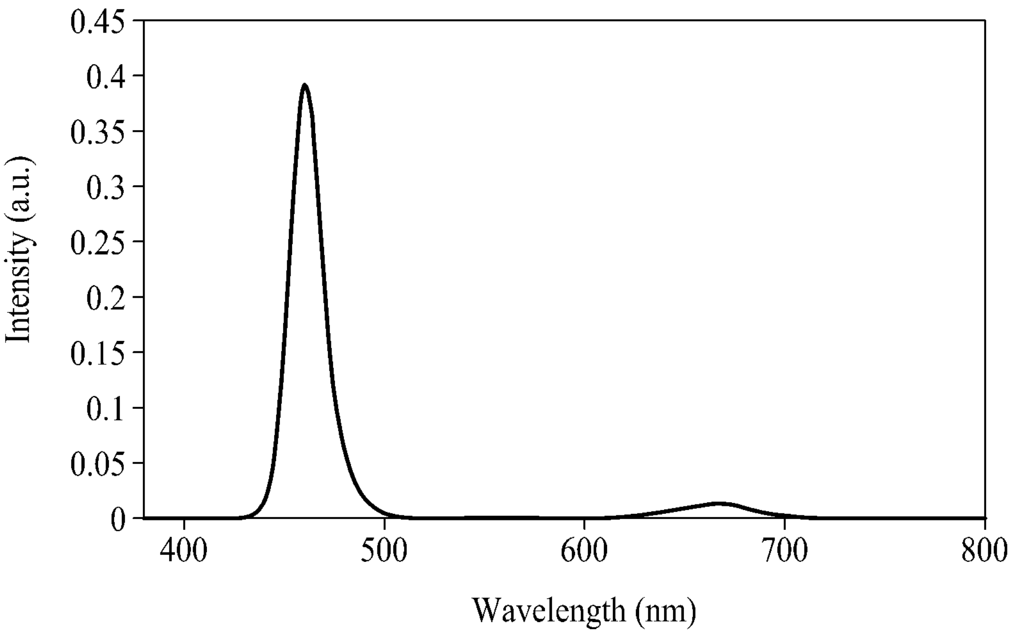
FIG. 12 illustrates a light emission spectrum according to an embodiment of the present disclosure.
Figure 13:
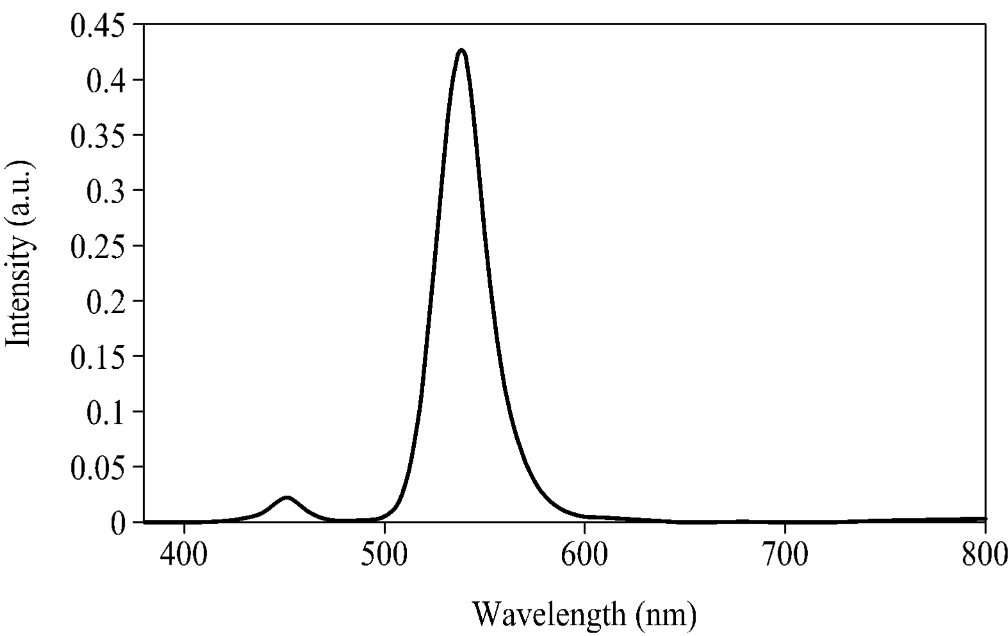
FIG. 13 illustrates a light emission spectrum according to an embodiment of the present disclosure.
Figure 14:
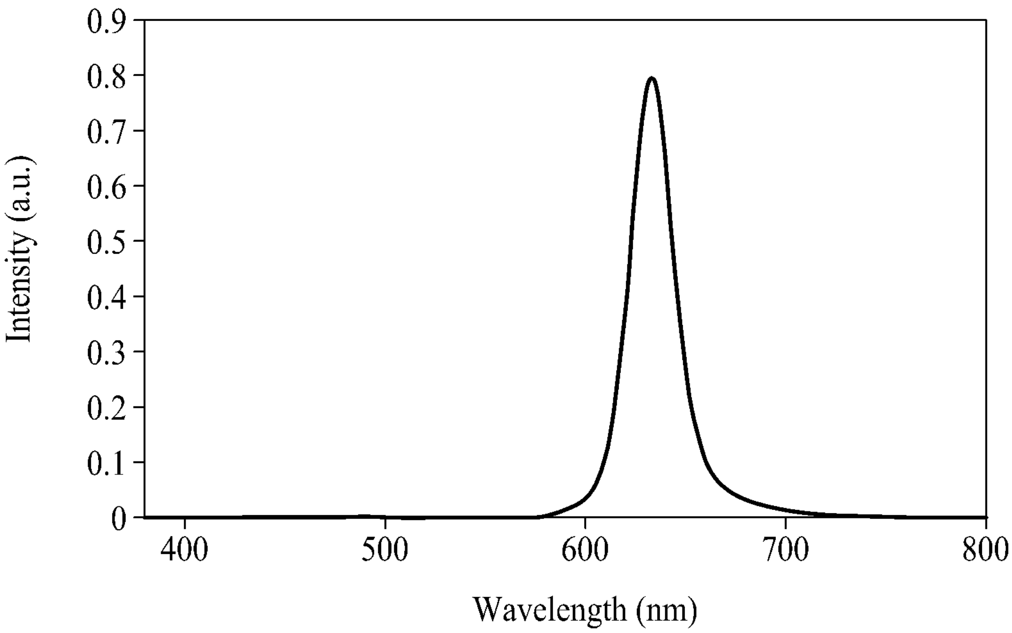
FIG. 14 illustrates a light emission spectrum according to an embodiment of the present disclosure.

FIG. 12 illustrates an electroluminescence spectrum according to an embodiment of the present disclosure. FIG. 13 illustrates an electroluminescence spectrum according to an embodiment of the present disclosure. FIG. 14 illustrates an electroluminescence spectrum according to an embodiment of the present disclosure.

In FIGS. 12 to 14, a horizontal axis represents a wavelength (nm) of light, and a vertical axis represents an intensity of light emitting (or luminescence intensity). The intensity of light emitting is a value normalized to a relative value based on the maximum value of electroluminescence spectrum.

In FIGS. 12 to 14, the electroluminescence spectrum is obtained by applying the display panel of FIG. 6 to the display panel of FIG. 1, and applying a color filter layer, and applying the Purcell effect.

FIG. 12 illustrates the electroluminescence spectrum of the blue light emitting layer. It is found that the blue light emitting layer has an electroluminescence peak in a wavelength range of 420 nm to 480 nm. Referring to FIG. 13, it is found that the green light emitting layer has an electroluminescence peak in a wavelength range of 500 nm to 590 nm. Referring to FIG. 14, it is found that the red light emitting layer has an electroluminescence peak in a wavelength range of 600 nm to 650 nm. For example, it is found that the luminescence intensity of the red light emitting layer is improved compared to the luminescence intensities of the blue light emitting layer and the green light emitting layer. For example, since the electroluminescence peaks of the green light emitting layer and the red light emitting layer do not overlap, a display apparatus having improved luminance and efficiency may be provided.

Table 5 shows voltage, efficiency, quantum efficiency, and color coordinate (CIEx and CIEy) of the display apparatus according to FIGS. 12 to 14. Table 5 shows the current density (J) measure at 10 mA/cm$^2$ (milliampere/square centimeter). The first electrode is applied with ITO.

TABLE 5

| Item | J (mA/cm$^2$) | Voltage (V) | Efficiency (cd/A) | Quantum Efficiency (%) | CIEx | CIEy |
|---|---|---|---|---|---|---|
| Blue | 10.00 | 10.00 | 4.90 | 11.53 | 0.148 | 0.043 |
| Green | 10.00 | 10.03 | 88.31 | 20.44 | 0.259 | 0.674 |
| Red | 10.00 | 10.06 | 49.24 | 38.76 | 0.689 | 0.310 |

In Table 5, it is found that the voltage (V) is 10.00V for the blue light emitting layer, 10.03V for the green light emitting layer, and 10.06V for the red light-emitting layer. It is also found that the efficiency of the blue is 4.90 cd/A, the efficiency of the green is 88.31 cd/A, and the efficiency of the red is 49.24 cd/A. For example, in the case of having only two emission portions, it was measured that the efficiency of the blue was 15 cd/A, the efficiency of the green was 59 cd/A, and the efficiency of the red was 4 cd/A. Therefore, it is found that, in the case of having three emission portions, the efficiency of the green is improved by about 1.5 times, and the efficiency of the red is improved by 12.5 times compared to the case in which the display panel includes only two emission portions. According to embodiments of the present disclosure, since the display panel includes three emission portions, it is found that efficiencies of the green and the red are improved.

The quantum efficiency may be the luminous efficiency when light exits an outside of the light emitting element (or display panel). It is found that the quantum efficiency of the blue is 11.53%, the quantum efficiency of the green is 20.44%, and the quantum efficiency of the red is 38.76%.

Referring to color coordinate (CIE(x,y)), it is found that the blue is (0.148, 0.043), the green is (0.259, 0.674), and the red is (0.689, 0.310). As for standard color coordinate, the blue is (0.142, 0.052), the green is (0.272, 0.591), and the red is (0.641, 0.327). According to embodiments of the present disclosure, it is found that the CIEs of the green and the red of the display apparatus are wider.

According to embodiments of the present disclosure, when the distance between the first electrode and the second electrode or the thickness of the layers between the first electrode and the second electrode is 310 nm, the efficiencies of the embodiments 1 and 2 may be further improved than the efficiencies of embodiments 3 to 6. The case in which a green light emitting layer, a blue light emitting layer, and a red light emitting layer are disposed from the second electrode as in embodiment 2 may have further improved luminance than the case in which a red light emitting layer, a green light emitting layer, and a blue light emitting layer are disposed from the second electrode.

According to embodiments of the present disclosure, when the distance between the first electrode and the second electrode or the thickness of the layers between the first electrode and the second electrode is 310 nm, a red light emitting layer, a green light emitting layer, and a blue light emitting layer may be disposed from the second electrode. According to embodiments of the present disclosure, when the distance between the first electrode and the second electrode or the thickness of the layers between the first electrode and the second electrode is 310 nm, a green light emitting layer, a blue light emitting layer, and a red light emitting layer may be disposed from the second electrode. According to embodiments of the present disclosure, when the distance between the first electrode and the second electrode or the thickness of the layers between the first electrode and the second electrode is 310 nm, the luminance of the display panel including three emission portions may be further improved than the luminance of the display panel including only two emission portions.

According to embodiments of the present disclosure, when the distance between the first electrode and the second electrode or the thickness of the layers between the first electrode and the second electrode is 385 nm, a red light emitting layer, a blue light emitting layer, and a green light emitting layer are disposed from the second electrode. With this configuration, the efficiency of the blue may be further improved than the case in which the distance between the first electrode and the second electrode or the thickness of the layers between the first electrode and the second electrode is 310 nm. When the distance between the first electrode and the second electrode or the thickness of the layers between the first electrode and the second electrode is 385 nm, the luminance of the case in which the display panel including three emission portions may be further improved than the case in which the display panel including only two emission layers (or light emitting layers).

According to an embodiment of the present disclosure, when the distance between the first electrode and the second electrode or the thickness of the layers between the first electrode and the second electrode is 385 nm, a blue light emitting layer, a red light emitting layer and a green light emitting layer may be disposed from the second electrode. With this configuration, the efficiency of the red may be further improved than the case in which the distance between the first electrode and the second electrode or the thickness of the layers between the first electrode and the second electrode is 310 nm. When the distance between the first electrode and the second electrode or the thickness of the layers between the first electrode and the second electrode is set to 385 nm, the luminance for the case of including tree emission portions may be further improved than the luminance for the case of including only two emission portions.

According to an embodiment of the present disclosure, when the distance between the first electrode and the second electrode or the thickness of the layers between the first electrode and the second electrode is 450 nm, a green light emitting layer, a red light emitting layer, and a blue light emitting layer may be disposed from the second electrode. With this configuration, efficiencies of the blue and the red may be further improved than the case in which the distance between the first electrode and the second electrode or the thickness of the layers between the first electrode and the second electrode is 310 nm. When the distance between the first electrode and the second electrode or the thickness of the layers between the first electrode and the second electrode is 450 nm, the luminance of the case in which the display panel including three emission portions may be further improved than the case in which the display panel including only two emission layers (or light emitting layers).

According to an embodiment of the present disclosure, when the distance between the first electrode and the second electrode or the thickness of the layers between the first electrode and the second electrode is 450 nm, a blue light emitting layer, a green light emitting layer, and a red light emitting layer are disposed from the second electrode. With this configuration, the efficiency of the green may be further improved than the case in which the distance between the first electrode and the second electrode or the thickness of the layers between the first electrode and the second electrode is set to 310 nm. When the distance between the first electrode and the second electrode or the thickness of the layers between the first electrode and the second electrode is 450 nm, the luminance of the case in which the display panel including three emission portions may be further improved than the case in which the display panel including only two emission layers (or light emitting layers).

The display device according to embodiments of the present disclosure has a light emitting layer of which position is configured according to the distance between the first electrode and the second electrode or the thickness of the layer between the first electrode and the second electrode. According to embodiment of the present disclosure, a display apparatus including a display panel or a light emitting element may have further improved luminance and efficiency. Further, since the display apparatus according to embodiments of present disclosure includes three emission portions, it may provide a display apparatus including a display panel or a light emitting element having improved luminance and efficiency. In addition, the display apparatus according to embodiments of the present disclosure may be applied to a display system requiring high luminance and high resolution. For example, the display apparatus according to embodiments of the present disclosure may be applied to virtual reality apparatus and/or augmented reality apparatus.

Figure 15:
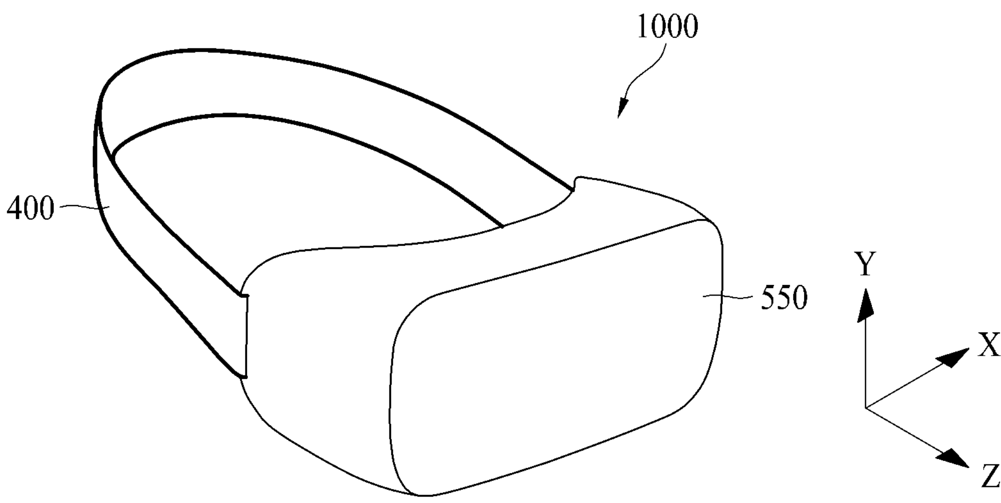
FIG. 15 is a perspective view illustrating a display apparatus according to another embodiment of the present disclosure.
Figure 16:
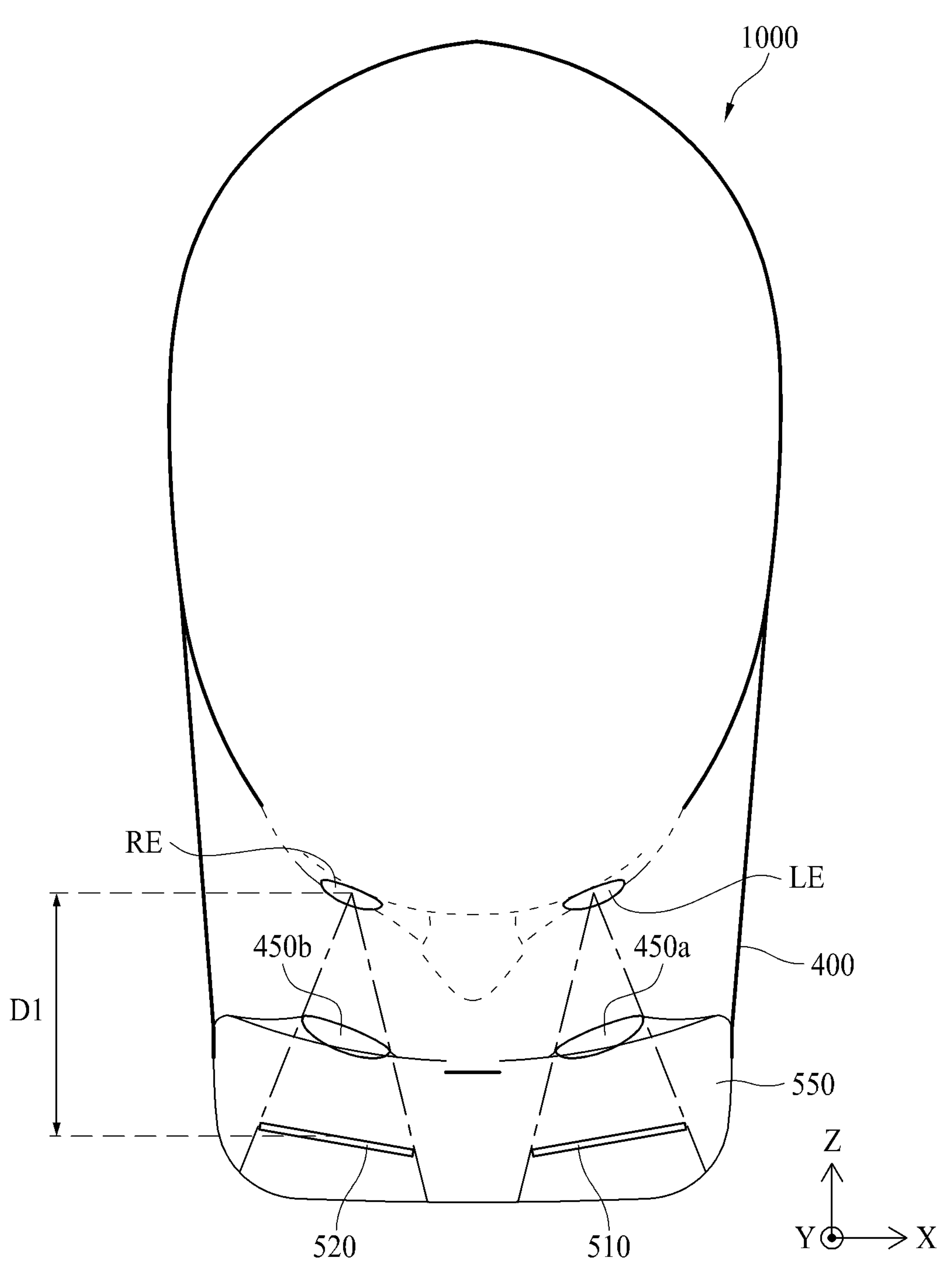
FIG. 16 is a top view illustrating a display apparatus according to another embodiment of the present disclosure.

FIG. 15 is a perspective view illustrating a display apparatus according to another embodiment of the present disclosure. FIG. 16 is a top view illustrating a display apparatus according to another embodiment of the present disclosure.

Referring to FIGS. 15 and 16, display apparatus 100 according to another embodiment of the present disclosure may be configured as a band type display system for viewing virtual reality.

The display panel may include a first display panel 510 and a second display panel 520. An accommodation structure 550 may accommodate the first display panel 510 and the second display panel 520. For example, the first display panel 510 may be corresponding to the left eye LE of user (or viewer), and the second display panel 520 may be corresponding to the right eye RE of user (or viewer). For example, the accommodation structure 550 may accommodate the first display panel 510 as to be corresponding to the left eye LE and the second display panel 520 as to be corresponding to the right eye RE.

Between the first and second display panels 510 and 520 and the user's eyes LE and RE, first and second lens parts 450*a* and 450*b* may be disposed for converging or collecting the images to both eyes of the user. For example, the first lens part 450*a* may be disposed between the first display panel 510 and the left eye LE of user. The first lens part 450*a* may converge or collect an image to the left eye LE of user. For example, the second lens part 450*b* may be disposed between the second display panel 520 and the right eye RE of user. The second lens part 450*b* may converge or collect an image to the right eye RE of user.

In this case, since the display apparatus 1000 moves together with the user's head, the vertical distance D1 between the first and second display panel 510 and 520 and both eyes LE and RE of the user may be the same or substantially the same regardless of the user's movement.

Accordingly, when the viewpoint is fixed when the left eye LE looks at the first display panel 510 and the right eye RE looks at the second display panel 520, the viewpoint is fixed. Thus, the left eye LE and the right eye RE may see the images emitted from the first and second display panels 510 and 520 without any deviation of the viewing angle.

Figure 17:
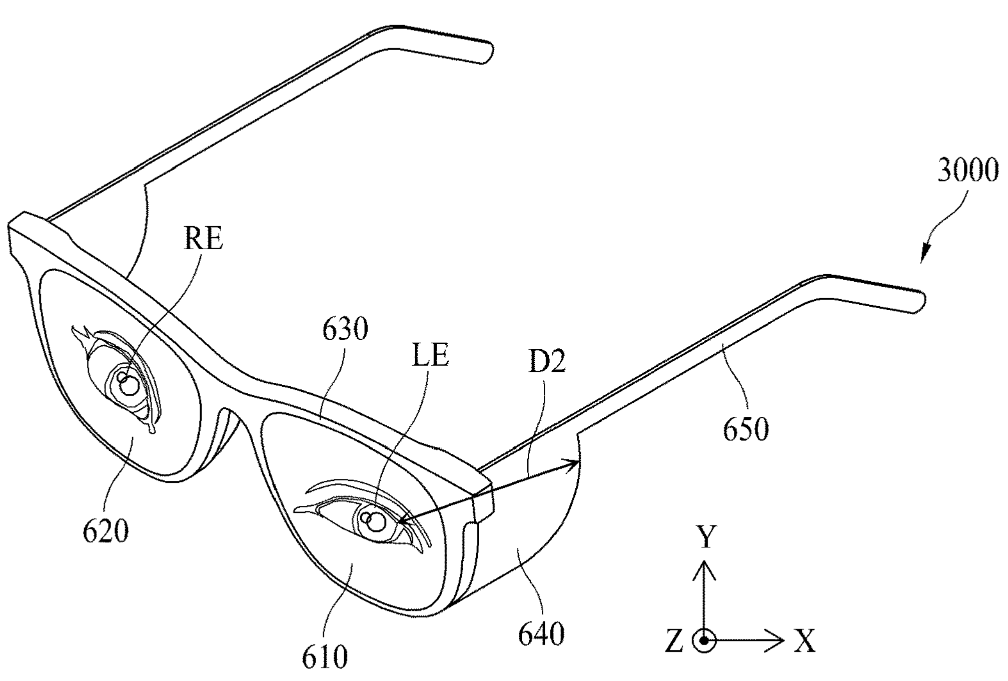
FIG. 17 is a perspective view illustrating a display apparatus according to another embodiment of the present disclosure.
Figure 18:
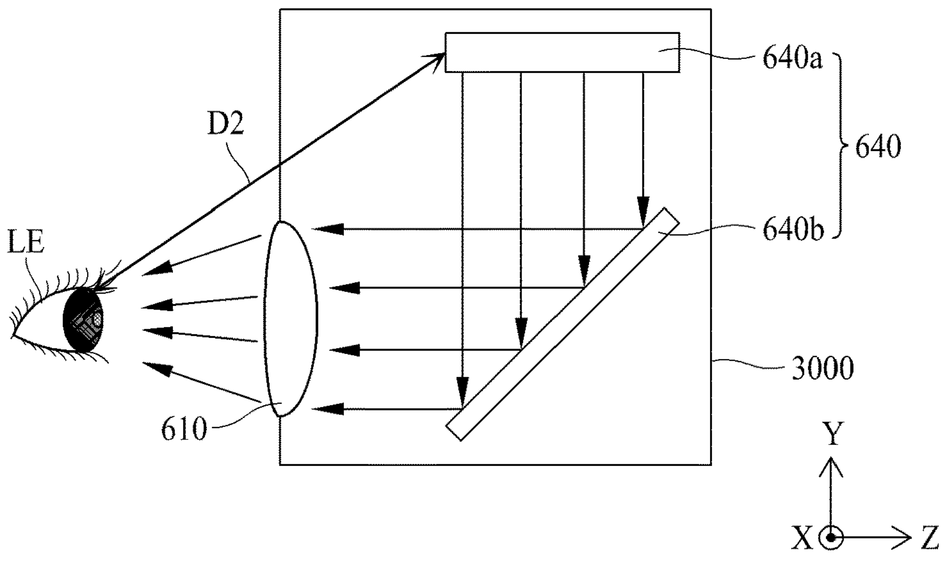
FIG. 18 illustrates a relationship between an eye of viewer and a display apparatus illustrated in FIG. 17.

FIG. 17 is a perspective view illustrating a display apparatus according to another embodiment of the present disclosure. FIG. 18 illustrates a relationship between the eye of viewer and the display apparatus illustrated in FIG. 17.

Referring to FIGS. 17 and 18, the display apparatus 3000 according to another embodiment of the present disclosure may be configured to have a form applicable to an augmented reality apparatus. For example, it has a transparent lens parts 610 and 620 at the front side thereof facing both eyes LE and RE. The transparent lens parts 610 and 620 have in the form of eyeglasses and may be visually recognized the external environment. However, it is not limited thereto. For example, since the transparent lens parts 610 and 620 may be provided at the front side facing both eyes even in the form of a helmet type or a band type, the exterior environment is visually recognized and augmented reality is viewed. For example, the display apparatus 3000 according to another embodiment of the present disclosure may be a head mounted display apparatus.

The display apparatus 3000 according to another embodiment of the present disclosure may include a transparent lens part and an accommodation structure 650. The transparent lens part may include a first transparent lens 610 and a second transparent lens 620 that are separated from at the front side thereof facing both eyes LE and RE. The accommodation structure 650 may surround the first and second transparent lenses 610 and 620 in the form of a frame 630. For example, the accommodation structure 650 may be hung on both ears of the user on both sides of the user's eye LE and RE.

The accommodation structure 650 may include an image transfer part 640. The image transfer part 640 may include a display panel 640*a*. The display panel 640*a* may be disposed at the same oblique distance D2 from the both of user's eyes LE and RE, respectively. The image transfer part 640 may include a mirror reflector 640*b* capable of transferring the image displayed from the display panel 640*a* to the first and second transparent lenses 610 and 620.

Referring to FIGS. 15 to 18, each of the first display panel 510 and the second display panel 520 may be configured as correspond to side portions of the user's left eye LE and the right eye RE in the housing 550. The first mirror reflector and the second mirror reflector may reflect images provided from the first display panel 510 and the second display panel 520. The first lens part 450*a* and the second lens part 450*b* may converge or collect the images emitted from the first mirror reflector and the second mirror reflector to the left eye LE and the right eye RE of the user, respectively.

A display panel according to an embodiment of the present disclosure and a display apparatus including the same may comprise a light emitting layer having improved efficiency and luminance for each light emitting color for each subpixel for a display panel closely to the user's eyes.

A display apparatus according to an embodiment of the present disclosure may be applied to the systems for a mobile device, a video phone, a smart watch, a watch phone, a wearable apparatus, a foldable apparatus, a rollable apparatus, a bendable apparatus, a flexible apparatus, a curved apparatus, a sliding apparatus, a virtual reality apparatus, an augmented reality apparatus, an electronic notebook, an e-book, a PMP (portable multimedia player), a PDA (personal digital assistant), a MP3 player, a mobile medical apparatus, desktop PC (personal computer), a laptop PC, a netbook computer, a workstation, a navigation, a vehicle navigation, a vehicle display apparatus, a vehicle apparatus, a theater apparatus, a theater display apparatus, television, a wallpaper apparatus, a signage apparatus, a game apparatus, a notebook computer, a monitor, a camera, camcorders, and home appliances.

A display apparatus according to an embodiment of the present disclosure may be described as follows.

A display apparatus according to an embodiment of the present disclosure comprises a substrate including a first subpixel, a second subpixel and a third subpixel; a first electrode at each of the first, second and third subpixels; a first emission portion including a first light emitting layer on the first electrode; a second emission portion including a second light emitting layer on the first electrode; a third emission portion including a third light emitting layer on the first electrode; and a second electrode on the third emission portion. The first, second and third light emitting layers emit different color light from each other. A distance between the first electrode and the second electrode is in range from 310 nm to 450 nm.

In some embodiments of the present disclosure, the distance between the first electrode and the second electrode is 310 nm. Any one of the first light emitting layer and the third light emitting layer includes a red light emitting layer.

In some embodiments of the present disclosure, the first light emitting layer includes the red light emitting layer, the second light emitting layer includes a blue light emitting layer, and the third light emitting layer includes a green light emitting layer.

In some embodiments of the present disclosure, the first light emitting layer includes the red light emitting layer and a green light emitting layer on the red light emitting layer, the second light emitting layer includes a blue light emitting layer, and the third emitting layer includes a green light emitting layer.

In some embodiments of the present disclosure, the third light emitting layer includes the red light emitting layer, the second light emitting layer includes a green light emitting layer, and the first light emitting layer includes a blue light emitting layer.

In some embodiments of the present disclosure, the distance between the first electrode and the second electrode is 385 nm. The first light emitting layer includes a green light emitting layer.

In some embodiments of the present disclosure, the second light emitting layer includes a blue light emitting layer, and the third light emitting layer includes a red light emitting layer.

In some embodiments of the present disclosure, the second light emitting layer includes a red light emitting layer, and the third light emitting layer includes a blue light emitting layer.

In some embodiments of the present disclosure, the distance between the first electrode and the second electrode is 450 nm. Any one of the first light emitting layer and the third light emitting layer includes a blue light emitting layer.

In some embodiments of the present disclosure, the third light emitting layer includes the green light emitting layer, the second light emitting layer includes a red light emitting layer, and the first light emitting layer includes a blue light emitting layer.

In some embodiments of the present disclosure, the third light emitting layer includes the blue light emitting layer, the second light emitting layer includes a green light emitting layer, and the first light emitting layer includes a red light emitting layer.

In some embodiments of the present disclosure, the display apparatus further comprises a reflective electrode disposed at each of the first, second and third subpixel.

In some embodiments of the present disclosure, the display apparatus further comprises a first layer disposed on the reflective electrode at the first subpixel and the second subpixel.

In some embodiments of the present disclosure, the display apparatus further comprises a first charge generation layer between the first emission portion and the second emission portion; and a second charge generation layer between the second emission portion and the third emission portion.

In some embodiments of the present disclosure, the first electrode includes at least one of a oxide material and a nitride material, the oxide material having indium (In), zinc (Zn), and tin (Sn), and the nitride material having titanium (Ti), zinc (Zn) and indium (In).

A display apparatus according to an embodiment of the present disclosure comprises: a substrate including a first subpixel, a second subpixel and a third subpixel; a reflective electrode disposed at each of the first, second and third subpixel; a first electrode on the reflective electrode; a first emission portion on the first electrode and including any one of a red light emitting layer, a green light emitting layer and a blue light emitting layer; a second emission portion on the first emission portion and including different light emitting layer from the first emission portion; a third emission portion on the second emission portion and including different light emitting layer from the first and second emission portions; and a second electrode on the third emission portion. The blue light emitting layer in any one of the first, second and third emission portions is closer to the first electrode than the red light emitting layer in any one of the first, second and third emission portions. The distance between the first electrode and the second electrode is in range from 310 nm to 450 nm.

In some embodiments of the present disclosure, the distance between the first electrode and the second electrode is 310 nm. The light emitting layer in the first emission portion includes the blue light emitting layer. The light emitting layer in the third emission portion includes the red light emitting layer. The light emitting layer in the second emission portion includes the green light emitting layer.

In some embodiments of the present disclosure, the distance between the first electrode and the second electrode is 385 nm. The light emitting layer in the second emission portion includes the blue light emitting layer. The light emitting layer in the third emission portion includes the red light emitting layer. The light emitting layer in the first emission portion includes the green light emitting layer.

In some embodiments of the present disclosure, the distance between the first electrode and the second electrode is 450 nm. The light emitting layer in the first emission portion includes the blue light emitting layer. The light emitting layer in the second emission portion includes the red light emitting layer. The light emitting layer in the third emission portion includes the green light emitting layer.

In some embodiments of the present disclosure, the display apparatus further comprises: a first charge generation layer disposed between the first emission portion and the second emission portion; and a second charge generation layer disposed between the second emission portion and the third emission portion.

A display apparatus according to an embodiment of the present disclosure comprises: a substrate including a first subpixel, a second subpixel and a third subpixel; a reflective electrode disposed at each of the first, second and third subpixels; a first electrode on the reflective electrode; a first emission portion on the first electrode and including any one of a red light emitting layer, a green light emitting layer and a blue light emitting layer; a second emission portion on the first emission portion and including different light emitting layer from the first emission portion; a third emission portion on the second emission portion and including different light emitting layer from the first and second emission portions; and a second electrode on the third emission portion. The red light emitting layer in any one of the first, second and third emission portions is closer to the first electrode than the blue light emitting layer in any one of the first, second and third emission portions. A distance between the first electrode and the second electrode is in range from 310 nm to 450 nm.

In some embodiments of the present disclosure, the distance between the first electrode and the second electrode is 310 nm. The light emitting layer in the first emission portion includes the red light emitting layer. The light emitting layer in the second emission portion includes the blue light emitting layer. The light emitting layer in the third emission portion includes the green light emitting layer.

In some embodiments of the present disclosure, the distance between the first electrode and the second electrode is 310 nm. The light emitting layer in the first emission portion includes a red light emitting layer and the green light emitting layer on the red light emitting layer. The light emitting layer in the second emission portion includes the blue light emitting layer. The light emitting layer in the third emission portion includes the green light emitting layer.

In some embodiments of the present disclosure, the distance between the first electrode and the second electrode is 385 nm. The light emitting layer in the first emission portion includes the green light emitting layer. The light emitting layer in the second emission portion includes the red light emitting layer. The light emitting layer in the third emission portion includes the blue light emitting layer.

In some embodiments of the present disclosure, the distance between the first electrode and the second electrode is 450 nm. The light emitting layer in the first emission portion includes the red light emitting layer. The light emitting layer in the second emission portion includes the green light emitting layer. The light emitting layer in the third emission portion includes the blue light emitting layer.

In some embodiments of the present disclosure, the display apparatus further comprises: a first charge generation layer disposed between the first emission portion and the second emission portion; and a second charge generation layer disposed between the second emission portion and the third emission portion.

A display apparatus according to an embodiment of the present disclosure comprises: a substrate including a first subpixel, a second subpixel and a third subpixel; a first electrode disposed at each of the first, second and third subpixels; a first emission portion, a second emission portion and a third emission portion stacked on the first electrode in sequence; and a second electrode on the third emission portions. Each of the first, second and third emission portions includes any one of a red light emitting layer, a green light emitting layer and a blue light emitting layer. The blue light emitting layer is disposed between the red light emitting layer and the green light emitting layer. A distance between the first electrode and the second electrode is in range from 310 nm to 385 nm.

In some embodiments of the present disclosure, the distance between the first electrode and the second electrode is 310 nm. The first emission portion includes the red light emitting layer. The second emission portion includes the blue light emitting layer. The third emission portion includes the green light emitting layer.

In some embodiments of the present disclosure, the distance between the first electrode and the second electrode is 385 nm. The first emission portion includes the green light emitting layer. The second emission portion includes the blue light emitting layer. The third emission portion includes the red light emitting layer.

In some embodiments of the present disclosure, the display apparatus further comprises: a first charge generation layer disposed between the first emission portion and the second emission portion; and a second charge generation layer disposed between the second emission portion and the third emission portion.

A display apparatus according to an embodiment of the present disclosure comprises: a substrate including a first subpixel, a second subpixel and a third subpixel; a reflective electrode disposed at each of the first, second and third subpixel; a first electrode on the reflective electrode; a first emission portion on the first electrode and including any one of a red light emitting layer, a green light emitting layer and a blue light emitting layer; a second emission portion on the first emission portion and including different light emitting layer from the first emission portion; a third emission portion on the second emission portion and including different light emitting layer from the first and second emission portions; and a second electrode on the third emission portion. The blue light emitting layer in any one of the first, second and third emission portions is closer to the first electrode than the red light emitting layer in any one of the first, second and third emission portions. The distance between the first electrode and the second electrode is adjusted in range based on a light emission portion from the second electrode.

In some embodiments of the present disclosure, the distance between the first electrode and the second electrode is 310 nm, the light emitting layer in the first emission portion is the blue light emitting layer, the light emitting layer in the third emission portion is the red light emitting layer, and the light emitting layer in the second emission portion is the green light emitting layer.

In some embodiments of the present disclosure, the distance between the first electrode and the second electrode is 385 nm, the light emitting layer in the second emission portion includes the blue light emitting layer, the light emitting layer in the third emission portion includes the red light emitting layer, and the light emitting layer in the first emission portion includes the green light emitting layer.

In some embodiments of the present disclosure, the distance between the first electrode and the second electrode is 450 nm, the light emitting layer in the first emission portion includes the blue light emitting layer, the light emitting layer in the second emission portion includes the red light emitting layer, and the light emitting layer in the third emission portion includes the green light emitting layer.

In some embodiments of the present disclosure, the display apparatus further comprises: a first charge generation layer disposed between the first emission portion and the second emission portion; and a second charge generation layer disposed between the second emission portion and the third emission portion.

A display apparatus according to an embodiment of the present disclosure comprises: a substrate including a first subpixel, a second subpixel and a third subpixel; a reflective electrode disposed at each of the first, second and third subpixels; a first electrode on the reflective electrode; a first emission portion on the first electrode and including any one of a red light emitting layer, a green light emitting layer and a blue light emitting layer; a second emission portion on the first emission portion and including different light emitting layer from the first emission portion; a third emission portion on the second emission portion and including different light emitting layer from the first and second emission portions; and a second electrode on the third emission portion. The red light emitting layer in any one of the first, second, and third emission portions is closer to the first electrode than the blue light emitting layer in any one of the first, second and third emission portions. A distance between the first electrode and the second electrode is adjusted in range covering four or fewer blue light emission portions of the blue light emitting layer.

In some embodiments of the present disclosure, the distance between the first electrode and the second electrode is 310 nm, the light emitting layer in the first emission portion includes the red light emitting layer, the light emitting layer in the second emission portion includes the blue light emitting layer, and the light emitting layer in the third emission portion includes the green light emitting layer.

In some embodiments of the present disclosure, the distance between the first electrode and the second electrode is 310 nm, the light emitting layer in the first emission portion includes a red light emitting layer and the green light emitting layer on the red light emitting layer, the light emitting layer in the second emission portion includes the blue light emitting layer, and the light emitting layer in the third emission portion includes the green light emitting layer.

In some embodiments of the present disclosure, the distance between the first electrode and the second electrode is 385 nm, the light emitting layer in the first emission portion includes the green light emitting layer, the light emitting layer in the second emission portion includes the red light emitting layer, and the light emitting layer in the third emission portion includes the blue light emitting layer.

In some embodiments of the present disclosure, the distance between the first electrode and the second electrode is 450 nm, the light emitting layer in the first emission portion includes the red light emitting layer, the light emitting layer in the second emission portion includes the green light emitting layer, and the light emitting layer in the third emission portion includes the blue light emitting layer.

In some embodiments of the present disclosure, the display apparatus further comprises: a first charge generation layer disposed between the first emission portion and the second emission portion; and a second charge generation layer disposed between the second emission portion and the third emission portion.

A display apparatus according to an embodiment of the present disclosure comprises: a substrate including a first subpixel, a second subpixel, and a third subpixel; a first electrode disposed at each of the first, second, and third subpixels; a first emission portion, a second emission portion, and a third emission portion stacked on the first electrode in sequence; and a second electrode on the third emission portions. Each of the first, second and third emission portions includes any one of a red light emitting layer, a green light emitting layer, and a blue light emitting layer. The blue light emitting layer is disposed between the red light emitting layer and the green light emitting layer. A distance between the first electrode and the second electrode is adjusted in range covering three or fewer blue light emitting nodes of the blue light emitting layer.

In some embodiments of the present disclosure, the distance between the first electrode and the second electrode is 310 nm, the first emission portion includes the red light emitting layer, the second emission portion includes the blue light emitting layer, and the third emission portion includes the green light emitting layer.

In some embodiments of the present disclosure, the distance between the first electrode and the second electrode is 385 nm, the first emission portion includes the green light emitting layer, the second emission portion includes the blue light emitting layer, and the third emission portion includes the red light emitting layer.

In some embodiments of the present disclosure, the display apparatus further comprises: a first charge generation layer disposed between the first emission portion and the second emission portion; and a second charge generation layer disposed between the second emission portion and the third emission portion.

A display apparatus according to an embodiment of the present disclosure comprises: a substrate including a subpixel; a reflective electrode disposed over the subpixel; a first electrode on the reflective electrode; a second electrode separated vertically from the first electrode by a first distance, and separated vertically from the reflective electrode by a second distance greater than the first distance; a first emission portion on the first electrode; a second emission portion between the first emission portion and the second electrode; and a third emission portion between the second emission portion and the second electrode. Each of the first, second, and third emission portions is configured to emit light of different color from others of the first, second, and third emission portions. The reflective electrode and the second electrode implement a microcavity.

It will be apparent to those skilled in the art that various modifications and variations can be made in the present disclosure without departing from the technical idea or scope of the disclosures. Thus, it is intended that the present disclosure covers the modifications and variations of the disclosure provided they come within the scope of the appended claims and their equivalents.

The invention claimed is:

1. A display apparatus, comprising:
- a substrate including a first subpixel, a second subpixel, and a third subpixel;
- a first electrode at each of the first, second, and third subpixels;
- a first emission portion including a first light emitting layer on the first electrode;
- a second emission portion including a second light emitting layer on the first emission portion;
- a first charge generation layer between the first emission portion and the second emission portion;
- a third emission portion including a third light emitting layer on the second emission portion;
- a second charge generation layer between the second emission portion and the third emission portion; and
- a second electrode on the third emission portion,
- wherein the first emission portion, the second emission portion, and the third emission portion are sequentially stacked in a vertical direction between the first electrode and the second electrode,
- wherein the first, second and third light emitting layers emit different color light from each other, and
- wherein a distance between the first electrode and the second electrode is in a range from 310 nm to 450 nm.

2. The display apparatus of claim 1,
- wherein the distance between the first electrode and the second electrode is 310 nm,
- wherein the first light emitting layer includes a red light emitting layer, the second light emitting layer includes a blue light emitting layer, and the third light emitting layer includes a green light emitting layer.

3. The display apparatus of claim 2, wherein the third light emitting layer includes the red light emitting layer, the second light emitting layer includes a green light emitting layer, and the first light emitting layer includes a blue light emitting layer.

4. The display apparatus of claim 1,
- wherein the distance between the first electrode and the second electrode is 310 nm,
- wherein the first light emitting layer includes a red light emitting layer and a green light emitting layer on the red light emitting layer, the second light emitting layer includes a blue light emitting layer, and the third light emitting layer includes another green light emitting layer.

5. The display apparatus of claim 1, wherein the distance between the first electrode and the second electrode is 385 nm, and wherein the first light emitting layer includes a green light emitting layer.

6. The display apparatus of claim 5, wherein the second light emitting layer includes a blue light emitting layer, and the third light emitting layer includes a red light emitting layer.

7. The display apparatus of claim 5, wherein the second light emitting layer includes a red light emitting layer, and the third light emitting layer includes a blue light emitting layer.

8. The display apparatus of claim 1, wherein the distance between the first electrode and the second electrode is 450 nm, and wherein the first light emitting layer includes a blue light emitting layer, the second light emitting layer includes a red light emitting layer, and the third light emitting layer includes a green light emitting layer.

9. The display apparatus of claim 8, wherein the distance between the first electrode and the second electrode is 450 nm, and wherein the third light emitting layer includes a blue light emitting layer, the second light emitting layer includes a green light emitting layer, and the first light emitting layer includes a red light emitting layer.

10. The display apparatus of claim 1, further comprising:

a reflective electrode disposed at each of the first, second and third subpixels.

11. The display apparatus of claim 10, further comprising:

a first layer disposed on the reflective electrode at the first subpixel and the second subpixel.

12. The display apparatus of claim 1, wherein the first electrode includes at least one of an oxide material and a nitride material, the oxide material having indium, zinc, tin or a combination thereof, and the nitride material having titanium, zinc, indium or a combination thereof.

13. A display apparatus, comprising:

a substrate including a first subpixel, a second subpixel, and a third subpixel;

a reflective electrode disposed at each of the first, second, and third subpixels;

a first electrode on the reflective electrode;

a first emission portion on the first electrode and including a selected one among a red light emitting layer, a green light emitting layer, and a blue light emitting layer;

a second emission portion on the first emission portion and including a selected one among the red light emitting layer, the green light emitting layer, and the blue light emitting layer, the second emission portion being different from the first emission portion;

a third emission portion on the second emission portion and including a selected one among the red light emitting layer, the green light emitting layer, and the blue light emitting layer, the third emission portion being different from the first and second emission portions; and a second electrode on the third emission portion, wherein the red light emitting layer is closer to the first electrode than the blue light emitting layer, and wherein a distance between the first electrode and the second electrode is adjusted in a range including four or fewer blue light emission portions of the blue light emitting layer.

14. The display apparatus of claim 13, wherein the distance between the first electrode and the second electrode is 310 nm, wherein the light emitting layer in the first emission portion includes the red light emitting layer, wherein the light emitting layer in the second emission portion includes the blue light emitting layer, and wherein the light emitting layer in the third emission portion includes the green light emitting layer.

15. The display apparatus of claim 13, wherein the distance between the first electrode and the second electrode is 310 nm, wherein the light emitting layer in the first emission portion includes a red light emitting layer and the green light emitting layer on the red light emitting layer, wherein the light emitting layer in the second emission portion includes the blue light emitting layer, and wherein the light emitting layer in the third emission portion includes the green light emitting layer.

16. The display apparatus of claim 13, wherein the distance between the first electrode and the second electrode is 385 nm, wherein the light emitting layer in the first emission portion includes the green light emitting layer, wherein the light emitting layer in the second emission portion includes the red light emitting layer, and wherein the light emitting layer in the third emission portion includes the blue light emitting layer.

17. The display apparatus of claim 13, wherein the distance between the first electrode and the second electrode is 450 nm, wherein the light emitting layer in the first emission portion includes the red light emitting layer, wherein the light emitting layer in the second emission portion includes the green light emitting layer, and wherein the light emitting layer in the third emission portion includes the blue light emitting layer.

18. The display apparatus of claim 13, further comprising:

a first charge generation layer disposed between the first emission portion and the second emission portion; and a second charge generation layer disposed between the second emission portion and the third emission portion.

19. A display apparatus, comprising:

a substrate including a first subpixel, a second subpixel, and a third subpixel;

a first electrode disposed at each of the first, second, and third subpixels;

a first emission portion, a second emission portion, and a third emission portion stacked on the first electrode in sequence; and a second electrode on the third emission portions, wherein each of the first, second and third emission portions includes a selected one among a red light emitting layer, a green light emitting layer, and a blue light emitting layer, the first emission portion being different from the second emission portion, the second emission portion being different from the third emission portion, and the third emission portion being different from the first emission portion, wherein the blue light emitting layer is disposed between the red light emitting layer and the green light emitting layer, and wherein a distance between the first electrode and the second electrode is adjusted in a range including three or fewer blue light emitting nodes of the blue light emitting layer.

20. The display apparatus of claim 19, wherein the distance between the first electrode and the second electrode is 310 nm, wherein the first emission portion includes the red light emitting layer, wherein the second emission portion includes the blue light emitting layer, and wherein the third emission portion includes the green light emitting layer.

21. The display apparatus of claim 19, wherein the distance between the first electrode and the second electrode is 385 nm, wherein the first emission portion includes the green light emitting layer, wherein the second emission portion includes the blue light emitting layer, and wherein the third emission portion includes the red light emitting layer.

22. The display apparatus of claim 19, further comprising:

a first charge generation layer disposed between the first emission portion and the second emission portion; and a second charge generation layer disposed between the second emission portion and the third emission portion.

23. A display apparatus, comprising:

a substrate including a subpixel;

a reflective electrode disposed over the subpixel;

a first electrode on the reflective electrode;

a second electrode separated vertically from the first electrode by a first distance, and separated vertically from the reflective electrode by a second distance greater than the first distance;

a first emission portion on the first electrode;

a second emission portion between the first emission portion and the second electrode;

a first charge generation layer disposed between the first emission portion and the second emission portion;

a third emission portion between the second emission portion and the second electrode; and a second charge generation layer disposed between the second emission portion and the third emission portion, wherein each of the first, second, and third emission portions is configured to emit light of different color from others of the first, second, and third emission portions;

wherein the reflective electrode and the second electrode implement a microcavity.

* * * * *